US007883827B2

(12) United States Patent
Sugasaki et al.

(10) Patent No.: US 7,883,827 B2
(45) Date of Patent: *Feb. 8, 2011

(54) POLYMERIZABLE COMPOSITION AND PLANOGRAPHIC PRINTING PLATE PRECURSOR

(75) Inventors: Atsushi Sugasaki, Shizuoka-ken (JP); Kazuto Kunita, Shizuoka-ken (JP); Kazuhiro Fujimaki, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 6 days.

This patent is subject to a terminal disclaimer.

(21) Appl. No.: 11/783,968

(22) Filed: Apr. 13, 2007

(65) Prior Publication Data

US 2007/0202439 A1 Aug. 30, 2007

Related U.S. Application Data

(63) Continuation of application No. 10/673,332, filed on Sep. 30, 2003.

(30) Foreign Application Priority Data

| | | |
|---|---|---|
| Sep. 30, 2002 | (JP) | 2002-287920 |
| Feb. 17, 2003 | (JP) | 2003-38288 |
| Apr. 3, 2003 | (JP) | 2003-100575 |

(51) Int. Cl.

| | |
|---|---|
| ***G03F 7/033*** | (2006.01) |
| ***G03F 7/037*** | (2006.01) |
| ***G03F 7/028*** | (2006.01) |
| ***G03F 7/09*** | (2006.01) |
| ***G03C 1/77*** | (2006.01) |

(52) U.S. Cl. .............. 430/270.1; 430/271.1; 430/278.1; 430/281.1; 430/285.1; 430/302; 430/905; 430/906; 430/910; 430/944

(58) Field of Classification Search ....................... None
See application file for complete search history.

(56) References Cited

U.S. PATENT DOCUMENTS

| | | | |
|---|---|---|---|
| 3,725,356 | A | 4/1973 | Luders et al. |
| 3,804,631 | A | 4/1974 | Faust |
| 3,839,171 | A | 10/1974 | Akamatsu et al. |
| 3,930,865 | A | 1/1976 | Faust et al. |
| 4,019,972 | A | 4/1977 | Faust |
| 4,239,849 | A | 12/1980 | Lipson et al. |
| 4,476,215 | A | 10/1984 | Kausch |
| 4,499,163 | A | 2/1985 | Ishimaru et al. |
| 4,510,227 | A | 4/1985 | Mohr et al. |
| 4,537,855 | A | 8/1985 | Ide |
| 4,687,727 | A | 8/1987 | Toyama et al. |
| 4,772,538 | A | 9/1988 | Walls et al. |
| 4,950,581 | A | 8/1990 | Koike et al. |
| 4,952,478 | A | 8/1990 | Miyagawa et al. |
| 5,080,999 | A | 1/1992 | Imai et al. |
| 5,200,292 | A | 4/1993 | Shinozaki et al. |
| 5,246,816 | A | 9/1993 | Yamashita et al. |
| 5,340,699 | A | 8/1994 | Haley et al. |
| 5,641,608 | A | 6/1997 | Grunwald et al. |
| 5,705,322 | A | 1/1998 | West et al. |
| 5,914,211 | A | 6/1999 | Hashino et al. |
| 5,919,601 | A | 7/1999 | Nguyen et al. |
| 5,952,154 | A | 9/1999 | Barr et al. |
| 5,965,319 | A | 10/1999 | Kobayashi |
| 5,997,993 | A | 12/1999 | Bi et al. |
| 6,001,298 | A | 12/1999 | McAloon |
| 6,013,412 | A | 1/2000 | Aoshima |
| 6,030,750 | A | 2/2000 | Vermeersch et al. |
| 6,309,792 | B1 | 10/2001 | Hauck et al. |
| 6,399,689 | B1 | 6/2002 | Scarlette |
| 6,423,462 | B1 | 7/2002 | Kunita |
| 6,482,571 | B1 | 11/2002 | Teng |
| 6,566,035 | B1 | 5/2003 | Aoshima |
| 6,569,603 | B2 | 5/2003 | Fukukawa |

(Continued)

FOREIGN PATENT DOCUMENTS

| | | |
|---|---|---|
| CA | 1338095 | 2/1996 |

(Continued)

OTHER PUBLICATIONS

English abstract for JP 58-134629 provided by JPO.*

(Continued)

*Primary Examiner*—Sin J. Lee
(74) *Attorney, Agent, or Firm*—Sughrue Mion, PLLC

(57) ABSTRACT

The present invention provides a planographic printing plate precursor including on a support a photosensitive layer that contains a polymerizable composition containing a specific binder polymer having a repeating unit of formula (I), an infrared absorbent, a polymerization initiator and a polymerizable compound, Formula (I)

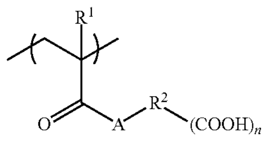

wherein $R^1$ represents a hydrogen atom or a methyl group; $R^2$ represents a linking group which includes two or more atoms selected from a carbon atom, a hydrogen atom, an oxygen atom, a nitrogen atom and a sulfur atom and has a number of atoms of 2 to 82; A represents an oxygen atom or —$NR^3$— in which $R^3$ represents a hydrogen atom or a monovalent hydrocarbon group having 1 to 10 carbon atoms; and n represents an integer of 1 to 5. The invention also provides a planographic printing plate precursor provided with a specific photosensitive layer with respect to an alkaline developer.

1 Claim, 1 Drawing Sheet

U.S. PATENT DOCUMENTS

| | | | | |
|---|---|---|---|---|
| 6,576,401 | B2 | 6/2003 | Teng | |
| 6,733,948 | B2 | 5/2004 | Nakamura | |
| 6,794,116 | B2 | 9/2004 | Oshima | |
| 6,838,222 | B2 | 1/2005 | Aoshima et al. | |
| 6,858,373 | B2 * | 2/2005 | Kunita | 430/281.1 |
| 6,861,200 | B2 | 3/2005 | Oshima et al. | |
| 6,897,006 | B2 | 5/2005 | Fujimoto et al. | |
| 6,902,864 | B2 * | 6/2005 | Kunita et al. | 430/287.1 |
| 7,291,443 | B2 | 11/2007 | Shimada | |
| 2001/0036598 | A1 | 11/2001 | Shimada et al. | |
| 2002/0048725 | A1 * | 4/2002 | Oshima | 430/283.1 |
| 2002/0051934 | A1 | 5/2002 | Nakamura et al. | |
| 2002/0055058 | A1 | 5/2002 | Sorori et al. | |
| 2002/0064728 | A1 | 5/2002 | Weed et al. | |
| 2002/0136987 | A1 | 9/2002 | Oshima | |
| 2002/0160295 | A1 | 10/2002 | Aoshima et al. | |
| 2002/0177074 | A1 | 11/2002 | Hoshi | |
| 2002/0182539 | A1 | 12/2002 | Fujimaki et al. | |
| 2002/0197564 | A1 | 12/2002 | Timpe et al. | |
| 2003/0008239 | A1 | 1/2003 | Fujimaki et al. | |
| 2003/0068575 | A1 | 4/2003 | Yanaka | |
| 2003/0073032 | A1 | 4/2003 | Aoshima | |
| 2003/0082475 | A1 | 5/2003 | Teng | |
| 2003/0082478 | A1 | 5/2003 | Itakura et al. | |
| 2003/0146965 | A1 | 8/2003 | Fujimaki et al. | |
| 2003/0162127 | A1 | 8/2003 | Kikuchi | |
| 2003/0186174 | A1 | 10/2003 | Nagase | |
| 2003/0198890 | A1 | 10/2003 | Abe et al. | |
| 2004/0063034 | A1 | 4/2004 | Goto | |
| 2004/0068026 | A1 | 4/2004 | Kunita et al. | |
| 2004/0072101 | A1 | 4/2004 | Sugasaki et al. | |
| 2004/0131971 | A1 | 7/2004 | Sugasaki | |
| 2004/0137369 | A1 | 7/2004 | Shimada | |
| 2004/0170920 | A1 | 9/2004 | Goto | |
| 2004/0170922 | A1 | 9/2004 | Goto | |
| 2004/0175648 | A1 | 9/2004 | Goto | |
| 2004/0202957 | A1 | 10/2004 | Murota | |
| 2004/0223042 | A1 | 11/2004 | Goto | |
| 2004/0234893 | A9 * | 11/2004 | Fujimaki | 430/283.1 |
| 2004/0244619 | A1 | 12/2004 | Goto | |
| 2005/0026082 | A1 | 2/2005 | Shimada | |
| 2005/0037282 | A1 | 2/2005 | Sonokawa | |
| 2005/0069810 | A1 | 3/2005 | Goto | |
| 2006/0060097 | A1 | 3/2006 | Sunagawa | |
| 2008/0044763 | A1 * | 2/2008 | Fujimaki | 430/273.1 |

FOREIGN PATENT DOCUMENTS

| | | | |
|---|---|---|---|
| EP | 0 377 321 | A2 | 7/1990 |
| EP | 0 684 522 | A1 | 11/1995 |
| EP | 0 745 900 | A1 | 12/1996 |
| EP | 0 779 161 | A1 | 6/1997 |
| EP | 0 919 870 | A1 | 6/1999 |
| EP | 0 950 517 | A1 | 10/1999 |
| EP | 0 950 518 | A1 | 10/1999 |
| EP | 1 033 624 | A1 | 9/2000 |
| EP | 1 096 315 | A1 | 5/2001 |
| EP | 1 110 747 | A1 | 6/2001 |
| EP | 1 216 830 | A2 | 11/2001 |
| EP | 1 160 095 | A2 | 12/2001 |
| EP | 1 176 007 A 2 | | 1/2002 |
| EP | 1 176 467 | A1 | 1/2002 |
| EP | 1 182 033 | A1 | 2/2002 |
| EP | 1 186 407 | A1 | 3/2002 |
| EP | 1 249 731 | A2 | 3/2002 |
| EP | 1 219 464 | A2 | 7/2002 |
| EP | 1 223 196 | A2 * | 7/2002 |
| EP | 1 235 107 | A1 | 8/2002 |
| EP | 1 241 002 | A2 | 9/2002 |
| EP | 1 245 405 | A2 | 10/2002 |
| EP | 1 249 343 | A2 | 10/2002 |
| EP | 1 285 749 A 2 | | 2/2003 |
| EP | 1 332 870 | A2 | 8/2003 |
| EP | 1 338 921 | A2 | 8/2003 |
| EP | 1 341 040 | A1 | 9/2003 |
| EP | 1 369 231 | A2 | 12/2003 |
| EP | 1 400 851 | A2 | 3/2004 |
| EP | 1 449 650 | A2 | 8/2004 |
| EP | 1 450 207 | A1 | 8/2004 |
| GB | 1 521 372 | | 8/1978 |
| JP | 54-92723 | A | 7/1979 |
| JP | 54-25957 | B2 | 8/1979 |
| JP | 54-34327 | B2 | 10/1979 |
| JP | 58-29803 | A | 2/1983 |
| JP | 58-12577 | B2 | 3/1983 |
| JP | 58-134629 | * | 8/1983 |
| JP | 58-134629 | A | 8/1983 |
| JP | 59-53836 | A | 3/1984 |
| JP | 59-71048 | A | 4/1984 |
| JP | 59-44615 | B2 | 10/1984 |
| JP | 2-161442 | A | 6/1990 |
| JP | 4-31863 | A | 2/1992 |
| JP | 4 106548 | A | 4/1992 |
| JP | 7 20629 | | 11/1994 |
| JP | 7-271029 | | 9/1995 |
| JP | 0806283 | A | 3/1996 |
| JP | 8-108621 | A | 4/1996 |
| JP | 9-043847 | A | 2/1997 |
| JP | 9-274321 | | 10/1997 |
| JP | 27-12564 | | 10/1997 |
| JP | 10-195119 | | 7/1998 |
| JP | 11-258801 | A | 9/1999 |
| JP | 2002-40652 | A | 2/2000 |
| JP | 2000 131837 | A | 5/2000 |
| JP | 2000-267265 | A | 9/2000 |
| JP | 2001-133969 | A | 5/2001 |
| JP | 2002-072462 | A | 3/2002 |
| JP | 2002-139843 | A | 5/2002 |
| JP | 2003-270781 | A | 9/2003 |
| JP | 2005-062795 | A | 3/2005 |
| JP | 2005-091617 | A | 4/2005 |
| JP | 2005-091618 | A | 4/2005 |
| JP | 4048110 | B2 | 2/2008 |
| WO | 95/01257 | | 1/1995 |
| WO | WO 00/48836 | A1 | 8/2000 |

OTHER PUBLICATIONS

European Search Report dated Dec. 22, 2004.

Office Action dated Jan. 31, 2005 from U.S. Appl. No. 10/673,332.

Office Action dated Jan. 25, 2005 from U.S. Appl. No. 10/673,332.

European Search Report dated Jan. 16, 2004.

Japanese Office Action for Application No. 2003-339817 dated Jul. 22, 2009.

McGinniss, Vincent D., "Radiation Curing: 6. Curing with Ultraviolet, Visible and Infrared Processing Equipment" from Kirk-Othmer Encyclopedia of Chemical Technology, copyright 1996, by John Wiley & Sons, Inc., Article Online posting date Dec. 4, 2000.

SR-295, product bulletin, Sartomer Company, Exton, PA, one page, dated Nov. 1998 from internet through Sartomer web site.

SR—399, Product bulletin, Sartomer Company, Exton, PA., one page, dated Nov. 1998, from internet through Sartomer web site.

SR-492, product bulletin, Sartomer Company, Exton, PA on page, dated Nov. 1998 from internet through Sartomer web site.

CD 501, product bulletin, Sartomer Company, Exton, PA, one page, dated May 1999 from internet through Sartomer web site.

SR-368, product bulletin, Sartomer Company, Exton, PA 1 pate, dated Nov. 1998, from internet through Sartomer web site.

Product Data, Scripset 550 Styreen Maleic Anhydride Copolymer Solid, Hercules Incorporated, copyright 1999, dated Jun. 2000 from internet.

European Search Report dated Jul. 2, 2002.

European Search Report dated Apr. 16, 2004.

European Search Report dated Jun. 14, 2005.

Jerry March: "Advanced organic chemistry: reactions, mechanisms, and structure" 1992, Wiley-Interscient, 4th Ed., USA, XP 002275533 p. 280, Table 9.4.
Ben-zyl from The American Heritage dictionary of the English Language, Fourth Edition, copyright 2000 by Houghton Mifflin Company found at yourdictionary.com, one page.
Registry No. 2154-56-5, one page "benzyl".
Mineo et al, 08062834, English Abstract of Japanese Published Application 08062834 dated Mar. 8, 1996, p. Patent Abstracts of Japan dated 1996.
Patent Abstracts of Japan for pub. No. 0806283, Published Mar. 8, 1994.
Office Action dated Apr. 18, 2005 from U.S. Appl. No. 10/781,922.
Office Action dated Mar. 9, 2005 from U.S. Appl. No. 10/671,776.
Office Action dated Feb. 23, 2005 from U.S. Appl. No. 10/669,696.
Office Action dated Apr. 18, 2005 from U.S. Appl. No. 10/781,645.
Office Action dated Apr. 18, 2005 from U.S. Appl. No. 10/782,852.

* cited by examiner

POLYMERIZABLE COMPOSITION AND PLANOGRAPHIC PRINTING PLATE PRECURSOR

CROSS-REFERENCE TO RELATED APPLICATION

This is a continuation of application Ser. No. 10/673,332 filed Sep. 30, 2003, which claims priority under 35 USC 119 from Japanese Patent Application Nos. 2002-287920, 2003-38288 and 2003-100575, the disclosure of which is incorporated by reference herein.

BACKGROUND OF THE INVENTION

1. Field of the Invention

The present invention relates to a negative-type polymerizable composition and a planographic printing plate precursor. More specifically, the invention relates to a negative-type polymerizable composition and a planographic printing plate precursor that are highly sensitive to and writable by an infrared laser.

2. Description of the Related Art

Conventional panographic printing plate precursors in widespread use are PS plates having a structure in which a lipophilic photosensitive resin layer is provided on a hydrophilic support. In the production process thereof, a desired printing plate is usually obtained by performing mask exposure (surface exposure) via a lith film followed by dissolution and removal of non-image areas. In recent years, digitalization technology, in which image information is electronically processed, stored, and output using a computer, has become widespread. Thus, a variety of new image outputting methods that can accommodate such digitalization technology has been put to practical use. Consequently, there is strong demand for a computer to plate (CTP) technique in which scanning is conducted according to digitalized image information using light having high directivity, such as a laser beam, to thereby directly produce a printing plate without using the lith film. Therefore, obtaining a planographic printing plate precursor that can comply with such techniques has become an important technical issue.

As a type that is subjected to scanning exposure, the planographic printing plate precursor comprising a hydrophilic support having disposed thereon a lipophilic photosensitive resin layer (hereinafter referred to as "photosensitive layer") that contains a photosensitive compound capable of generating active species such as a radical or a Broensted acid upon laser exposure has been proposed, and has already been put on the market. This planographic printing plate precursor is scanned by a laser beam according to digital information such that active species can be generated. The action of the generated species causes a physical or chemical change in the photosensitive layer, which leads to insolubility of the layer. The layer is then subjected to development processing to thereby obtain a negative-type planographic printing plate. Particularly, from a planographic printing plate precursor comprising a hydrophilic support having disposed thereon a photopolymerizable photosensitive layer containing a photopolymerization initiator which exhibits excellent sensitizing speed, an ethylenically unsaturated compound which is addition-polymerizable and a binder polymer which is soluble in an alkaline developer, and optionally a protective layer which has an oxygen blocking property, from the standpoints of high productivity, simple development processing, and excellent resolution and inking, a preferable printing plate having excellent printing performance can be obtained.

Conventional binder polymers used to constitute the photosensitive layer are an organic macromolecular polymer capable of being developed by alkali, e.g., methacrylic acid copolymers, acrylic acid copolymers, itaconic acid copolymers, crotonic acid copolymers, maleic acid copolymers and partially esterified maleic acid copolymers (refer to Japanese Patent Application Publication (JP-B) No. 59-44615, Japanese Patent Application Publication (JP-B) Nos. 54-34327, 58-12577 and 54-25957, JP-A Nos. 54-92723, 59-53836, 59-71048 and 2002-40652).

However, in conventional planographic printing plate precursors provided with a photosensitive layer containing such a binder polymer, the developer permeates into a part of image areas where curing is insufficient, and consequently, damages are incurred in the photosensitive layer leading to lowered printing durability. In order to cope with this problem, an attempt to suppress permeation of the developer into the image area was made. However, this attempt sacrificed developing properties in non-image areas. Therefore, it was very difficult to achieve both suppression of permeation of the developer into image areas and superior developing properties in non-image areas.

SUMMARY OF THE INVENTION

In view of the foregoing, objects of the present invention are to solve the aforementioned prior art problems and to provide a planographic printing plate precursor that is excellent in printing durability and image formation, as well as to provide a polymerizable composition that is suitably used for a photosensitive layer of the planographic printing plate precursor. In particular, an object of the present invention is to provide a planographic printing plate precursor that is suited for use with a laser beam, as well as a polymerizable composition that is suitably used for the photosensitive layer of the planographic printing plate precursor.

The inventors of the present invention conducted extensive research to achieve the aforementioned objects, and found that when at least one of a photosensitive layer containing a polymerizable composition including a specific binder polymer and a photosensitive layer having a developing velocity and the permeating velocity, with respect to an alkaline developer, that are within a specified range is used, the abovementioned objects are achieved. The present invention was accomplished based on these findings.

A first aspect of the invention is a polymerizable composition which comprises a binder polymer having a repeating unit represented by the following formula (I), an infrared absorbent, a polymerization initiator and a polymerizable compound, Formula (I)

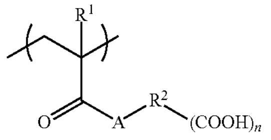

wherein $R^1$ represents a hydrogen atom or a methyl group; $R^2$ represents a linking group which includes one or more atoms selected from the group consisting of a carbon atom, a hydrogen atom, an oxygen atom, a nitrogen atom, a sulfur atom, and a halogen atom, and has a number of atoms of 2 to 82; A represents an oxygen atom or —$NR^{3-}$ in which $R^3$ represents a hydrogen atom or a monovalent hydrocarbon group having 1 to 10 carbon atoms; and n represents an integer of 1 to 5.

Further, in the above formula (I), it is more preferable that the linking group represented by $R^2$ has an alkylene structure, or a structure to which an alkylene moiety is linked via an ester bond.

A second aspect of the invention is a planographic printing plate precursor which comprises a support having disposed thereon a photosensitive layer that contains a polymerizable composition including a binder polymer having a repeating unit represented by the above formula (I), an infrared absorbent, a polymerization initiator and a polymerizable compound.

A third aspect of the invention is a planographic printing plate precursor which comprises a support having disposed thereon a photosensitive layer that contains a binder polymer, an infrared absorbent, a polymerization initiator and a polymerizable compound, wherein the photosensitive layer has a developing velocity at unexposed areas with respect to an alkaline developer having a pH of 10 to 13.5, of 80 nm/sec or greater, and a permeating velocity of the alkaline developer at exposed areas, of 100 nF/sec or less.

As used herein, the developing velocity at unexposed areas with respect to an alkaline developer having a pH of 10 to 13.5 refers to a value obtained by dividing a film thickness (m) of the photosensitive layer by a time period required for development (sec), while the permeating velocity of the alkaline developer at exposed areas is a value indicating a rate of change in an electrostatic capacity (F) in the case where the photosensitive layer is formed on an electrically conductive support, and is immersed in the developer.

Although the action of the present invention is unclear, the following is inferred.

The binder polymer having the repeating unit represented by formula (I), for use in the polymerizable composition according to the first aspect of the invention as well as in the planographic printing plate precursor according to the second aspect of the invention, is excellent in diffusing property in the developer and alkali responsiveness (solubility in an aqueous alkaline solution), and is also good in solubility in the developer even if the polymer has a small acid content (i.e., when the acid value is insufficient). Due to such characteristics, it is believed that polymerizable compositions and a photosensitive layer of the planographic printing plate precursor containing such a binder polymer are capable of maintaining superior developing properties while suppressing damages resulting from permeation of the developer caused by the acid content.

Further, since the photosensitive layer in the planographic printing plate precursor according to the third aspect of the invention has the developing velocity with respect to the alkaline developer at unexposed areas and the permeating velocity of the alkaline developer at exposed areas within the above specified range, the layer has a characteristic in that its surface at exposed areas is sufficiently cured to form image areas having high strength, whereby permeation of the alkaline developer is suppressed and further the photosensitive layer at unexposed areas exhibit high dissolving velocity in the alkaline developer. As a result, it is presumed that the obtained planographic printing plate precursor can exhibit both suppression of permeation of the developer in the image area and increased developing velocity at non-image areas. In order to control the developing velocity and permeating velocity of the alkaline developer within the above specified range, use of the binder polymer having the repeating unit represented by formula (I) is more preferable.

DETAILED DESCRIPTION OF THE INVENTION

Figure 1:
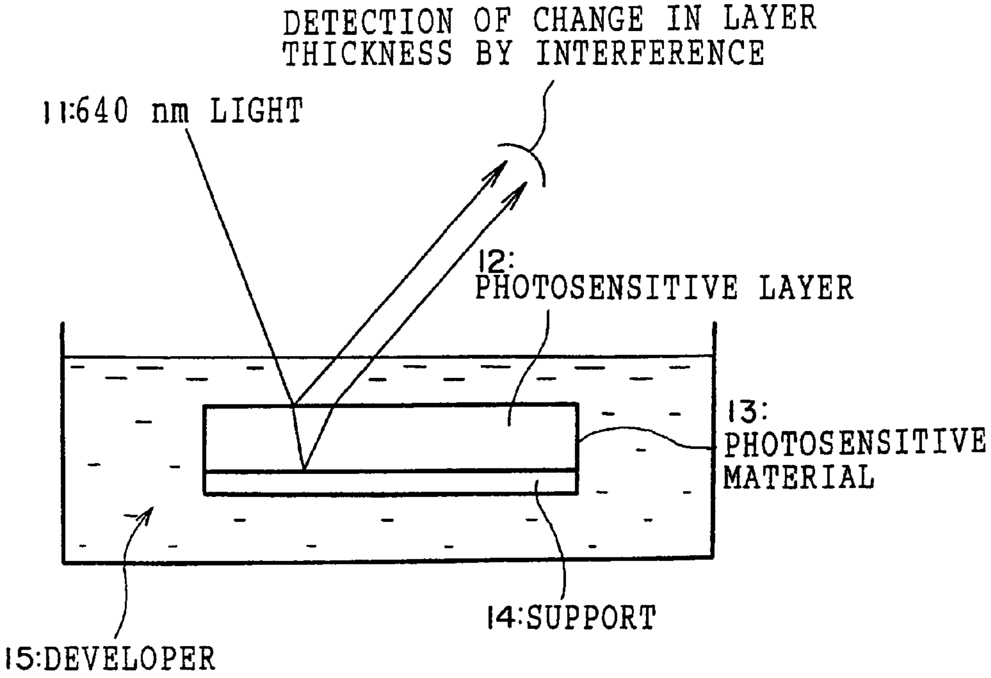
FIG. 1 is a schematic view illustrating one example of a DRM interference wave measuring apparatus to measure a dissolving behavior of a photosensitive layer.

The polymerizable composition and the planographic printing plate precursor according to the present invention will be explained in more detail below.

The polymerizable composition of the invention comprises a binder polymer having the repeating unit represented by the above formula (I), an infrared absorbent, a polymerization initiator and a polymerizable compound.

Such a polymerizable composition has a feature in which the polymerization initiator is decomposed by heat, leading to the generation of a radical, and a polymerization reaction of the polymerizable compound is caused by the generated radical. Furthermore, when the composition is exposed with a laser beam having the wavelength of 300 to 1,200 nm, only the exposed area generates heat and a polymerization reaction proceeds to effect curing, because the polymerizable composition of the invention contains an infrared absorbent. This polymerizable composition is applicable in various uses in which such a feature is utilized, and is also suitable as, for example, an image recording material, a photosensitive layer of a planographic printing plate precursor which is directly writable by an infrared laser or the like, or as a highly photosensitive image recording material. The composition can be also applied for a hologram material utilizing the change of refractive index upon polymerization, and in manufacture of electronic materials such as photo resists. Among these, it is particularly suitable as a photosensitive layer of a planographic printing plate precursor which is directly writable by an infrared laser or the like.

Hereinafter, the polymerizable composition of the invention will be explained in more detail, with references to a planographic printing plate precursor (the planographic printing plate precursor according to the second aspect of the invention) which may be the most suitable use.

The planographic printing plate precursor according to the second aspect of the invention has a photosensitive layer which comprises a polymerizable composition including a binder polymer having the repeating unit represented by the above general formula (I), an infrared absorbent, a polymerization initiator and a polymerizable compound, on a support.

Further, the planographic printing plate precursor according to the third aspect of the invention has a photosensitive layer which comprises a binder polymer, an infrared absorbent, a polymerization initiator and a polymerizable compound, on a support, and the photosensitive layer has a developing velocity at unexposed areas with respect to an alkaline developer having a pH of 10 to 13.5, of 80 nm/sec or greater, and a permeating velocity of the alkaline developer at exposed areas, of 100 nF/sec or less.

First, the photosensitive layer of the planographic printing plate precursor of the invention will be explained in more detail.

The photosensitive layer according to the invention comprises a binder polymer having the repeating unit represented by the above formula (I), an infrared absorbent, a polymerization initiator and a polymerizable compound. Alternatively, the photosensitive layer according to the invention comprising a binder polymer, an infrared absorbent, a polymerization initiator and a polymerizable compound is characterized in that a developing velocity at unexposed areas with respect to an alkaline developer having a pH of 10 to 13.5 is 80 nm/sec or greater, and a permeating velocity of the alkaline developer at exposed areas is 100 nF/sec or less.

Each of the components constituting the photosensitive layer of the planographic printing plate precursor according to the invention is hereinafter explained.

Binder Polymer

<Binder Polymer Contained in Photosensitive Layer of Planographic printing Plate Precursor according to Second Aspect of Invention>

The binder polymer contained in the photosensitive layer in the planographic printing plate precursor according to the second aspect of the invention has the repeating unit represented by the above formula (I). The binder polymer having the repeating unit represented by formula (I), hereinafter occasionally referred to as a specific binder, is explained in more detail.

$R^1$ in formula (I) represents a hydrogen atom or a methyl group, with a methyl group being particularly preferred.

The linking group represented by $R^2$ in formula (I) includes one or more atoms selected from the group consisting of a carbon atom, a hydrogen atom, an oxygen atom, a nitrogen atom, a sulfur atom and a halogen atom, and has a number of atoms of 2 to 82, preferably 2 to 50, more preferably 2 to 30. More specifically, the number of atoms constituting the skeleton of the linking group represented by $R^2$ is preferably 1 to 30, more preferably 3 to 25, still more preferably 4 to 20, and most preferably 5 to 10. The term "a skeleton of the linking group" as used herein refers to atoms or atomic groups to link between A and the terminal COOH group in Formula (I). Particularly, in case where a plurality of linkages are possible, the skeleton of the linking group refers to atoms or atomic groups to constitute a shortest linkage between A and the terminal COOH group. Accordingly, if the linking group includes a cyclic structure therein, numbering the atoms may vary depending on the linking position (e.g., ortho, meta, para or the like).

Hereinafter, specific examples of the structure of the binder polymer according to the present invention, as well as the number of atoms constituting the skeleton of the linking group represented by $R^2$ and how to number atoms will be shown.

| | | Number of Atoms constituting Skeleton of Linking Group |
|---|---|---|
| (1) | 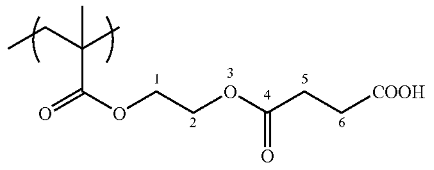 | :6 |
| (2) | 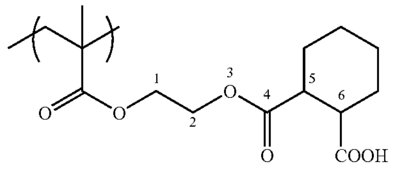 | :6 |
| (3) | 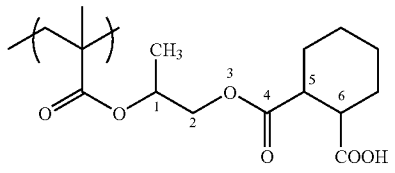 | :6 |
| (4) | 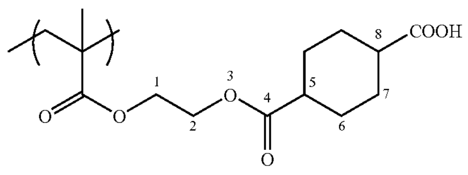 | :8 |

-continued

| | | Number of Atoms constituting Skeleton of Linking Group |
|---|---|---|
| (5) | 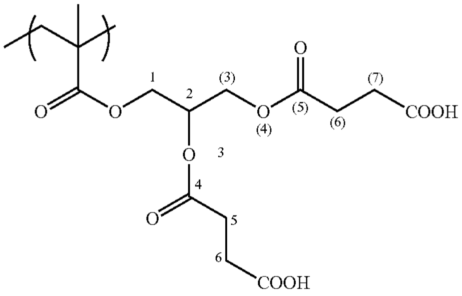 | :6 |
| (6) | 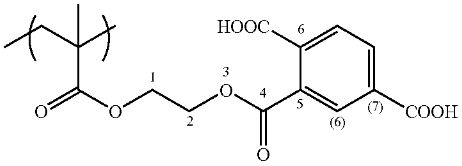 | :6 |
| (7) | 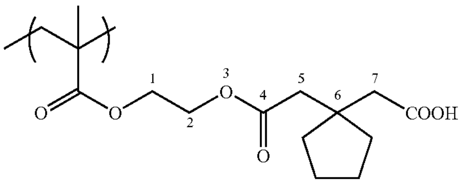 | :7 |
| (8) | 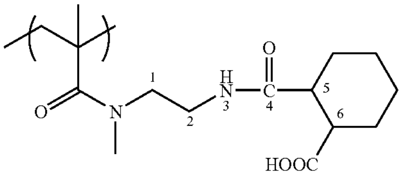 | :6 |

Specific examples of the linking group represented by $R^2$ include alkylene, substituted alkylene, arylene, substituted arylene and the like, as well as those having a structure in which plural bivalent groups are linked via an amide bond or an ester bond.

Examples of the linking group having a chain structure include ethylene, propylene and the like, as well as those having a structure in which an alkylene is linked via an ester bond.

Among these, the linking group represented by $R^2$ in formula (I) is preferably an (n+1) valent hydrocarbon group having an aliphatic cyclic structure having 3 to 30 carbon atoms. More preferred is the linking group having an (n+1) valent hydrocarbon group obtained through removing (n+1) hydrogen atoms on an optional carbon atom that constitutes a compound having an aliphatic cyclic structure such as cyclopropane, cyclopentane, cyclohexane, cycloheptane, cyclooctane, cyclodecane, dicyclohexyl, tercyclohexyl and norbornane, which may be substituted with one or more optional substituent. Moreover, it is preferred that $R^2$ has 3 to 30 carbon atoms including the substituent.

One or more carbon atoms of the compound which constitute the aliphatic cyclic structure may optionally be substituted by a hetero atom selected from a nitrogen atom, an oxygen atom or a sulfur atom. In view of printing durability, $R^2$ is preferably an (n+1) valent hydrocarbon group having an aliphatic cyclic structure, which may have a substituent, having 5 to 30 carbon atoms which includes two or more rings such as a condensed polycyclic aliphatic hydrocarbon, a crosslinked cyclic aliphatic hydrocarbon, a spiro aliphatic hydrocarbon and a conjugated aliphatic hydrocarbon ring (multiple rings formed by linking via a bond or a linking group). Also in this instance, the number of carbons involves carbon atoms carried by the substituent.

Most preferably, the linking group represented by $R^2$ has the number of atoms that constitutes the skeleton of the linking group of 5 to 10. The linking group preferably has a chain structure having an ester bond or has the aforementioned cyclic structure.

Examples of the substituent which may be introduced into the linking group represented by $R^2$ include a monovalent nonmetal atomic group excluding hydrogen, such as a halogen atom (—F, —Br, —Cl and —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, an ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group and a conjugated base group thereof, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group ($—SO_3H$) and a conjugated base group thereof, an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, an N-acylsulfamoyl group and a conjugated base group thereof, an N-alkylsulfonylsulfamoyl group ($—SO_2NHSO_2$(alkyl)) and a conjugated base group thereof, an N-arylsulfonylsulfamoyl group ($—SO_2NHSO_2$(aryl)) and a conjugated base group thereof, an N-alkylsulfonylcarbamoyl group ($—CONHSO_2$(alkyl)) and a conjugated base group thereof, an N-arylsulfonylcarbamoyl group ($—CONHSO_2$(aryl)) and a conjugated base group thereof, an alkoxysilyl group (—Si(Oalkyl)$_3$), an aryloxysilyl group (—Si(Oaryl)$_3$), a hydroxysilyl group ($—Si(OH)_3$) and a conjugated base group thereof, a phosphono group ($—PO_3H_2$) and a conjugated base group thereof, a dialkylphosphono group ($—PO_3$ (alkyl)$_2$), a diarylphosphono group ($—PO_3$(aryl)$_2$), an alkylarylphosphono group ($—PO_3$ (alkyl)(aryl)), a monoalkylphosphono group ($—PO_3H$ (alkyl)) and a conjugated base group thereof, a monoarylphosphono group ($—PO_3H$(aryl)) and a conjugated base group thereof, a phosphonooxy group ($—OPO_3H_2$) and a conjugated base group thereof, a dialkylphosphonoxy group ($—OPO_3$ (alkyl)$_2$), a diarylphosphonoxy group ($—OPO_3$ (aryl)$_2$), an alkylarylphosphonoxy group ($—OPO_3$(alkyl) (aryl)), a monoalkylphosphonoxy group ($—OPO_3H$(alkyl)) and a conjugated base group thereof, a monoarylphosphonoxy group ($—OPO_3H$(aryl)) and a conjugated base group thereof, a cyano group, a nitro group, a dialkylboryl group (—B(alkyl)$_2$), a diarylboryl group (—B(aryl)$_2$), an alkylarylboryl group (—B(alkyl)(aryl)), a dihydroxyboryl group ($—B(OH)_2$) and a conjugated base group thereof, an alkylhydroxyboryl group (—B(alkyl)(OH)) and a conjugated base group thereof, an arylhydroxyboryl group (—B(aryl)(OH)) and a conjugated base group thereof, an aryl group, an alkenyl group, and an alkynyl group.

Although it depends on the design of the photosensitive layer, substituents having a hydrogen atom capable of forming a hydrogen bond, particularly, substituents having a small acid dissociation constant (pKa) than carboxylic acid are not preferred because they are likely to reduce printing durability. On the contrary, halogen atoms, hydrophobic substituents such as hydrocarbon groups (alkyl group, aryl group, alkenyl group or alkynyl group), alkoxy groups and aryloxy groups are more preferred because they are likely to improve printing durability. In particular, when the cyclic structure is a monocyclic aliphatic hydrocarbon such as cyclopentane or cyclohexane, which has lower than a 6-membered ring, it preferably has the aforementioned hydrophobic substituent. These substituents may form a ring, if possible, through binding of the substituents with each other or binding with the hydrocarbon group to which the substituent binds. In addition, the substituent may further be substituted.

When A in formula (I) is $NR^3—$, $R^3$ represents a hydrogen atom or a monovalent hydrocarbon group having 1 to 10 carbon atoms. Examples of the monovalent hydrocarbon group having 1 to 10 carbon atoms represented by $R^3$ include an alkyl group, an aryl group, an alkenyl group and an alkynyl group.

Specific examples of the alkyl group include straight chain, branched or cyclic alkyl groups having 1 to 10 carbon atoms such as a methyl group, an ethyl group, a propyl group, a butyl group, a pentyl group, a hexyl group, a heptyl group, an octyl group, a nonyl group, a decyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclopentyl group, a cyclohexyl group, a 1-adamantyl group and a 2-norbonyl group.

Specific examples of the aryl group include aryl groups having 1 to 10 carbon atoms such as a phenyl group, a naphthyl group and an indenyl group, and heteroaryl groups having 1 to 10 carbon atoms and including one hetero atom selected from the group consisting of a nitrogen atom, an oxygen atom and a sulfur atom, e.g., a furyl group, a thienyl group, a pyrrolyl group, a pyridyl group, a quinolyl group, and the like.

Specific examples of the alkenyl group include straight chain, branched or cyclic alkenyl groups having 1 to 10 carbon atoms such as a vinyl group, a 1-propenyl group, a 1-butenyl group, a 1-methyl-1-propenyl group, a 1-cyclopentenyl group and a 1-cyclohexenyl group.

Specific examples of the alkynyl group include alkynyl groups having 1 to 10 carbon atoms such as an ethynyl group, a 1-propynyl group, a 1-butynyl group and a 1-octynyl group. Examples of the substituent which may be carried by $R^3$ are similar to those exemplified as the substituent which may be introduced into $R^2$. However, the number of carbons of $R^3$ is 1 to 10 including the carbon number of the substituent.

In formula (I), A is preferably an oxygen atom or —NH— from the standpoint of readily synthesis.

In formula (I), n represents an integer number of 1 to 5, and preferably is 1 in light of printing durability.

Specific examples of the repeating unit represented by formula (I) are shown below, but the present invention is not limited thereto.

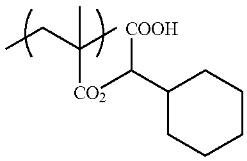
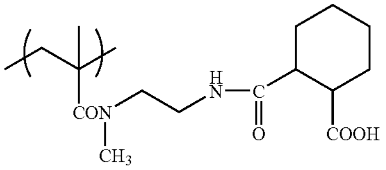
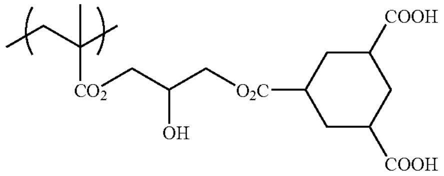
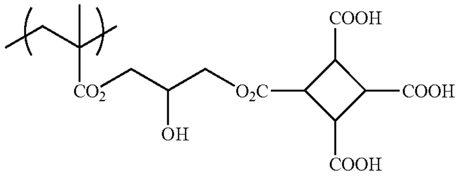
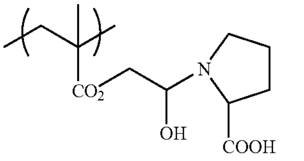
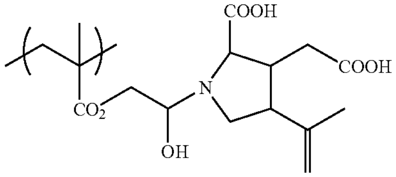
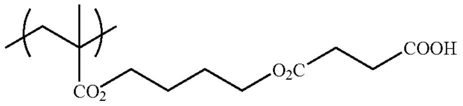
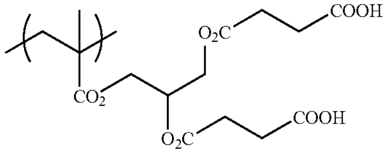
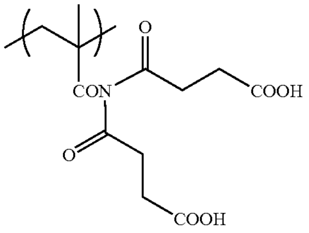
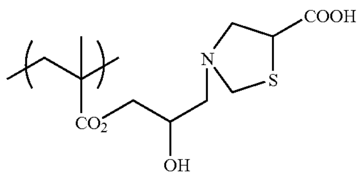
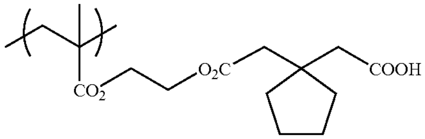
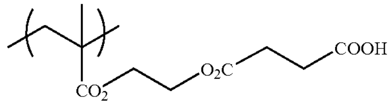
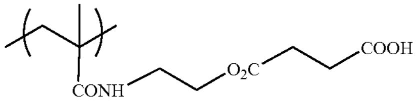
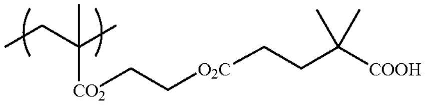
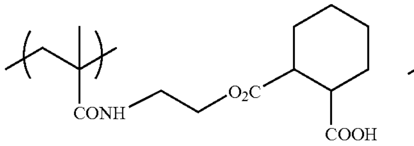
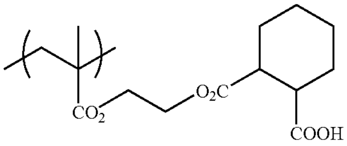
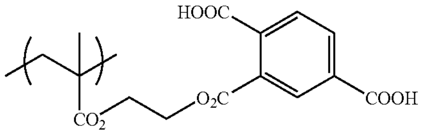
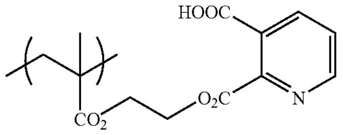
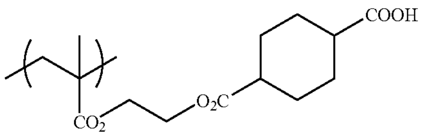
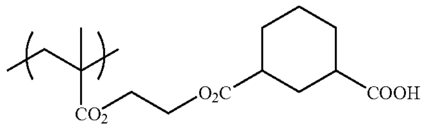
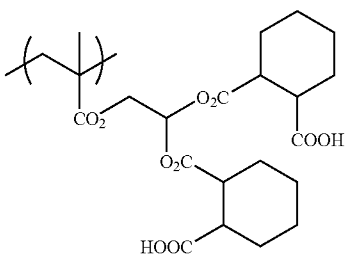
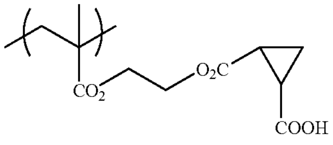

-continued
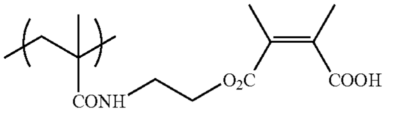
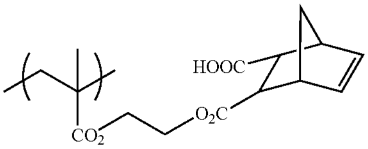
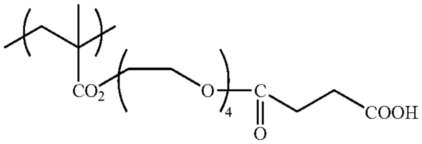
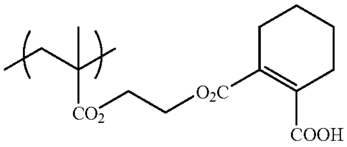
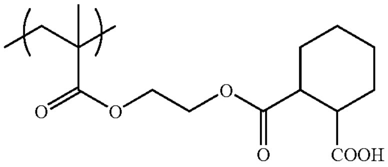
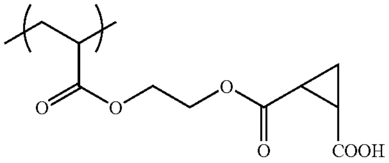
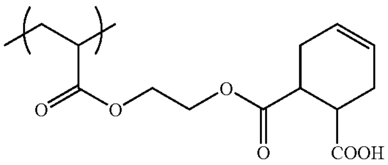
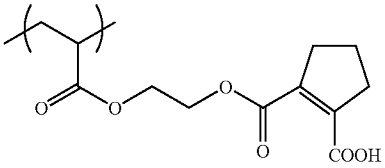
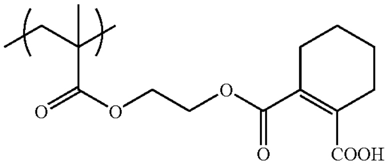
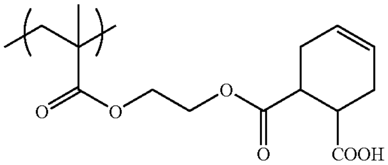
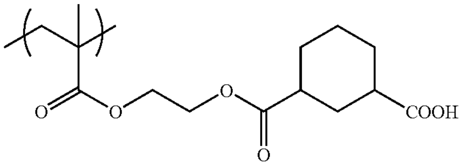
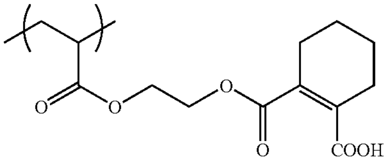
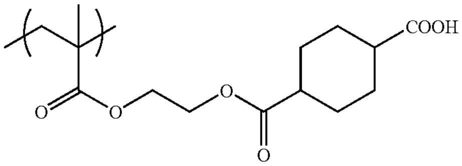
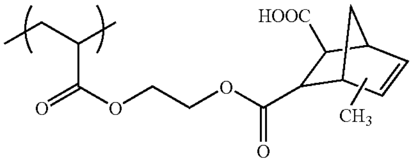
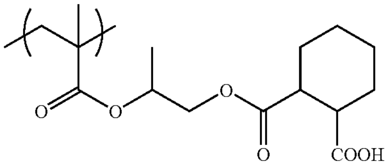
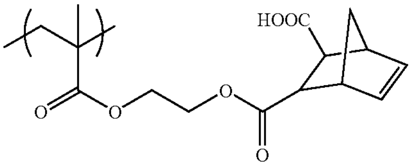
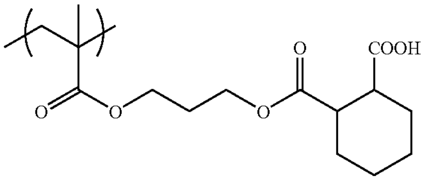
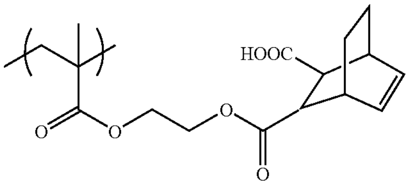
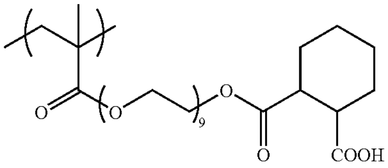
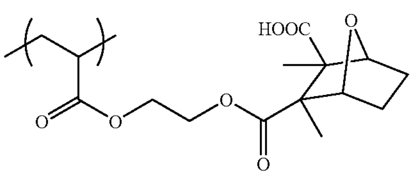

-continued
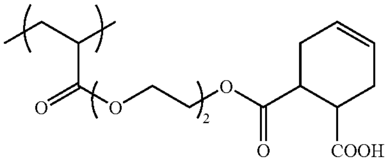
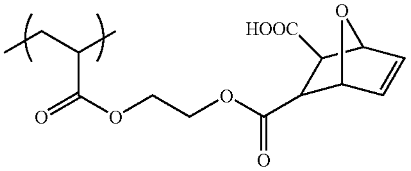
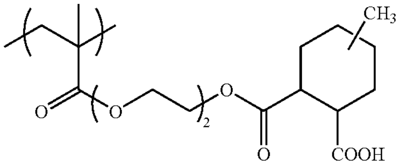
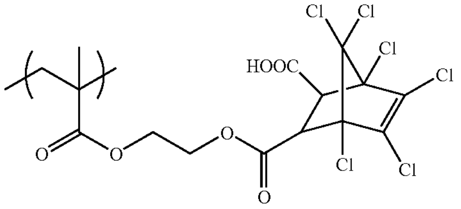
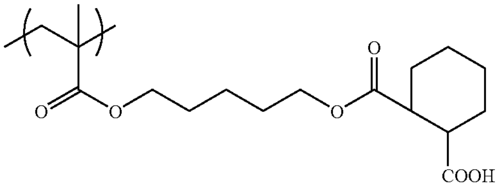
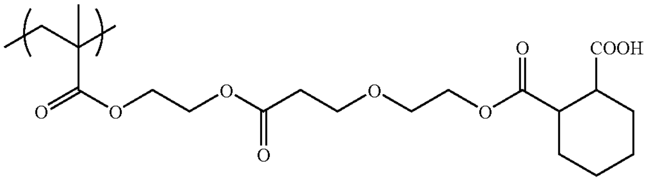
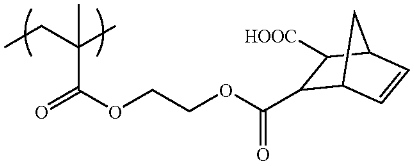
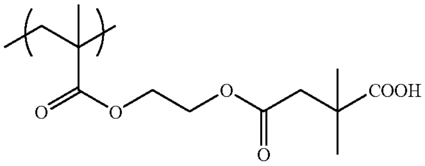
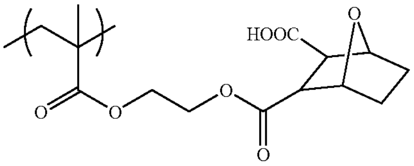
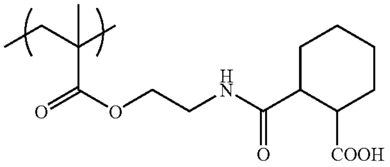
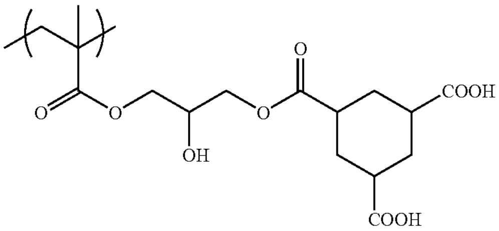
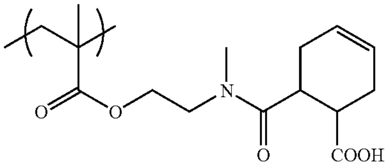
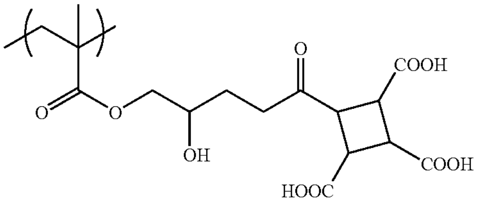
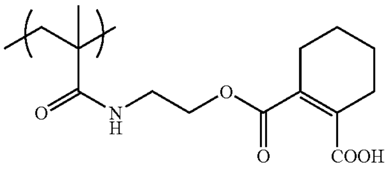
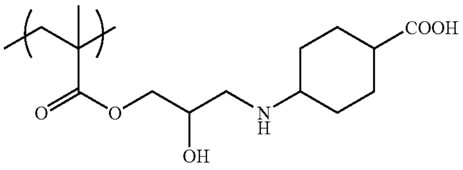
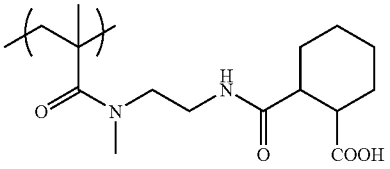
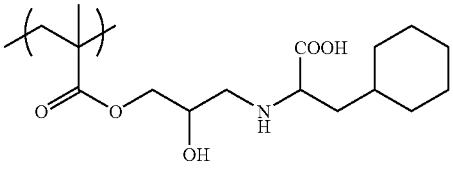

-continued
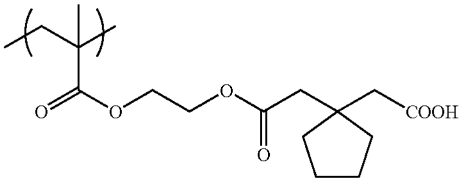
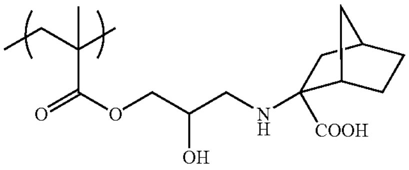
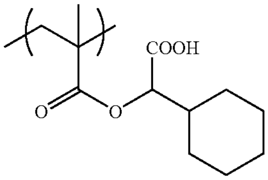
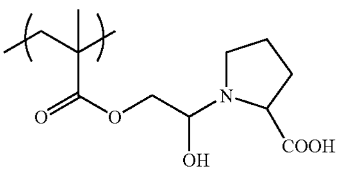
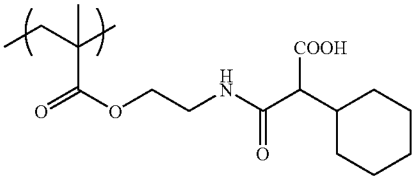
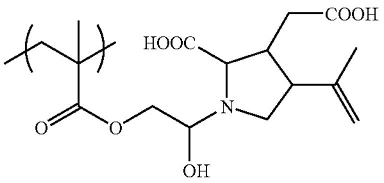
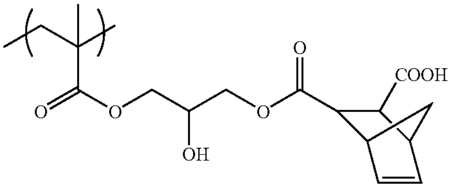
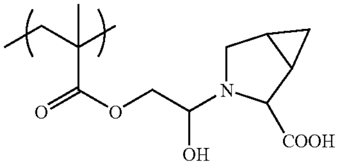
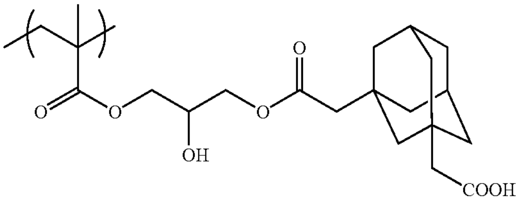
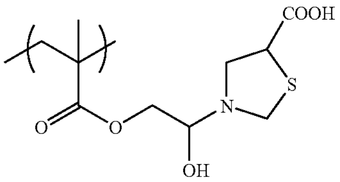
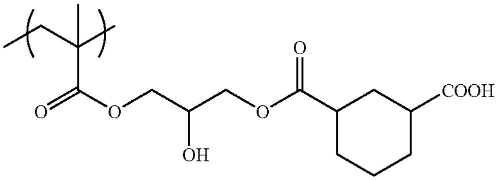
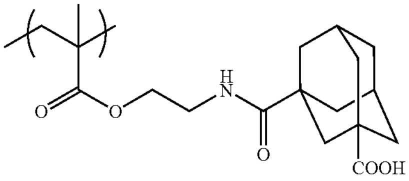
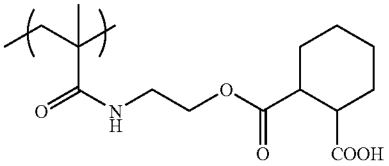
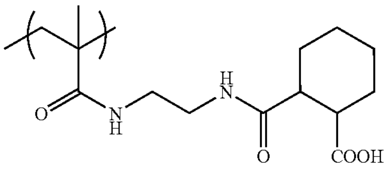
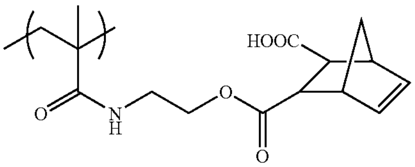
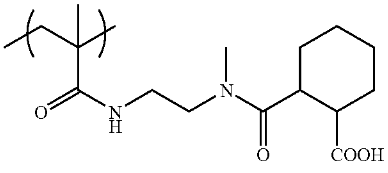
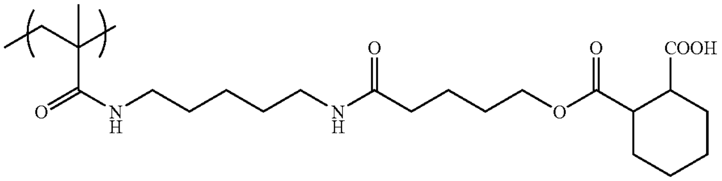

-continued
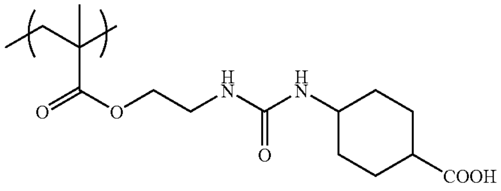
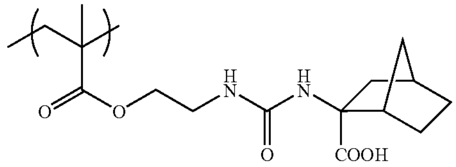
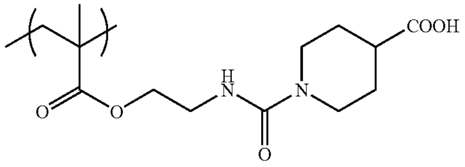
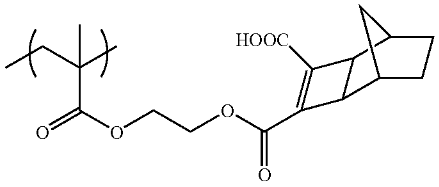
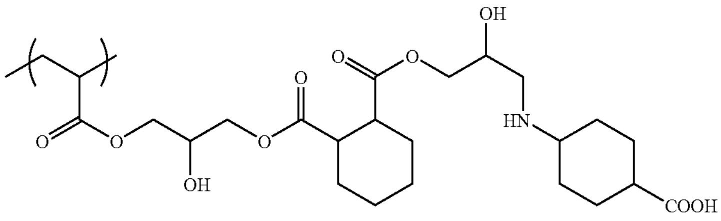
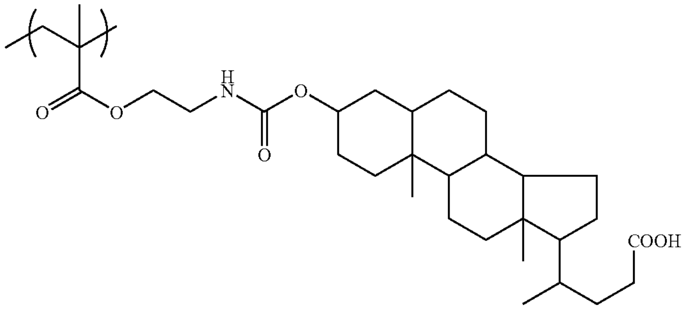
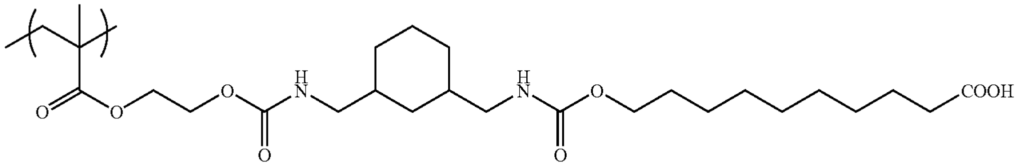
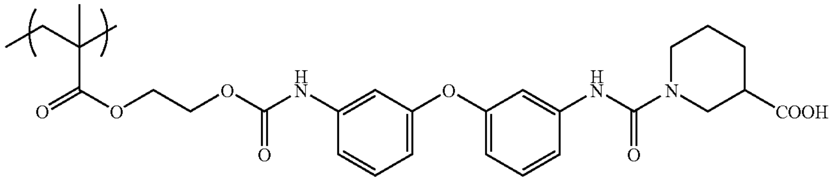
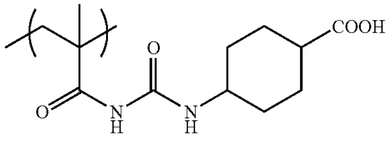
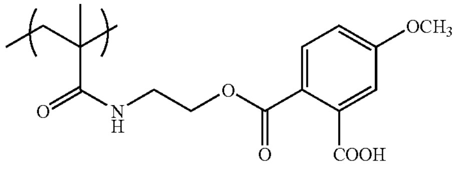
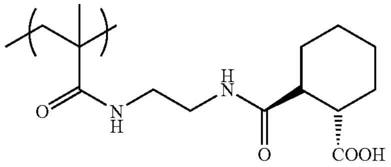
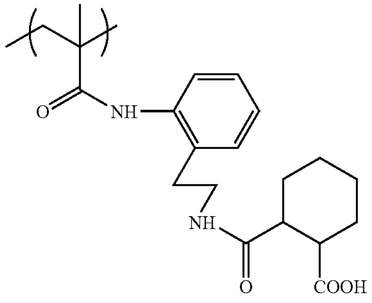

-continued

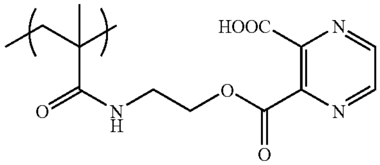

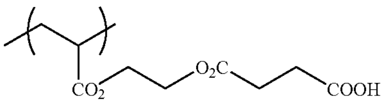

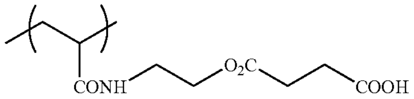

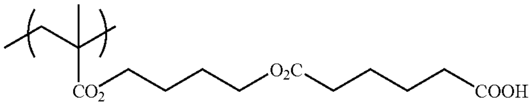

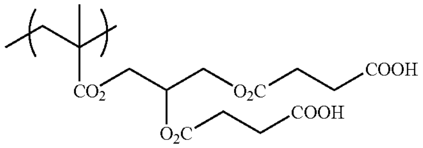

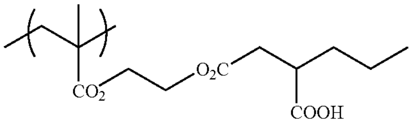

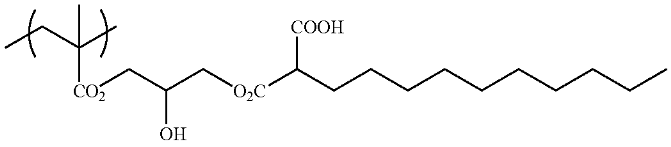

The repeating unit represented by formula (I) included in the binder polymer may be only one kind, or alternatively two or more kinds. Although the specific binder polymer according to the invention may be a polymer composed of the repeating unit represented by formula (I) alone, it is generally combined with other copolymerizable components, and thus used as a copolymer. A total content of the repeating unit represented by formula (I) in the copolymer is determined appropriately depending on the structure, design of the photosensitive layer and the like, however, it is preferably included in the range of 1 to 99 mol %, more preferably 5 to 40 mol %, and still more preferably 5 to 20 mol %, relative to a total mole amount of the polymer component.

When the binder polymer is a copolymer, the copolymerizable component to be used may be any conventionally known monomer, without limitation, insofar as it is a radically polymerizable monomer. Specific examples include monomers described in "Kobunshi Data Handbook (Polymer Data Handbook), Kiso-hen (Fundamental Step) edited by Kobunshi Gakkai (Society of Polymer Science, Japan), published by BAIFUKAN CO., LTD in 1986)". Such a copolymerizable component may be used alone or in combination of two or more kinds thereof.

Further, examples of the preferred copolymerizable component include units having a radically polymerizable group and units having an amide group. The unit having a radical polymerizing group and the unit having an amide group which are preferable as the copolymerizable component with the repeating unit represented by formula (I) are explained below.

Although preferable radical polymerizable groups for the copolymerizable component with the repeating unit represented by formula (I) are not particularly limited insofar as it can cause radical polymerization, examples thereof include an α-substituted methylacryl group [—OC(═O)—C(—$CH_2Z$)═$CH_2$, in which Z is a hydrocarbon group having a terminal hetero atom], an acryl group, a methacryl group, an allyl group and a styryl group.

More specifically, the radical polymerizable groups having the structure represented by formulae (A) to (C) are preferred.

Formula (A)

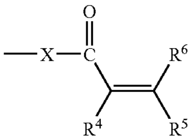

Formula (B)

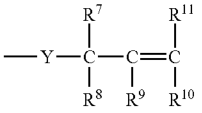

Formula (C)

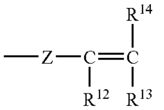

In formulae (A) to (C), $R^4$ to $R^{14}$ each independently represent a hydrogen atom, or a monovalent substituent. X and Y each independently represent an oxygen atom, a sulfur atom or N—$R^{15}$, Z represents an oxygen atom, a sulfur atom, —N—$R^{15}$ or a phenylene group, in which $R^{15}$ represents a hydrogen atom or a monovalent organic group.

In the above formula (A), $R^4$ to $R^6$ each independently represent a hydrogen atom or a monovalent substituent, however, exemplary $R^4$ may be a hydrogen atom, or an organic group such as an alkyl group which may have a substituent. Among these, specific examples of $R^4$ include a hydrogen atom, a methyl group, a methylalkoxy group and a methylester group. Further, $R^5$ and $R^6$ each independently represent a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent, an arylsulfonyl group which may have a substituent. Among these, preferable examples include a hydrogen atom, a carboxyl group, an alkoxycarbonyl group, an alkyl group which may have a substituent, an aryl group which may have a substituent.

Examples of the substituent which may be introduced into these groups include a methoxycarbonyl group, an ethoxycarbonyl group, an isopropioxycarbonyl group, a methyl group, an ethyl group, a phenyl group and the like.

X represents an oxygen atom, a sulfur atom or —N—$R^{15}$, and illustrative examples of $R^{15}$ include an alkyl group which may have a substituent.

In the above formula (B), $R^7$ to $R^{11}$ each independently represent a hydrogen atom or a monovalent substituent. Representative examples of $R^7$ to $R^{11}$ include a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent, an arylsulfonyl group which may have a substituent. Among these, preferable examples include a hydrogen atom, a carboxyl group, an alkoxycarbonyl group, an alkyl group which may have a substituent, and an aryl group which may have a substituent.

Illustrative examples of the substituent which may be introduced into these groups include those listed as the substituent which may be introduced into formula (A).

Y represents an oxygen atom, a sulfur atom or —N—$R^{15}$. Examples of $R^{15}$ include those as defined in formula (A).

In the above formula (C), $R^{12}$ to $R^{14}$ each independently represent a hydrogen atom or a monovalent substituent, however, specific examples thereof include a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent, an arylsulfonyl group which may have a substituent. Among these, preferable examples include a hydrogen atom, a carboxyl group, an alkoxycarbonyl group, an alkyl group which may have a substituent, and an aryl group which may have a substituent.

Illustrative examples of the substituent which may be introduced into these groups include those listed as the substituent which may be introduced into formula (A).

Z represents an oxygen atom, a sulfur atom, —N—$R^{15}$ or a phenylene group. Examples of $R^{15}$ include those as defined in formula (A).

The polymer including a radical polymerizable group having a structure represented by the above formula (A) according to the invention may be produced by at least one of the following Synthesizing Processes (1) and (2).

Synthesizing Process (1)

A process of causing polymerization using one or more radical polymerizable compounds represented by the following formula (D) to obtain a polymer compound, followed by proton withdrawal using a base to leave $Z^1$, to thereby give a desired polymer compound.

Formula (D)

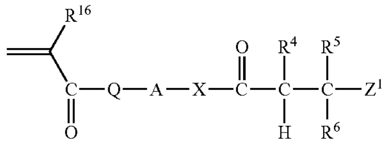

In formula (D), $R^4$ to $R^6$ are the same as defined for $R^4$ to $R^6$ in the above formula (A). $Z^1$ represents an anionic leaving group. Q represents an oxygen atom, —NH— or $NR^{17}$— (in which $R^{17}$ represents an alkyl group which may have a substituent). Examples of $R^{16}$ include a hydrogen atom or an alkyl group which may have a substituent, and among these, preferable examples include a hydrogen atom, a methyl group, a methylalkoxy group and a methylester group. A represents a bivalent organic linking group.

Examples of the radical polymerizable compound represented by formula (D) include the following compounds, but the present invention is not limited thereto.

(M-1)

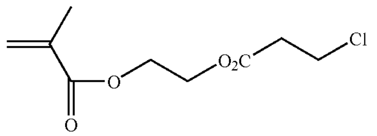

(M-2)

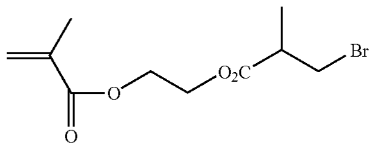

(M-3)

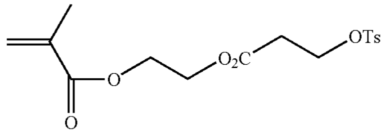

(M-4)

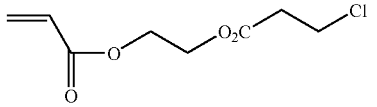

(M-5)

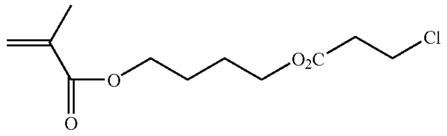

(M-6)

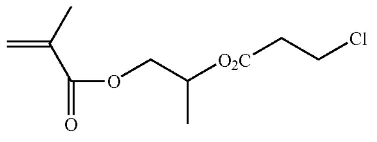

(M-7)

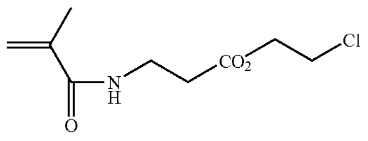

-continued (M-8)

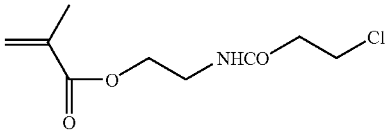

(M-9)

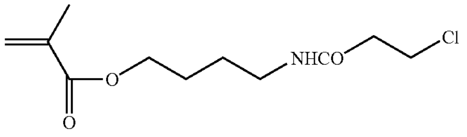

(M-10)

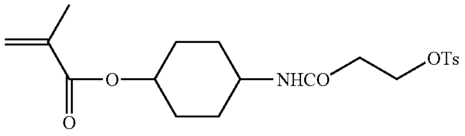

(M-11)

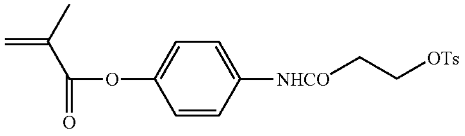

(M-12)

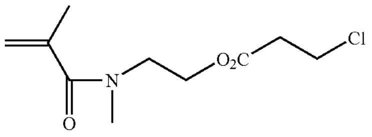

These radical polymerizable compounds represented by formula (D) are readily commercially available, or alternatively obtainable according to the synthesizing process set forth below.

The group represented by formula (A) may be introduced using one or more of these radical polymerizable compounds represented by formula (D) and optionally other radical polymerizable compound, through a usual radical polymerization process to synthesize a polymer compound, followed by dropwise addition of a base in a desired amount to the polymer solution under cooling or heating conditions to effect a reaction, and then neutralization with an acid, as necessary. In order to produce the polymer compound, any conventionally known suspension polymerization processes, solution polymerization processes or the like may be employed.

The usable base may be either an inorganic compound (inorganic base) or an organic compound (organic base). Preferable examples of the inorganic base include sodium hydroxide, potassium hydroxide, sodium carbonate, sodium hydrogen carbonate, potassium carbonate, potassium hydrogen carbonate and the like. Preferable examples of the organic base include metal alkoxides such as sodium methoxide, sodium ethoxide and potassium-t-butoxide, organic amine compounds such as triethylamine, pyridine and diisopropylethylamine.

Synthesizing Process (2)

A process of causing polymerization using one or more radical polymerizable compounds including a functional group to synthesize a backbone-chain polymer compound, followed by allowing a reaction between the functional side group of the backbone-chain polymer compound and a compound represented by the following formula (E), to thereby give a desired polymer.

Formula (E)

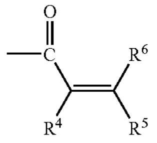

$R^4$ to $R^6$ in formula (E) are the same as defined for $R^4$ to $R^6$ in the above formula (A).

Examples of the functional group of the radical polymerizable compound having a functional group used in synthesis of the backbone chain polymer compound in Synthesizing Process (2) include a hydroxyl group, a carboxyl group, a carboxylic halide group, a carboxylic anhydride group, an amino group, a halogenated alkyl group, an isocyanate group, an epoxy group and the like. Specific examples of the radical polymerizable compound having such a functional group include 2-hydroxylethyl acrylate, 2-hydroxylethyl methacrylate, 4-hydroxybutyl acrylate, 4-hydroxybutyl methacrylate, acrylic acid, methacrylic acid, acrylic chloride, methacrylic chloride, methacrylic anhydride, N,N-dimethyl-2-aminoethyl methacrylate, 2-chloroethyl methacrylate, ethyl 2-isocyanate methacrylate, glycidyl acrylate, glycidyl methacrylate and the like.

Desired polymer compounds may be obtained through polymerizing one or more radical polymerizable compound having such a functional group, and optionally copolymerizing with another radical polymerizable compound, to synthesize a backbone-chain polymer compound followed by allowing a reaction with a compound having a group represented by the above formula (E).

Examples of the compound having a group represented by formula (E) include the above-described compounds which are exemplified as the radical polymerizable compound having the functional group.

The polymer including a radical polymerizable group having a structure represented by the above formula (B) according to the invention may be produced by at least one of the following Synthesizing Processes (3) and (4).

Synthesizing Process (3)

A process of causing polymerization between one or more radical polymerizable compounds including an unsaturated group represented by formula (B) and an ethylenically unsaturated group having higher addition polymerizability than the foregoing unsaturated group, and optionally other radical polymerizable compound, to thereby give a polymer compound.

This process is employable when a compound including a plurality of ethylenically unsaturated groups having mutually different addition polymerizing properties within a molecule, for example, acryl methacrylate is used.

Examples of the radical polymerizable compound including an ethylenically unsaturated group, which has higher addition polymerizability than the unsaturated group represented by formula (B), include allyl acrylate, allyl methacrylate, 2-allyloxyethyl acrylate, 2-allyloxyethyl methacrylate, propargyl acrylate, propargyl methacrylate, N-allyl acrylate, N-allyl methacrylate, N,N-diallyl acrylate, N,N-diallylmethacryl amide, allylacrylamide, allylmethacryl amide and the like.

Synthesizing Process (4)

A process of causing polymerization using one or more radical polymerizable compounds including a functional group to synthesize a polymer compound, followed by allowing a reaction between the functional side group and a compound having a structure represented by formula (F), to thereby introduce a group represented by formula (B).

Formula (F)

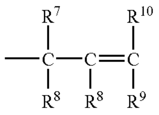

$R^7$ to $R^{11}$ in formula (F) are the same as defined for $R^7$ to $R^{11}$ in the above formula (B).

Specific examples of the radical polymerizable compound having a functional group used in Synthesizing Process (4) include the examples of the radical polymerizable compound having a functional group exemplified in the aforementioned Synthesizing Process (2).

Examples of the compound having a structure represented by formula (F) include allyl alcohol, allyl amine, diallyl amine, 2-allyloxyethyl alcohol, 2-chloro-1-butene, allyl isocyanate and the like.

The polymer having a radical polymerizable group having a structure represented by the above formula (C) according to the invention may be produced by at least one of the following Synthesizing Processes (5) and (6).

Synthesizing Process (5)

A process of causing copolymerization using one or more radical polymerizable compounds including an unsaturated group represented by formula (C) and an ethylenically unsaturated group having higher addition polymerizability than the foregoing unsaturated group, and optionally another radical polymerizable compound, to thereby give a polymer compound.

Examples of the radical polymerizable compound including an ethylenically unsaturated group having higher addition polymerizability than the foregoing unsaturated group represented by formula (C) include vinyl acrylate, vinyl methacrylate, 2-phenylvinyl acrylate, 2-phenylvinyl methacrylate, 1.-propenyl acrylate, 1-propenyl methacrylate, vinyl acrylamide, vinyl methacrylamide and the like.

Synthesizing Process (6)

A process of causing polymerization using one or more radical polymerizable compounds including a functional group to obtain a polymer compound, followed by allowing a reaction between a compound including a functional side group and a structure represented by formula (G).

Formula (G)

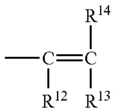

$R^{12}$ to $R^{14}$ in formula (G) are the same as defined for $R^{12}$ to $R^{14}$ in the above formula (C).

Specific examples of the radical polymerizable compound having a functional group used in Synthesizing Process (6) include the examples of the radical polymerizable compound having a functional group exemplified in the aforementioned Synthesizing Process (2).

Examples of the compound having a structure represented by formula (G) include 2-hydroxyethylmonovinyl ether, 4-hydroxybutylmonovinyl ether, diethyleneglycol monovinyl ether, 4-chloromethyl styrene and the like.

Although Synthesizing Processes (1) to (6) of producing the polymer including the radical polymerizable group having a structure represented by the above formulae (A) to (C) according to the invention are explained supra, synthesis of the specific binder polymer according to the invention using any one of the synthesizing processes may be achieved by causing copolymerization between the radical polymerizable compound and the unit represented by the above formula (I) at a predetermined ratio when the radical polymerizable compounds are polymerized in each of Synthesizing Processes (1) to (6).

Among these radical polymerizable groups, the radical polymerizing groups having a structure represented by the above shown formulae (A) and (B) are preferable. In particular, radical polymerizable groups having the structure represented by the above formula (A) are preferred, and further, those in which $R^4$ is a hydrogen atom or a methyl group and X is an oxygen atom or a nitrogen atom are most preferred.

Specific examples suitably used as the repeating unit including the radical polymerizing group having a structure represented by the above formulae (A) to (C) are shown below, but the present invention is not limited thereto.

1)

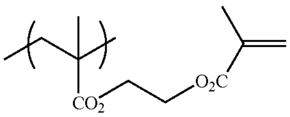

2)

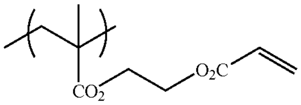

3)

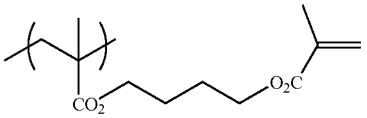

4)

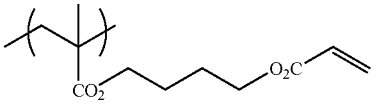

5)

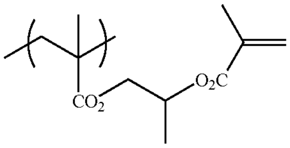

6)

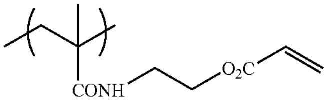

7)

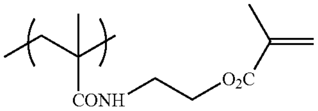

-continued
8)
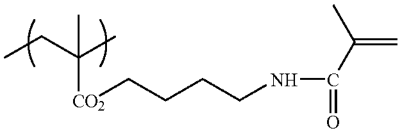
9)
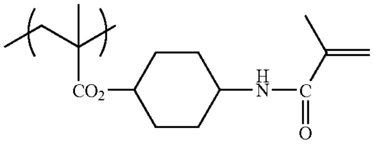
10)
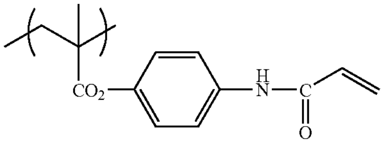
11)
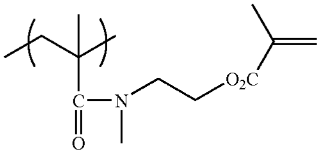
12)
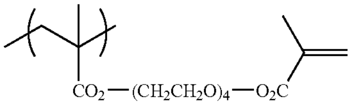
13)
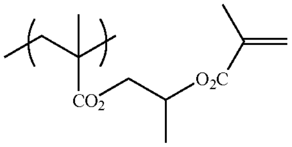
14)
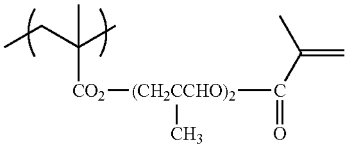
15)
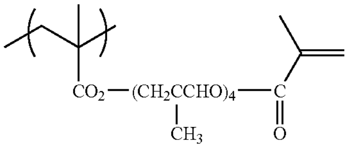
16)
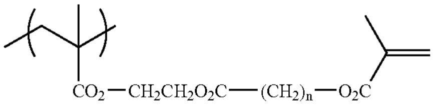
n = 4 or 5
17)
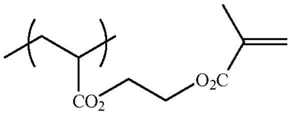
-continued
18)
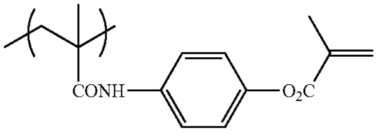
19)
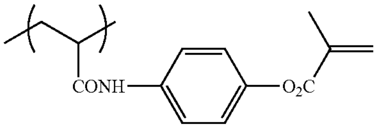
20)
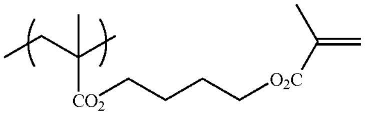
21)
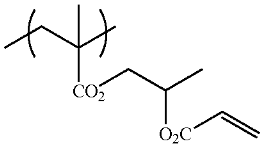
22)
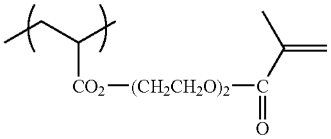
23)
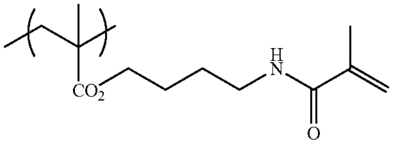
24)
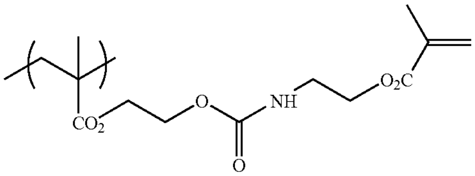
25)
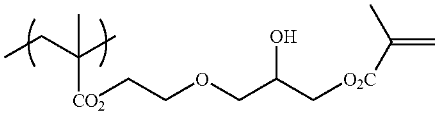
26)
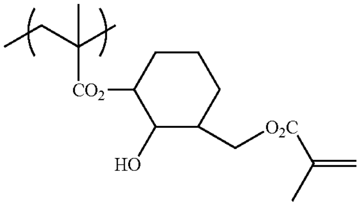
27)
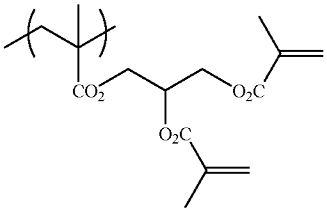

-continued
28)
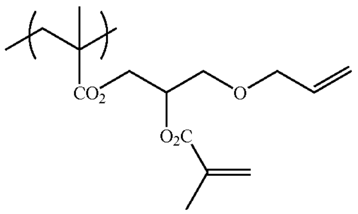
29)
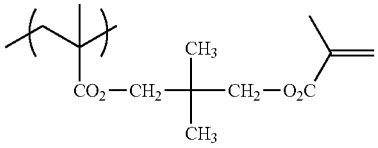
30)
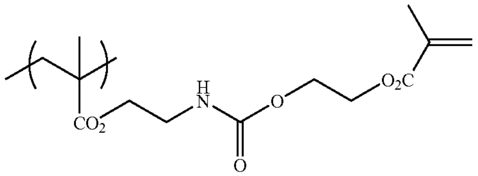
31)
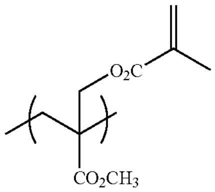
32)
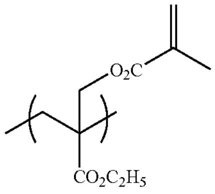
33)
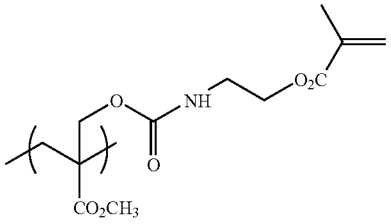
34)
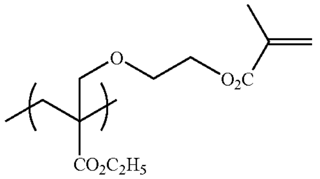
35)
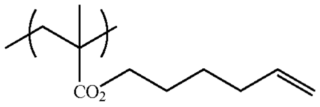
36)
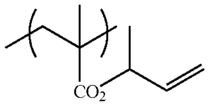
-continued
37)
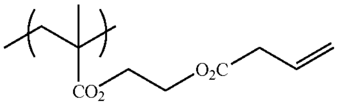
38)
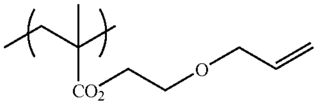
39)
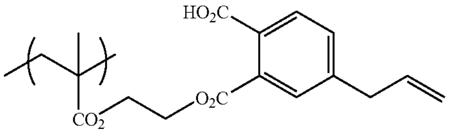
40)
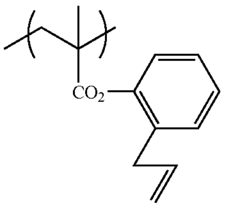
41)
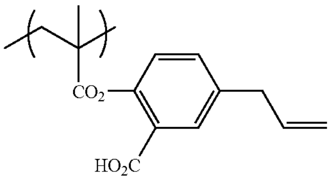
42)
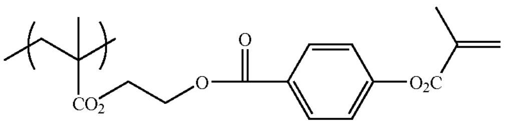
43)
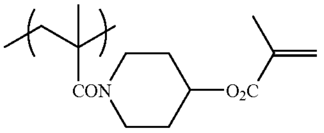
44)
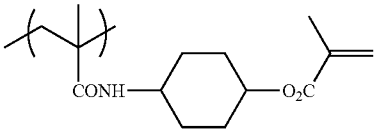
45)
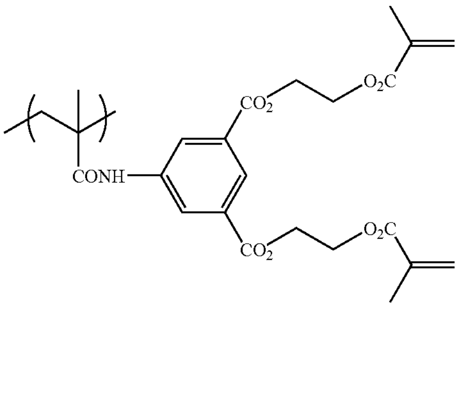

-continued

46)

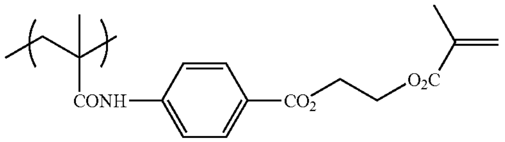

47)

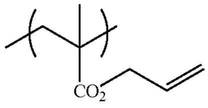

Next, amide groups which are suitable as a copolymerizable component with the repeating unit represented by formula (I) are explained. Amide groups having a structure represented by the following formula (1) are preferable as the amide group.

Formula (1)

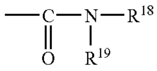

In formula (1), $R^{18}$ and $R^{19}$ each independently represent a hydrogen atom, and an alkyl group, an alkenyl group, an alkynyl group, an aryl group, a heterocyclic group, which may have a substituent, and a substituted sulfonyl, and $R^{18}$ and $R^{19}$ may form an alicyclic structure through bonding with each other.

Preferable examples of $R^{18}$ and $R^{19}$ are described in more detail below. Examples of the alkyl group represented by $R^{18}$ and $R^{19}$ include straight chain, branched and cyclic alkyl groups having 1 to 20 carbon atoms. Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, an s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbonyl group. Among these, straight chain alkyl groups having 1 to 12 carbon atoms, branched alkyl groups having 3 to 12 carbon atoms, and cyclic alkyl groups having 5 to 10 carbon atoms are more preferred.

Examples of the substituent of the substituted alkyl group represented by $R^{18}$ and $R^{19}$ include the groups composed of a monovalent nonmetal atomic group, excluding a hydrogen atom. Preferable examples thereof include a halogen atom (—F, —Br, —Cl and —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, an ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group ($—SO_3H$) and a conjugated base group thereof (referred to as a sulfonato group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group($—PO_3H_2$) and a conjugated base group thereof (referred to as a phosphonato group), a dialkylphosphono group ($—PO_3(alkyl)_2$; alkyl=an alkyl group, same in the followings), a diarylphosphono group ($—PO_3(aryl)_2$; aryl=aryl group, same in the followings), an alkylarylphosphono group ($—PO_3(alkyl)(aryl)$), a monoalkylphosphono group ($—PO_3(alkyl)$) and a conjugated base group thereof (referred to as an alkylphosphonato group), a monoarylphosphono group ($—PO_3H(aryl)$) and a conjugated base group thereof (referred to as an arylphosphonato group), a phosphonooxy group ($—OPO_3H_2$) and a conjugated base group thereof (referred to as a phosphonatooxy group), a dialkylphosphonooxy group ($—OPO_3H(alkyl)_2$), a diarylphosphonooxy group ($—OPO_3(aryl)_2$), an alkylarylphosphonooxy group ($—OPO_3(alkyl)(aryl)$), a monoalkylphosphonooxy group ($—OPO_3H(alkyl)$) and a conjugated base group thereof (referred to as an alkylphosphonatooxy group), a monoarylphosphonooxy group ($—OPO_3H(aryl)$) and a conjugated base group thereof (referred to as an arylphosphonatooxy group), a cyano group, a nitro group, an aryl group, an alkenyl group, an alkynyl group, a heterocyclic group, a silyl group and the like.

Specific examples of the alkyl group in these substituents include the aforementioned alkyl groups. Illustrative examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, an N-phenylcarbamoylphenyl group, a cyanophenyl group, a sulfophenyl group, a sulfonatophenyl group, a phosphonophenyl group, a phosphonatophenyl group and the like.

Preferable examples of the alkenyl group include a vinyl group, a 1-propenyl group, a 1-butenyl group, a cinnamyl group, a 2-chloro-1-ethenyl group and the like. Examples of the alkynyl group include an ethynyl group, a 1-propynyl group, a 1-butynyl group, a trimethylsilylethynyl group and the like.

Examples of $R^{01}$ in the acyl group ($R^{01}CO$—) include a hydrogen atom, as well as the aforementioned alkyl groups and aryl groups. Among these, more preferred substituents include a halogen atom (—F, —Br, —Cl and —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonooxy group, a phosphonatooxy group, an aryl group and an alkenyl group. Examples of the heterocyclic group include a pyridyl group, a piperidinyl group and the like. Examples of the silyl group include a trimethylsilyl group and the like.

On the other hand, examples of the alkylene group in the substituted alkyl group include bivalent organic residues, which are obtained by removing any one of hydrogen atoms on the aforementioned alkyl groups having 1 to 20 carbon atoms. Preferable examples include straight chain alkylene groups having 1 to 12 carbon atoms, branched alkylene groups having 3 to 12 carbon atoms, and cyclic alkylene groups having 5 to 10 carbon atoms. Preferable specific examples of the substituted alkyl group, which is obtained by combining such a substituent and an alkylene group, include a chloromethyl group, a bromomethyl group, a 2-chloroethyl group, a trifluoromethyl group, a methoxymethyl group, an isopropoxymethyl group, a butoxymethyl group, an s-butoxybutyl group, a methoxyethoxyethyl group, an aryloxymethyl group, a phenoxymethyl group, a methylthiomethyl group, a tolylthiomethyl group, a pyridylmethyl group, a tetramethylpiperidinylmethyl group, an N-acetyltetramethylpiperidinylmethyl group, a trimethylsilylmethyl group, a methoxyethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, a allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group, a 3-butynyl group and the like.

Examples of the aryl group as $R^{18}$ and $R^{19}$ include a condensed ring formed from 1 to 3 benzene rings, and a condensed ring formed from a benzene ring and a 5-membered unsaturated ring. Specific examples thereof include a phenyl group, a naphthyl group, an anthryl group, a phenanthryl group, an indenyl group, an acenaphthenyl group and a fluorenyl group. Among these, a phenyl group and a naphthyl group are more preferred.

Examples of the substituted aryl group represented by $R^{18}$ and $R^{19}$ include those having a group composed of a monovalent nonmetal atomic group, excluding a hydrogen atom, as a substituent on ring-forming carbon atoms of the aforementioned aryl group. Examples of the preferred substituent include the aforementioned alkyl groups, substituted alkyl groups, and above listed substituents in the substituted alkyl groups. Preferable examples of the substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl)carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allylphenyl group, a 1-propenylmethylphenyl group, a 2-butenylphenyl group, a 2-methylarylphenyl group, a 2-methylpropenylphenyl group, a 2-propynylphenyl group, a 2-butynylphenyl group, a 3-butynylphenyl group and the like.

Examples of the alkenyl group, substituted alkenyl group, alkynyl group, and substituted alkynyl group ($—C(R^{02})=C(R^{03})(R^{04})$ and $—C≡C(R^{05})$) represented by $R^{18}$ and $R^{19}$ include groups in which $R^{02}$, $R^{03}$, $R^{04}$ and $R^{05}$ each represent a group composed of a monovalent nonmetal atomic group. Examples of preferred $R^{02}$, $R^{03}$, $R^{04}$ and $R^{05}$ include a hydrogen atom, a halogen atom, an alkyl group, a substituted alkyl group, an aryl group and a substituted aryl group. Specific examples thereof include those as illustrated supra. Examples of more preferred groups of $R^{02}$, $R^{03}$, $R^{04}$ and $R^{05}$ include a hydrogen atom, a halogen atom and a straight chain, branched and cyclic alkyl groups having 1 to 10 carbon atoms. Preferable specific examples of the alkenyl group, substituted alkenyl group, alkynyl group and substituted alkynyl group represented by $R^{18}$ and $R^{19}$ include a vinyl group, a 1-propenyl group, a 1-butenyl group, a 1-pentenyl group, a 1-hexenyl group, a 1-octhenyl group, a 1-methyl1-propenyl group, a 2-methyl-1-propenyl group, a 2-methyl-1-butenyl group, a 2-phenyl-1-ethenyl group, a 2-chloro-1-ethenyl group, an ethynyl group, a 1-propynyl group, a 1-butynyl group and a phenylethynyl group.

Examples of the heterocyclic group represented by $R^{18}$ and $R^{19}$ include the pyridyl group and the like which are exemplified as substituents of the substituted alkyl groups.

Examples of the substituted sulfonyl group ($R^{011}$-$SO_2$—) represented by $R^{18}$ and $R^{19}$ include the groups in which $R^{011}$ represents a group composed of a monovalent nonmetal atomic group. More preferred examples include an alkylsulfonyl group and an arylsulfonyl group. Examples of the alkyl group and the aryl group include those exemplified as the aforementioned alkyl group, substituted alkyl group, and aryl group and substituted aryl group. Specific examples of such a substituted sulfonyl group include a butylsulfonyl group, a phenylsulfonyl group, a chlorophenylsulfonyl group and the like.

Examples of the ring formed by binding $R^{18}$ and $R^{19}$ with each other in formula (1) include morpholine, piperazine, pyrrolidine, pyrrole, indoline and the like. These may further be substituted by a substituent as described above. Among these, preferable is a case where an aliphatic ring is formed.

In formula (1), $R^{18}$ and $R^{19}$ are preferably an alkyl group, an alkenyl group, an aryl group or a substituted sulfonyl group. It is also preferable when an aliphatic ring is formed between $R^{18}$ and $R^{19}$.

Specific examples of the preferred repeating unit having an amide group represented by formula (1) are shown below, but the present invention is not limited thereto.

(Am-1)

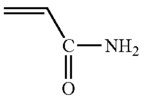

(Am-2)

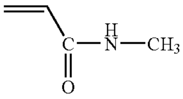

(Am-3)

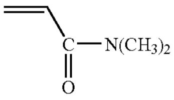

(Am-4)

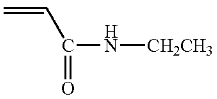

(Am-5)

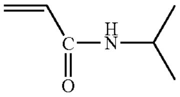

(Am-6)

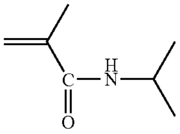

-continued (Am-7)

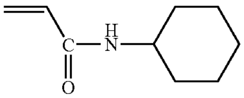

(Am-8)

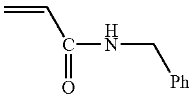

(Am-9)

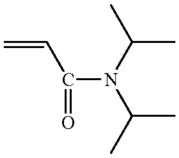

(Am-10)

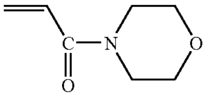

(Am-11)

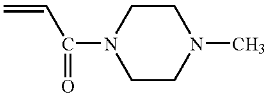

(Am-12)

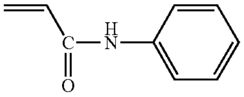

(Am-13)

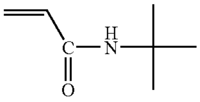

(Am-14)

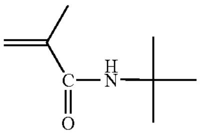

(Am-15)

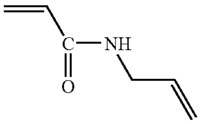

(Am-16)

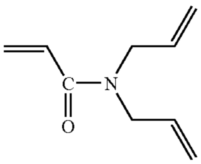

(Am-17)

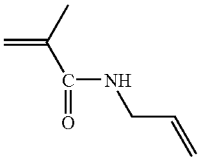

(Am-18)

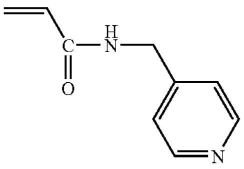

-continued
(Am-19)
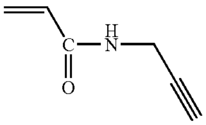
(Am-20)
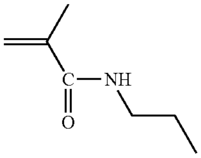
(Am-21)
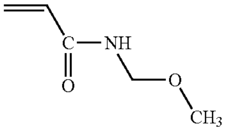
(Am-22)
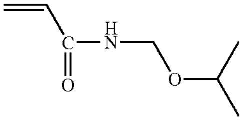
(Am-23)
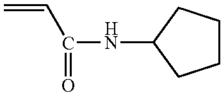
(Am-24)
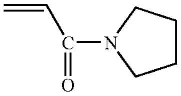
(Am-25)
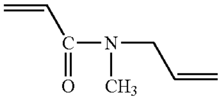
(Am-26)
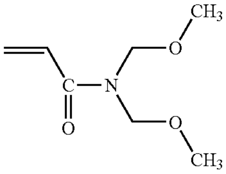
(Am-27)
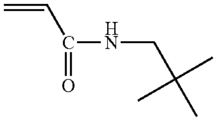
(Am-28)
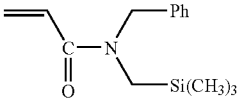
(Am-29)
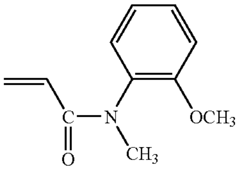
(Am-30)
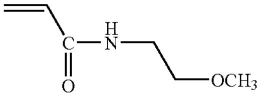
-continued
(Am-31)
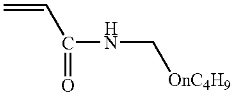
(Am-32)
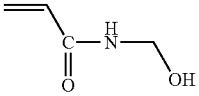
(Am-33)
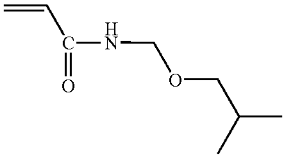
(Am-34)
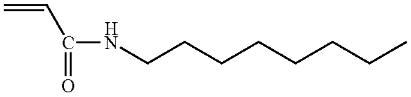
(Am-35)
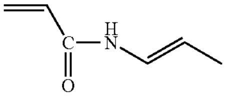
(Am-36)
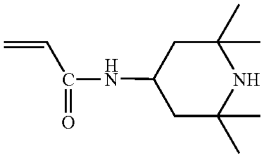
(Am-37)
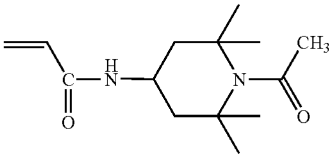
(Am-38)
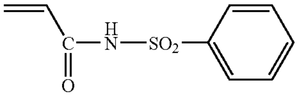
(Am-39)
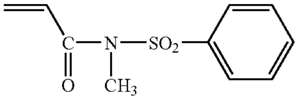
(Am-40)
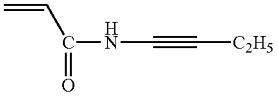
(Am-41)
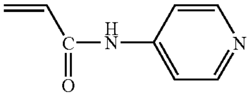
(Am-42)
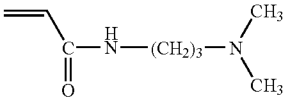
(Am-43)
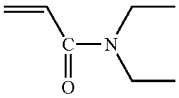

-continued
(Am-44)
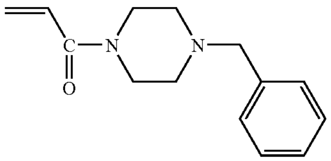
(Am-45)
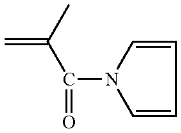
(Am-46)
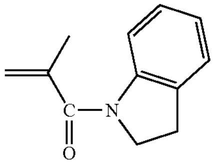
(Am-47)
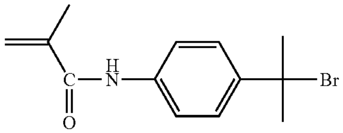
(Am-48)
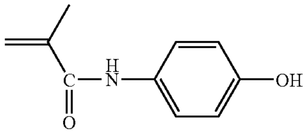
(Am-49)
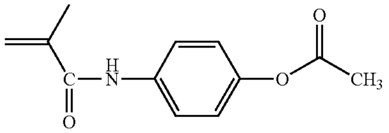
(Am-50)
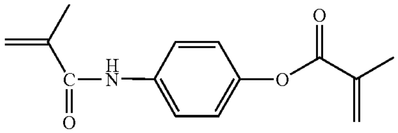
(Am-51)
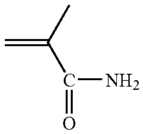
(Am-52)
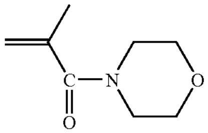
(Am-53)
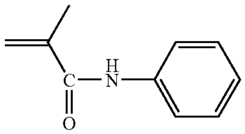
-continued
(Am-54)
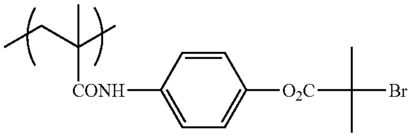
(Am-55)
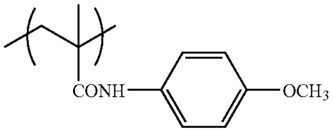
(Am-56)
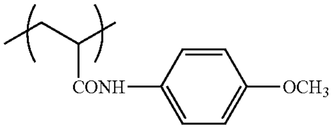
(Am-57)
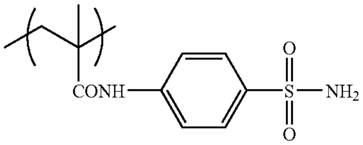
(Am-58)
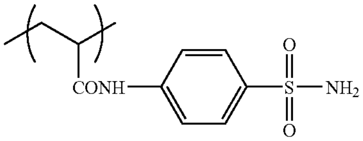
(Am-59)
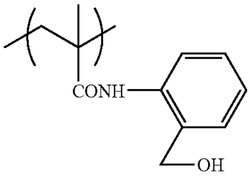
(Am-60)
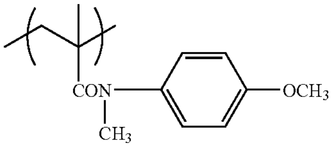
(Am-61)
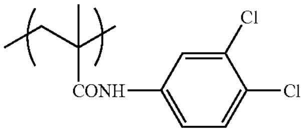
(Am-62)
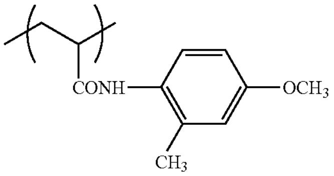
(Am-63)
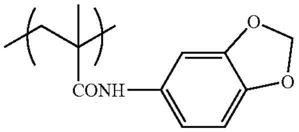

-continued (Am-64)

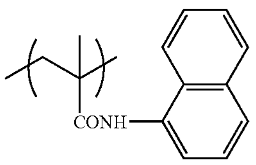

(Am-65)

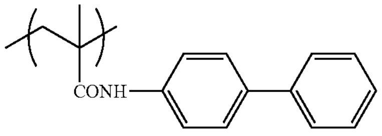

(Am-66)

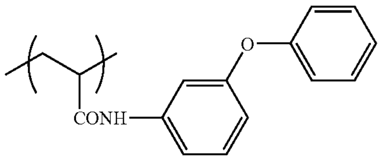

(Am-67)

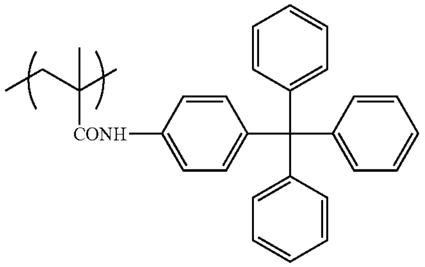

(Am-68)

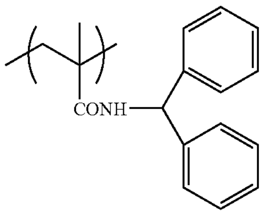

(Am-69)

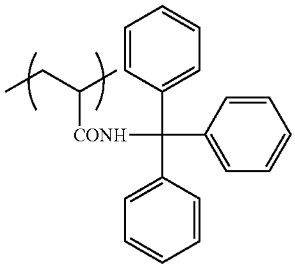

(Am-70)

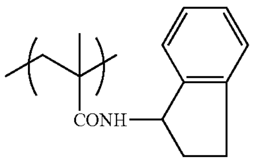

(Am-71)

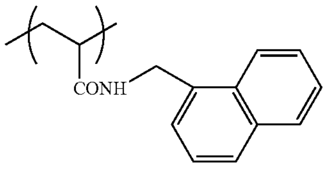

-continued (Am-72)

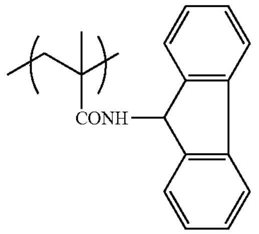

The specific binder polymer for use in the photosensitive layer of the planographic printing plate precursor according to the second aspect of the invention is more preferably a copolymer which comprises a unit represented by the above formula (I), and the aforementioned unit including a radical polymerizable group or the unit including an amide group. Furthermore, the binder polymer is particularly preferably a copolymer which comprises three units, i.e., a unit represented by the above formula (I), the aforementioned unit including a radical polymerizable group and the unit including an amide group.

The molecular weight of the specific binder polymer according to the invention is suitably determined in light of the image forming ability or printing durability. In general, the binder polymer having a higher molecular weight produces more excellent printing durability, however, the image forming ability tends to be deteriorated. In contrast, the binder polymer having a lower molecular weight achieves better image forming ability, however, printing durability becomes poorer. Preferred molecular weight is in a range of from 2,000 to 1,000,000, more preferably from 5,000 to 500,000, and still more preferably from 10,000 to 300,000.

The content of the radical polymerizable group present in the specific binder polymer (content of the radically polymerizable unsaturated double bond detected by iodometric titration) is preferably 0.1 to 10.0 mmol, more preferably 1.0 to 8.0 mmol, and most preferably 2.0 to 7.0 mmol, per g of the binder polymer, from the standpoints of sensitivity and storability.

The content of the alkaline soluble group present in the specific binder polymer (acid value detected by neutralization titration) is preferably 0.1 to 3.0 mmol, more preferably 0.2 to 2.0 mmol, and most preferably 0.3 to 1.5 mmol, per g of the binder polymer, from the standpoints of developing properties and printing durability.

The glass transition point (Tg) of the specific binder polymer is preferably in a range of from 70 to 300° C., more preferably from 80 to 250° C., and most preferably from 90 to 200° C., in light of storability and sensitivity.

The binder polymer for use in the photosensitive layer of the planographic printing plate precursor according to the second aspect of the invention may be used alone, or in combination with one or more other binder polymers. Other binder polymers which may be used in combination are contained in an amount ranging from 1 to 60% by mass, preferably from 1 to 40% by mass, and still more preferably from 1 to 20% by mass, based on a total mass of the binder polymers used. Examples of other binder polymers which may be used in combination include, without any limitation, conventionally known binder polymers. Specifically, a binder having an acrylic backbone-chain, an urethane binder and the like are preferably used, as widely employed in the art.

The total amount of the specific binder polymer and other binder polymers which may be used in combination in the photosensitive layer may appropriately be specified, however, it is usually in a range of from 10 to 90% by mass, preferably from 20 to 80% by mass, and still more preferably from 30 to 70% by mass, relative to a total mass of nonvolatile components present in the photosensitive layer.

<Binder Polymer Contained in the Photosensitive Layer of the Planographic Printing Plate Precursor According to the Third Aspect of the Invention>

As the binder polymer contained in the photosensitive layer of the planographic printing plate precursor according to the third aspect of the invention, any conventionally known binder polymers may be used, without any limitation, insofar as the photosensitive layer has a developing velocity at unexposed areas with respect to an alkaline developer having a pH of 10 to 13.5, of 80 nm/sec or greater, and a permeating velocity of the alkaline developer at exposed areas, of 100 nF/sec or less, when the photosensitive layer is formed using the binder polymer together with an infrared absorbent, a polymerization initiator and a polymerizable compound.

As suitable binder polymers capable of controlling the developing velocity at unexposed areas with respect to the alkaline developer and the permeating velocity of the alkaline developer at exposed areas, the specific binder polymer used in the photosensitive layer of the planographic printing plate precursor according to the second aspect of the invention is preferably employed. Among such specific binder polymers, a copolymer which comprises a unit represented by the above formula (I), and the aforementioned unit having a radical polymerizable group or the unit having an amide group is more preferred. Furthermore, a copolymer which comprises three units, i.e., a unit represented by the above formula (I), the aforementioned unit having a radical polymerizable group and the unit having an amide group is still more preferred.

The binder polymer for use in the photosensitive layer of the planographic printing plate precursor according to the third aspect of the invention may be used alone, or in admixture of two or more kinds thereof.

A total amount (content) of the binder polymer in the photosensitive layer of the planographic printing plate precursor according to the third aspect of the invention may suitably be specified, however, it is usually in a range of from 10 to 90% by mass, preferably from 20 to 80% by mass, and still more preferably from 30 to 70% by mass, relative to a total mass of nonvolatile components present in the photosensitive layer.

Specific examples of the preferable binder polymer for use in the photosensitive layer in the planographic printing plate precursor according to the second and third aspects of the invention are shown below, but the present invention is not limited thereto. These exemplified binder polymers are the specific binder polymers according to the present invention.

1)

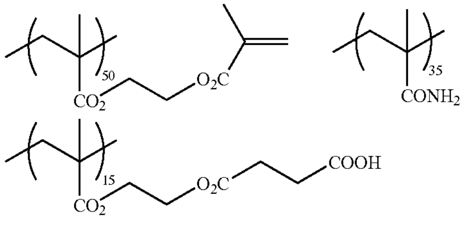

Mw: 100,000

-continued

2)

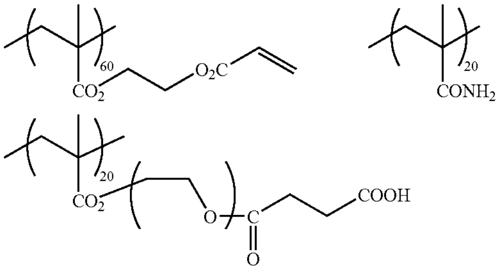

Mw: 120,000

3)

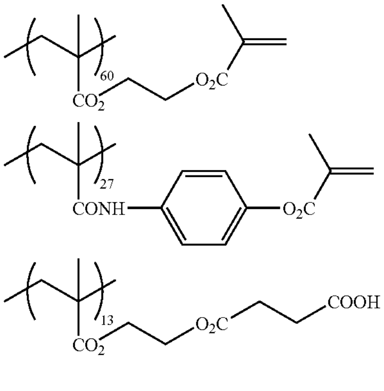

Mw: 100,000

4)

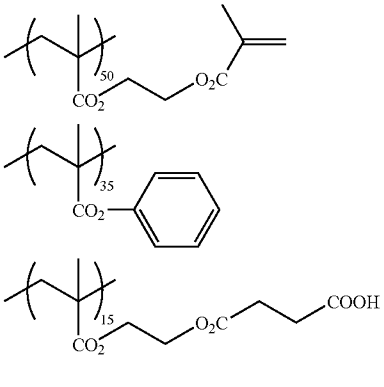

Mw: 150,000

5)

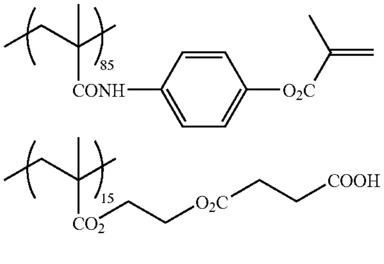

Mw: 90,000

6)

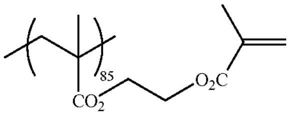

-continued
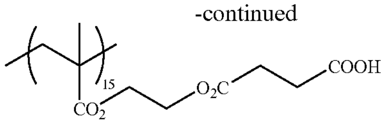
Mw: 110,000
7)
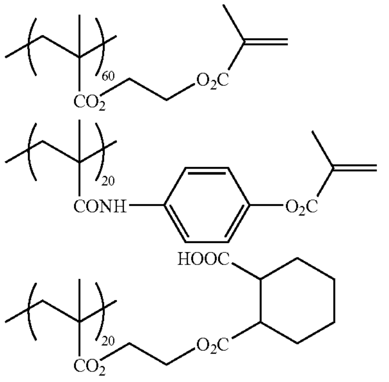
Mw: 120,000
8)
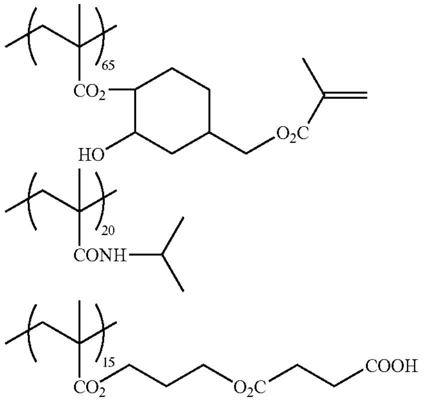
Mw: 110,000
9)
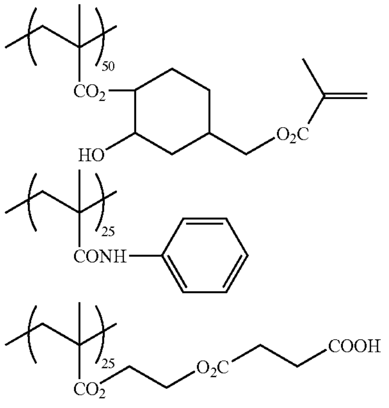
Mw: 150,000
10)
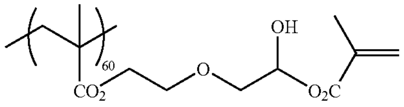
-continued
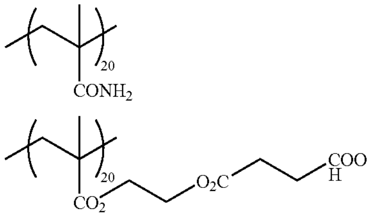
Mw: 90,000
11)
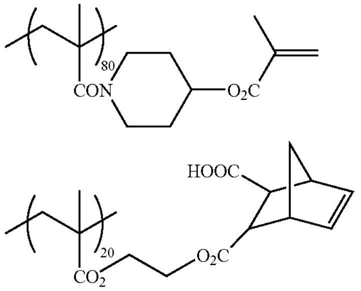
Mw: 100,000
12)
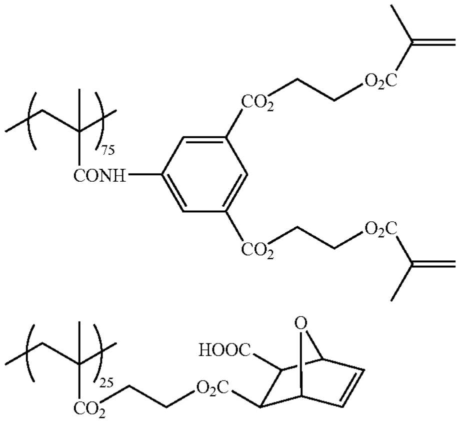
Mw: 120,000
13)
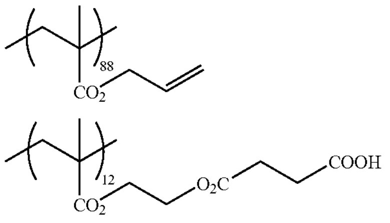
Mw: 130,000
14)
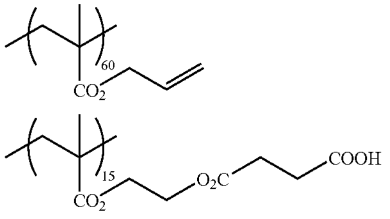

-continued
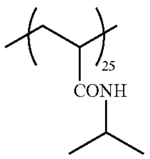
Mw: 110,000
15)
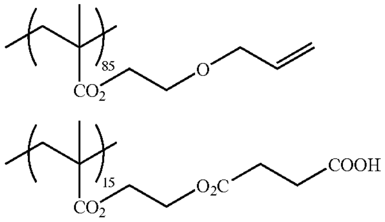
Mw: 120,000
16)
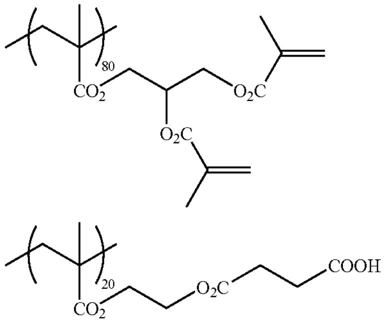
Mw: 95,000
17)
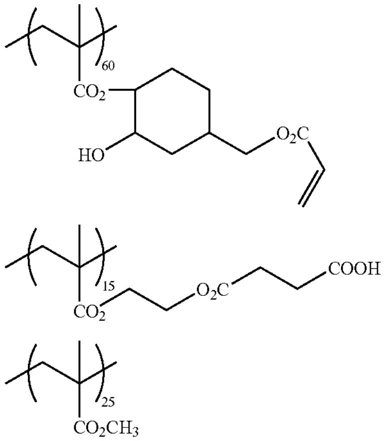
Mw: 150,000
18)
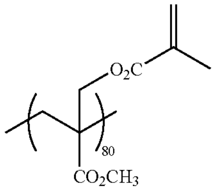
-continued
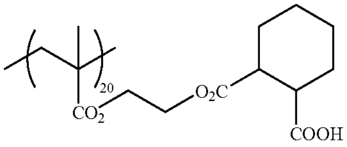
Mw: 160,000
19)
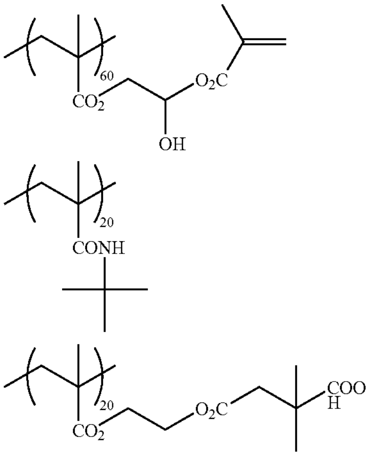
Mw: 100,000
20)
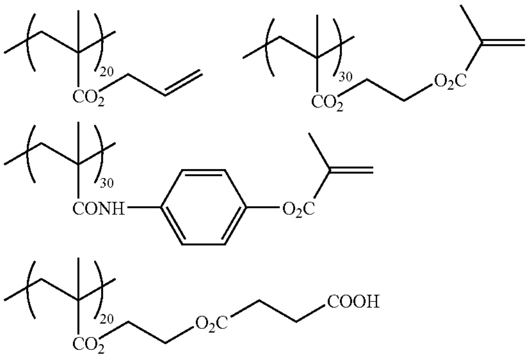
Mw: 150,000
21)
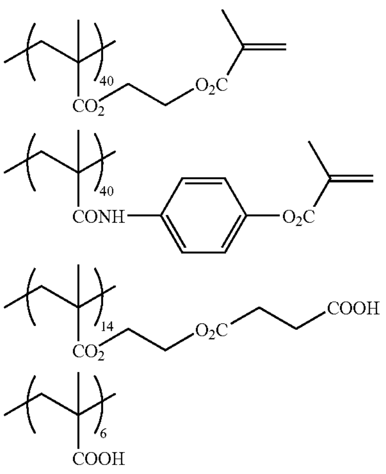
Mw: 100,000

-continued
22)
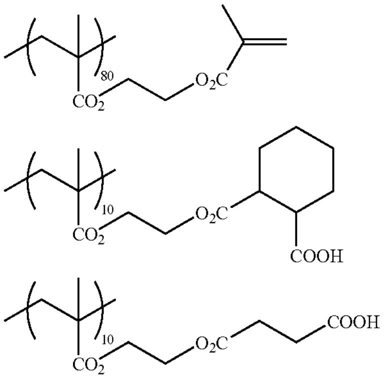
Mw: 120,000
23)
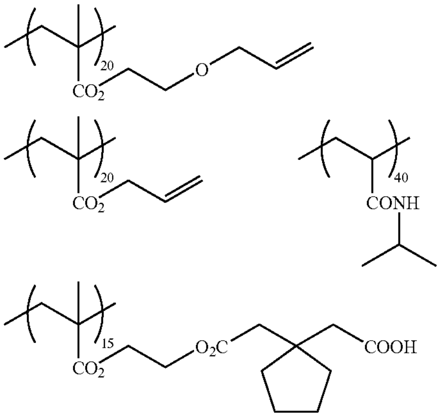
Mw: 180,000
24)
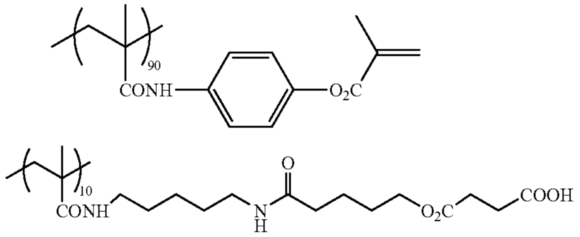
Mw: 120,000
25)
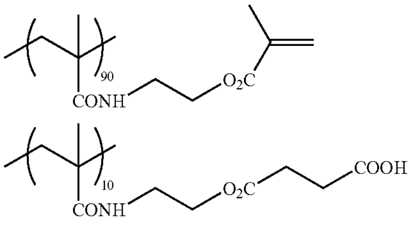
Mw: 130,000
26)
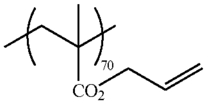
-continued
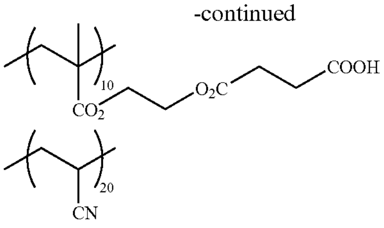
Mw: 120,000
27)
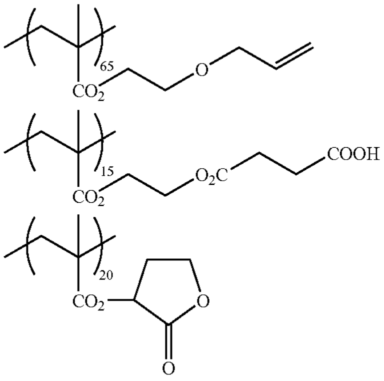
Mw: 100,000
28)
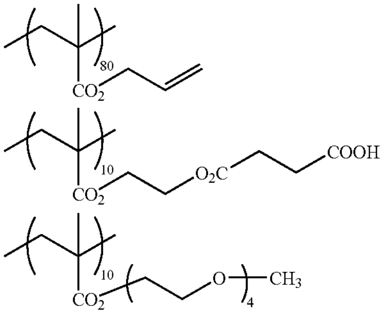
Mw: 80,000
29)
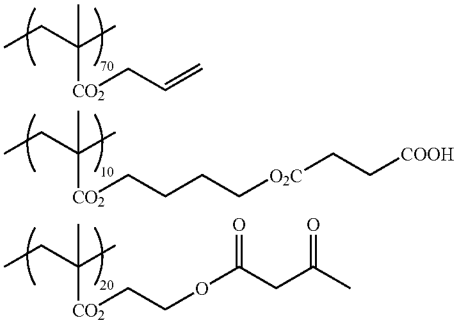
Mw: 110,000
30)
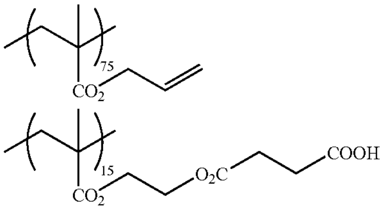

-continued
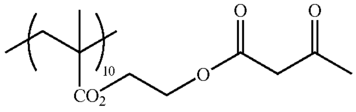
Mw: 100,000
31)
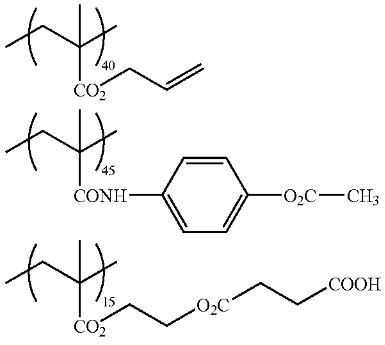
Mw: 120,000
32)
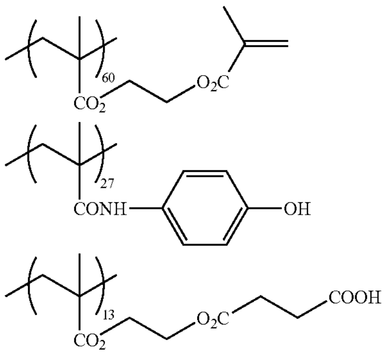
Mw: 120,000
33)
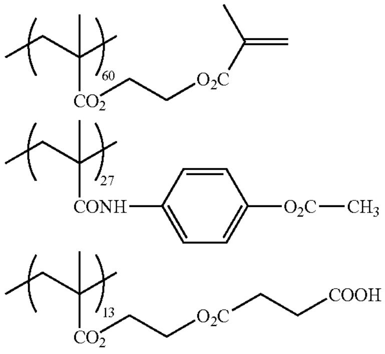
Mw: 140,000
34)
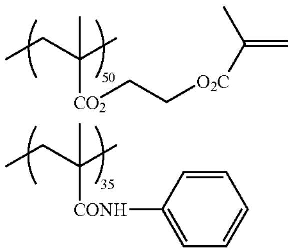
-continued
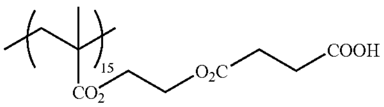
Mw: 100,000
35)
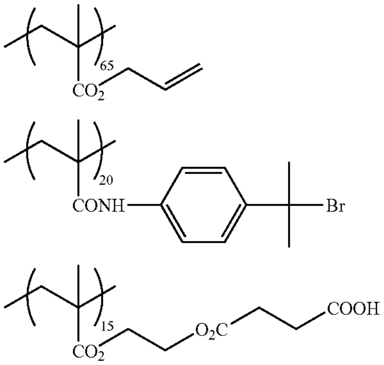
Mw: 150,000
36)
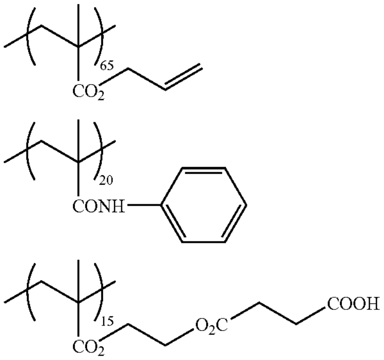
Mw: 100,000
37)
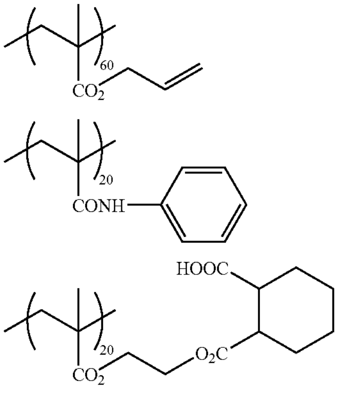
Mw: 100,000
38)
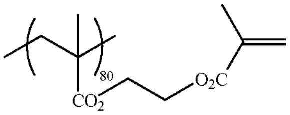

-continued
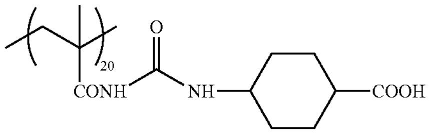
Mw: 100,000
39)
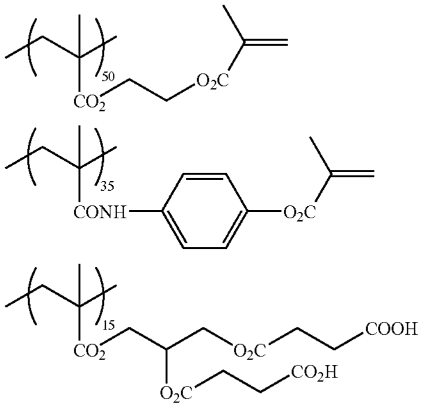
Mw: 120,000
40)
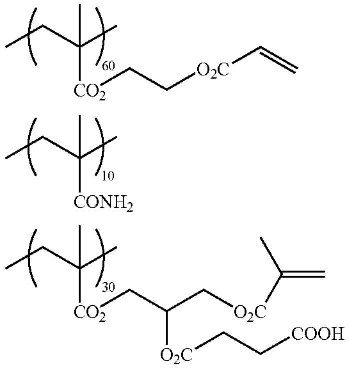
Mw: 90,000
41)
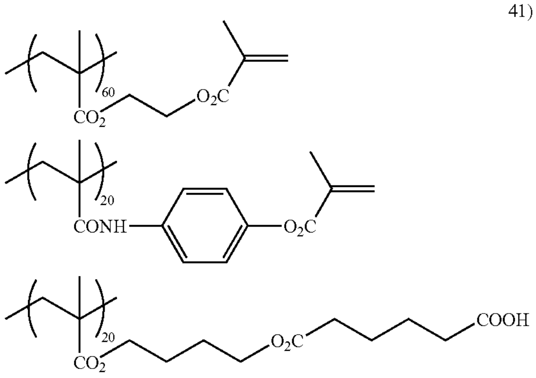
Mw: 110,000
42)
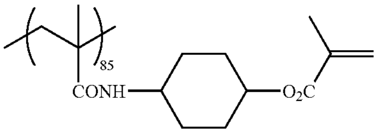
-continued
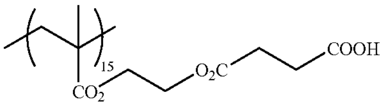
Mw: 100,000
43)
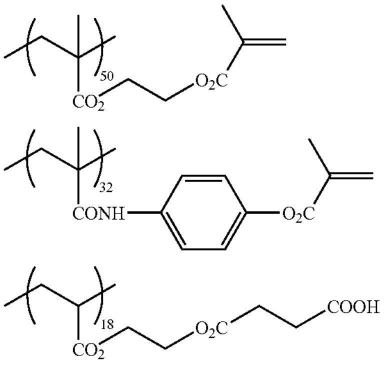
Mw: 80,000
44)
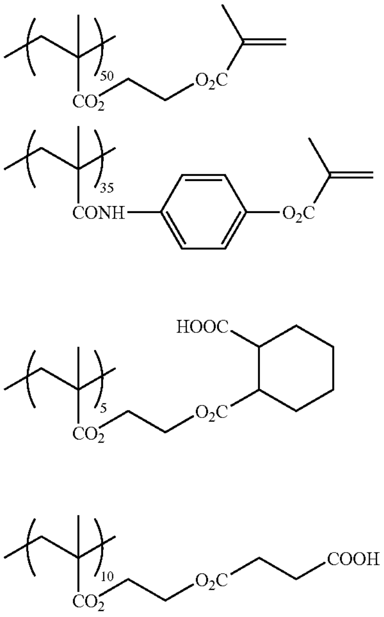
Mw: 120,000
45)
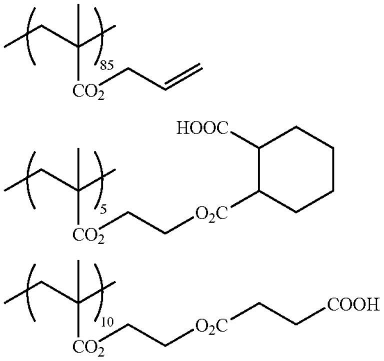
Mw: 160,000

-continued
46)
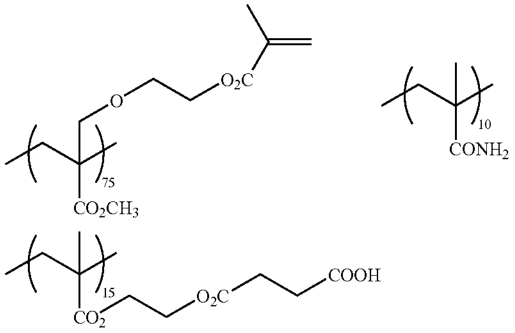
Mw: 100,000
47)
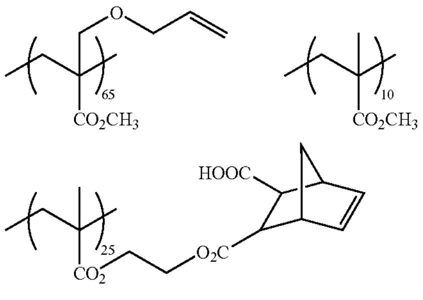
Mw: 180,000
48)
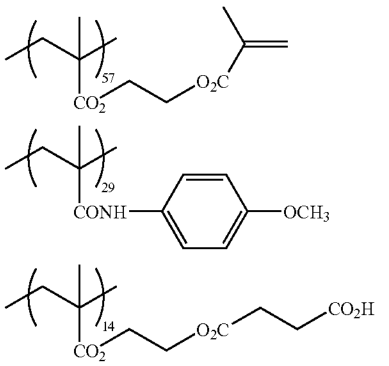
Mw: 100,000
49)
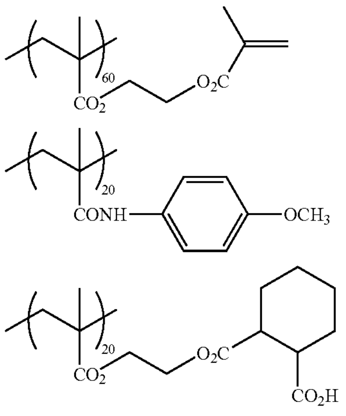
Mw: 120,000
-continued
50)
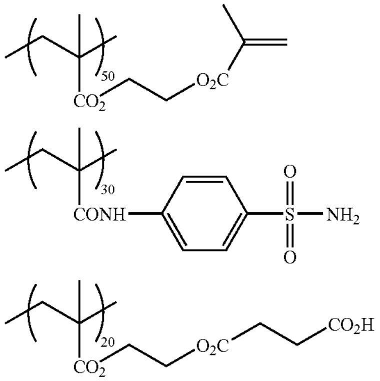
Mw: 90,000
51)
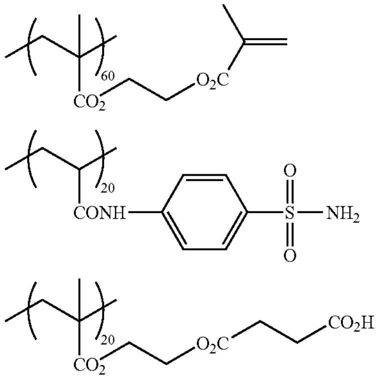
Mw: 110,000
52)
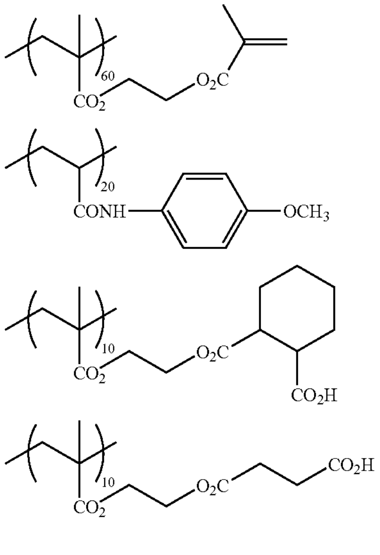
Mw: 120,000
53)
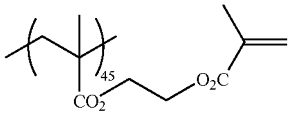

-continued

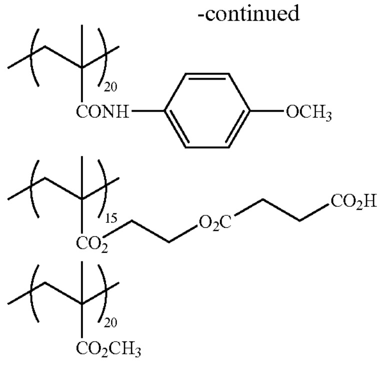

Mw: 100,000

Other Essential Components for Photosensitive Layer

The photosensitive layer of the planographic printing plate according to the invention is a thermally polymerizable negative-type photosensitive layer containing the above-described binder polymer, an infrared absorbent, a polymerization initiator and a polymerizable compound (also referred to as an addition polymerizable compound) as essential components. Such a thermally polymerizable negative-type photosensitive layer has a feature in which the polymerization initiator is decomposed by heat to generate radicals, and then the generated radicals cause a polymerization reaction of the polymerizable compound. Furthermore, the planographic printing plate precursor according to the invention is particularly suitable for direct plate-making by irradiating a laser beam having the wavelength of 300 to 1,200 nm, and exhibits excellent printing durability and image forming ability as compared to the conventional planographic printing plate precursors.

Hereinafter, other essential components than the binder polymer to constitute the photosensitive layer are explained. Further, various additives such as a coloring agent, a plasticizer and a polymerization inhibitor may optionally be added to the photosensitive layer of the planographic printing plate precursor, in addition to the essential components.

Infrared Absorbent

When an image is formed by irradiating planographic printing plate precursor of the invention with an infrared laser emitting radiation in the range of 760 to 1,200 nm, it is essential to use an infrared absorbent. An infrared absorbent has a function of converting the absorbed infrared ray into heat, and the thus generated heat causes thermal decomposition of the polymerization initiator (a radical generating agent) to be described later, to thereby generate radicals. The infrared absorbent used in the invention is a dye or a pigment having the absorption maximum in the wavelength range of from 760 nm to 1,200 nm.

As the dye, any one of commercially available dyes, and known dyes described, for example, in "Senryo Binran (Dye Handbook)" edited by Yuki Gosei Kagaku Kyokai (Organic Synthetic Chemistry Association), published in 1970 may be utilized. Specific examples include dyes such as azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium pigments, pyrylium salts, and metal thiolate complexes.

Examples of the preferred dyes include the cyanine dyes described in JP-A Nos. 58-125246, 59-84356, 59-202829, 60-78787 and the like; the methine dyes described in JP-A Nos. 58-173696, 58-181690, 58-194595 and the like; the naphthoquinone dyes described in JP-A Nos. 58-112793, 58-224793, 59-48187, 59-73996, 60-52940, 60-63744 and the like; the squarylium pigments described in JP-A No. 58-112792, and the like; and the cyanine dyes described in U.K. Patent No. 434,875.

Also, the near infrared absorbing sensitizers described in U.S. Pat. No. 5,156,938 are suitably used, and further, the substituted aryl benzo(thio)pyrylium salts described in U.S. Pat. No. 3,881,924; the trimethyne thiapyrylium salts described in JP-A No. 57-142645 (U.S. Pat. No. 4,327,169); the pyrylium based compounds described in JP-A Nos. 58-181051, 58-220143, 59-41363, 59-84248, 59-84249, 59-146063, 59-146061 and the like; the cyanine dyes described in JP-A No. 59-216146; the pentamethyne thiopyrylium salts described in U.S. Pat. No. 4,283,475; and the pyrylium compounds disclosed in JP-B Nos. 5-13514 and 5-19702 are preferably used. Additional examples of the preferred dye include the near infrared absorbing dyes represented by formulae (I) and (II) in U.S. Pat. No. 4,756,993.

Still further, other preferred examples of the infrared absorbent used in the invention include specific indolenine cyanine pigments described in Japanese Patent Application Nos. 2001-6326 and 2001-237840, as shown below.

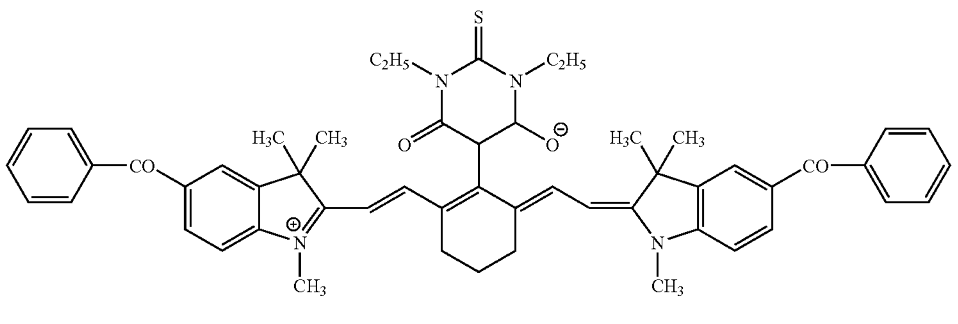

-continued

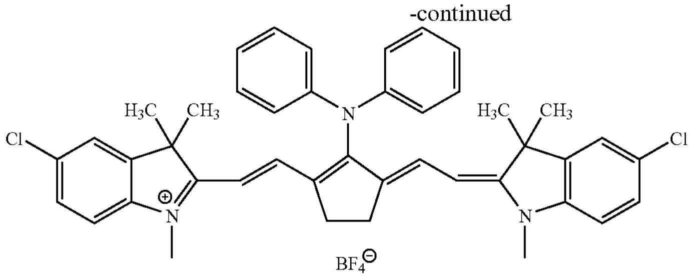

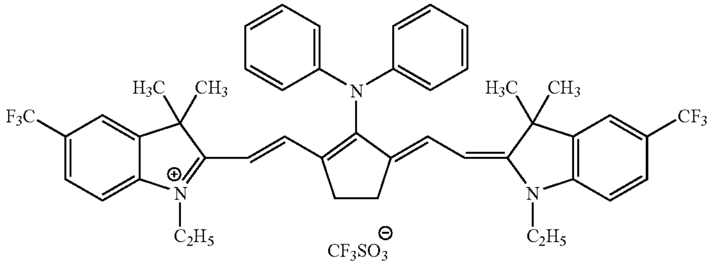

Among these dyes, particularly preferred are cyanine dyes, squarylium dyes, pyrylium salts, nickel thiolate complexes and indolenine cyanine pigments. Cyanine dyes and indolenine cyanine pigments are more preferred. Particularly preferred examples include cyanine dyes represented by the following formulae (a) to (e).

Formula (a)

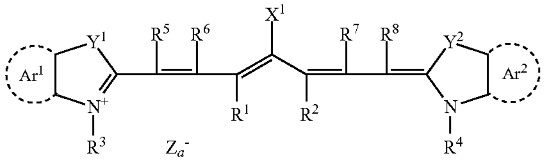

In formula (a), $X^1$ represents a hydrogen atom, a halogen atom, —$NPh_2$, $X^2$—$L^1$ or a group shown below, in which $X^2$ represents an oxygen atom, a nitrogen atom or a sulfur atom; $L^1$ represents a hydrocarbon group having 1 to 12 carbon atoms, an aromatic ring having a hetero atom and a hydrocarbon group having 1 to 12 carbon atoms including a hetero atom. The hetero atom herein represents N, S, O, a halogen atom or Se. $Xa^-$ is the same as defined for $Za^-$ to be described later, and $R^a$ represents a hydrogen atom, a substituent selected from an alkyl group, an aryl group, a substituted or unsubstituted amino group and a halogen atom.

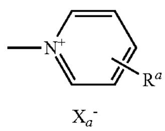

$R^1$ and $R^2$ each independently represent a hydrocarbon group having 1 to 12 carbon atoms. In light of storability of the coating liquid for the photosensitive layer, $R^1$ and $R^2$ are preferably a hydrocarbon group having two or more carbon atoms. Further, it is particularly preferred that $R^1$ and $R^2$ bind with each other to form a 5-membered ring or a 6-membered ring.

$Ar^1$ and $Ar^2$ may be the same or different, and represent an aromatic hydrocarbon group which may have a substituent. Examples of the preferred aromatic hydrocarbon group include a benzene ring and a naphthalene ring. Also, preferred examples of the substituent include a hydrocarbon group having 12 or less carbon atoms, a halogen atom and an alkoxy group having 12 or less carbon atoms. $Y^1$ and $Y^2$ may be the same or different, and represent a sulfur atom or a dialkylmethylene group having 12 or less carbon atoms. $R^3$ and $R^4$ may be the same or different, and represent a hydrocarbon group, which may have a substituent, having 20 or less carbon atoms. Examples of the preferred substituent include an alkoxy group having 12 or less carbon atoms, a carboxyl group and a sulfo group. $R^5$, $R^6$, $R^7$ and $R^8$ may be the same or different, and represent a hydrogen atom or a hydrocarbon group having 12 or less carbon atoms. In light of availability of raw materials, they are preferably a hydrogen atom. $Za^-$ represents a counter anion. However, $Za^-$ is not necessary if the cyanine pigment represented by formula (a) has an anionic substituent in its structure, which obviates need for neutralization of charges. Examples of preferred $Za^-$ include a halogen ion, a perchlorate ion, a tetrafluoro borate ion, a hexafluorophosphate ion and a sulfonate ion, in view of storability of the coating liquid for the photosensitive layer. Particularly preferred examples thereof include a perchlorate ion, a hexafluorophosphateate ion and an arylsulfonate ion.

Specific examples of the cyanine pigment represented by formula (a) suitably for use in the invention include those described in Japanese Patent Application No. 11-310623, paragraphs [0017] to [0019], Japanese Patent Application No. 2000-224031, paragraphs [0012] to [0038] and Japanese Patent Application No. 2000-211147, paragraphs [0012] to [0023], in addition to those shown below.

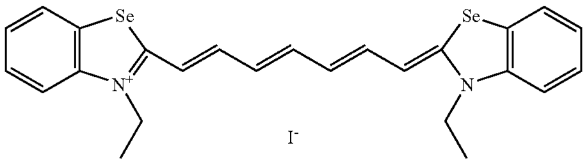
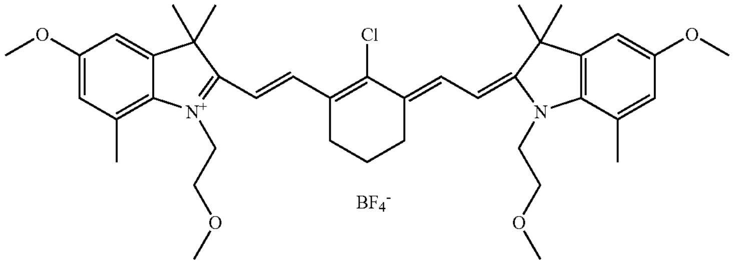
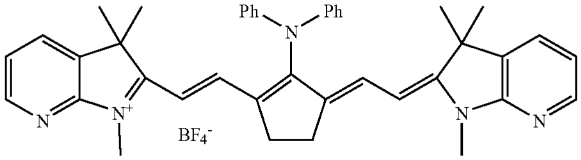
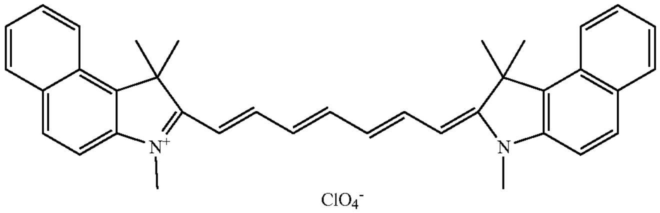
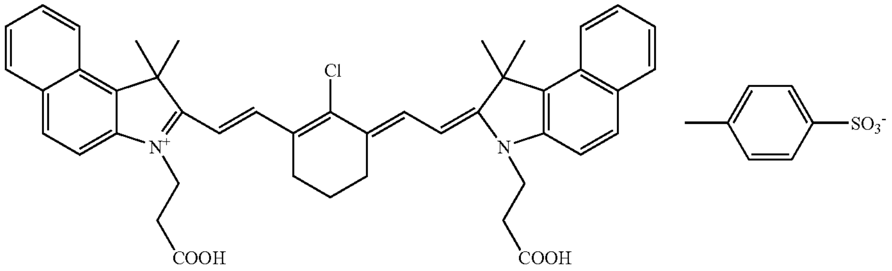
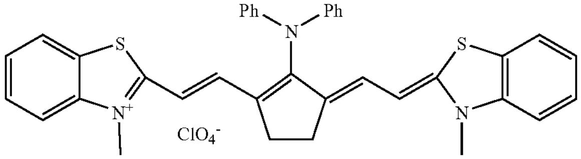
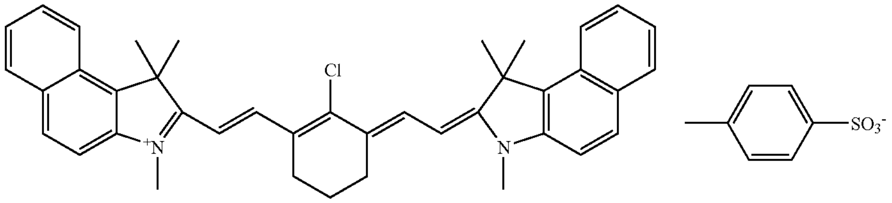
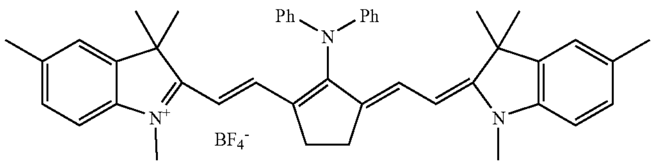

-continued
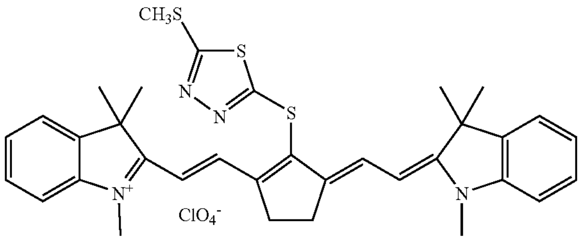
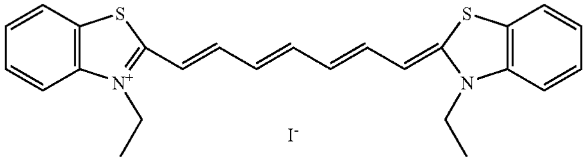
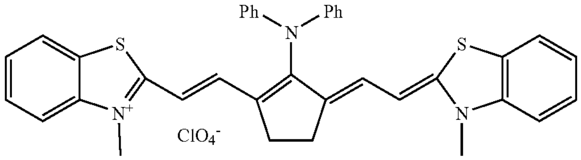
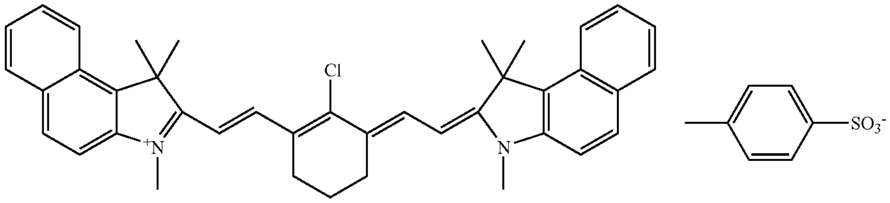
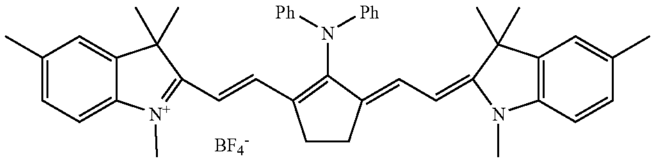
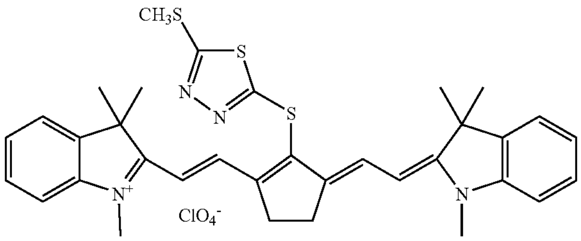
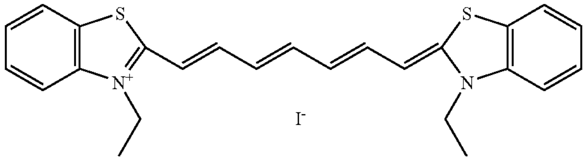
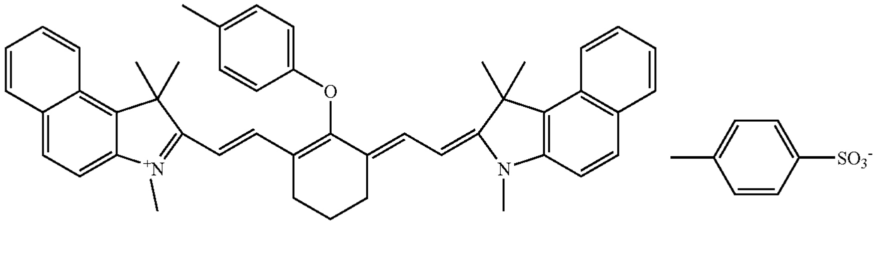

-continued

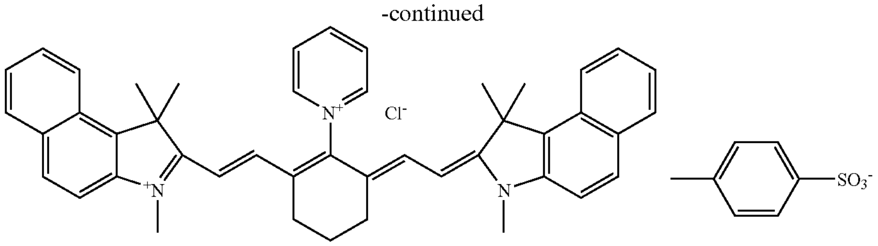

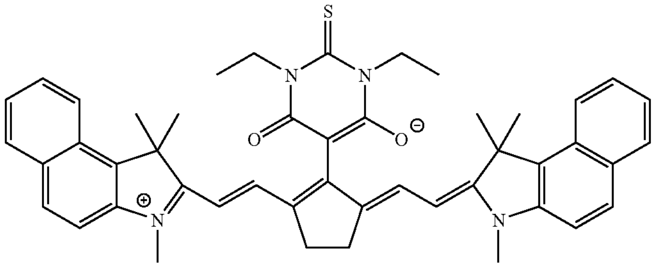

Formula (b)

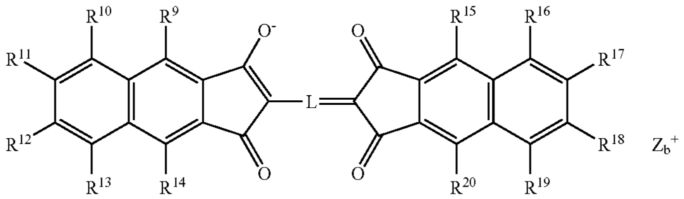

In the above formula (b), L represents a methine chain having 7 or more conjugated carbon atoms. The methine chain may have a substituent, and the substituents may bind with each other to form a cyclic structure. $Zb^+$ represents a counter cation. Examples of the preferred counter cation include ammonium, iodonium, sulfonium, phosphonium, pyridinium, alkali metal cation ($Ni^+$, $K^+$, $Li^+$) and the like. $R^9$ to $R^{14}$ and $R^{15}$ to $R^{20}$ each independently represent a hydrogen atom or a substituent selected from a halogen atom, a cyano group, an alkyl group, an aryl group, an alkenyl group, an alkynyl group, a carbonyl group, a thio group, a sulfonyl group, a sulfinyl group, an oxy group or an amino group, or a substituent which is formed by combining two or three thereof and further may form a cyclic structure through binding with each other. Specifically, the dyes represented by the above formula (b), wherein L represents a methine chain having 7 conjugated carbon atoms and $R^9$ to $R^{14}$ and $R^{15}$ to $R^{20}$ all represent a hydrogen atom, are preferred in light of readily availability and effects.

Specific examples of the dye represented by formula (b) suitably for use in the invention include those shown below.

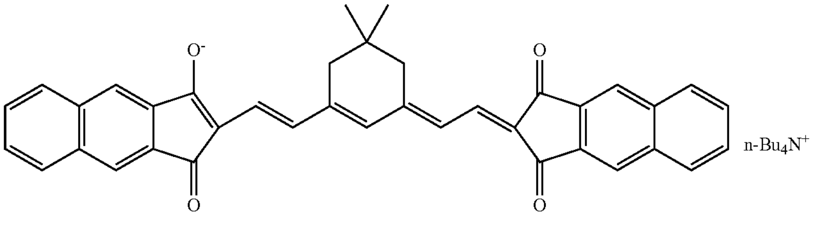

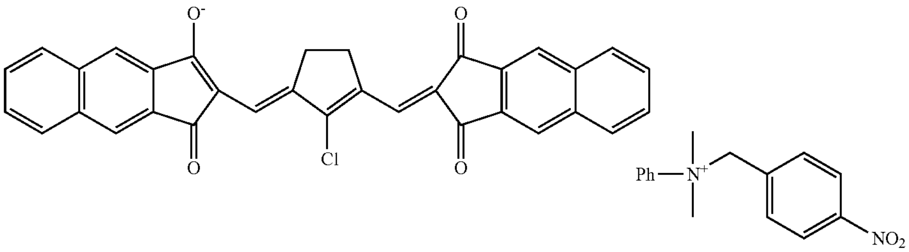

-continued

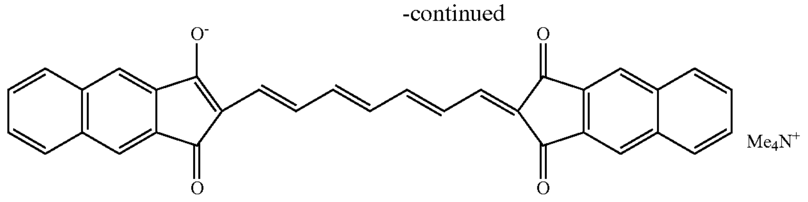

Formula (c)

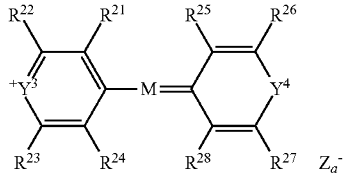

In the above formula (c), $Y^3$ and $Y^4$ each represent an oxygen atom, a sulfur atom, a selenium atom, or a tellurium atom. M represents a methine chain having 5 or more conjugated carbon atoms. $R^{21}$ to $R^{24}$ and $R^{25}$ to $R^{28}$ may be the same or different, and represent a hydrogen atom, a halogen atom, a cyano group, an alkyl group, an aryl group, an alkenyl group, an alkynyl group, a carbonyl group, a thio group, a sulfonyl group, a sulfinyl group, an oxy group, or an amino group. Further, in formula (c), $Za^-$ represents a counter anion, which is the same as defined for $Za^-$ in the above formula (a).

Specific examples of the dye represented by formula (c) suitably for use in the invention include those shown below.

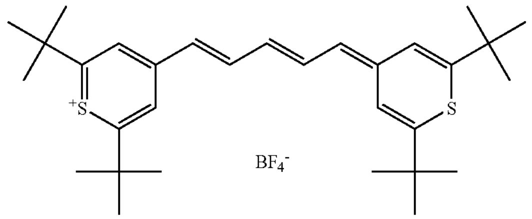

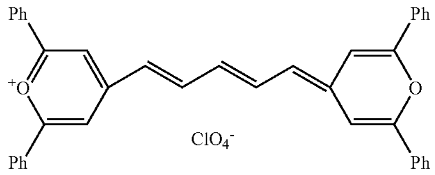

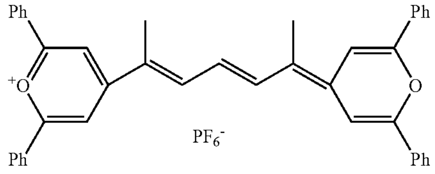

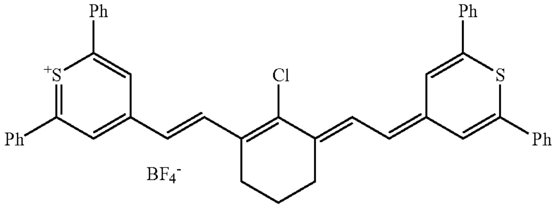

-continued

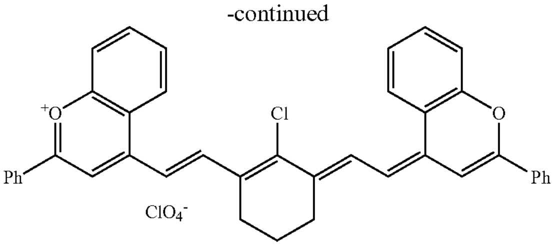

Formula (d)

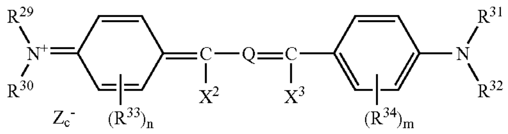

In the above formula (d), $R^{29}$ to $R^{31}$ each independently represent a hydrogen atom, an alkyl group, or an aryl group. $R^{33}$ and $R^{34}$ each independently represent an alkyl group, a substituted oxy group, or a halogen atom. n and m each independently represent an integer of from 0 to 4. $R^{29}$ and $R^{30}$, or $R^{31}$ and $R^{32}$ may bind to each other to form a ring, or alternatively, $R^{29}$ and/or $R^{30}$ may bind with $R^{33}$, or $R^{31}$ and/or $R^{32}$ may bind with $R^{34}$ to form a ring. Also, when there exist plural number of $R^{33}$ or $R^{34}$, those $R^{33}$s or $R^{34}$s may bind with each other to form a ring. $X^2$ and $X^3$ each independently represent a hydrogen atom, an alkyl group, or an aryl group, and at least one of the $X^2$ and $X^3$ represents a hydrogen atom or an alkyl group. Q is a trimethine group or a pentamethine group which may have a substituent, and may form a cyclic structure together with a bivalent organic group. $Zc^-$ represents a counter anion, which is the same as defined for $Za^-$ in the above formula (a).

Specific examples of the dye represented by formula (d) suitably for use in the invention include those shown below.

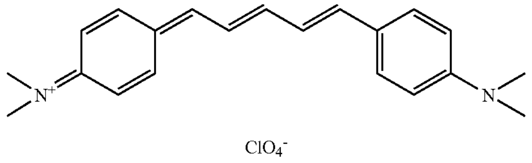

-continued

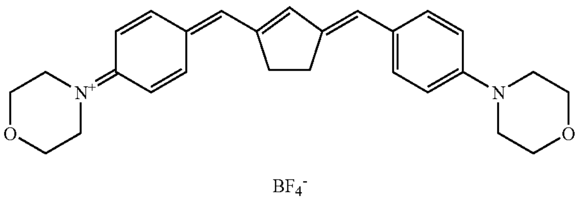

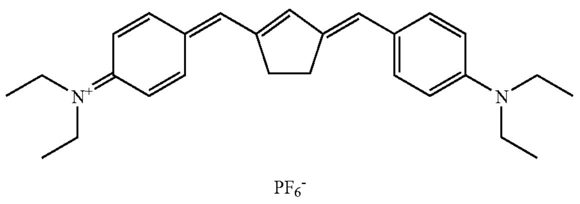

Formula (e)

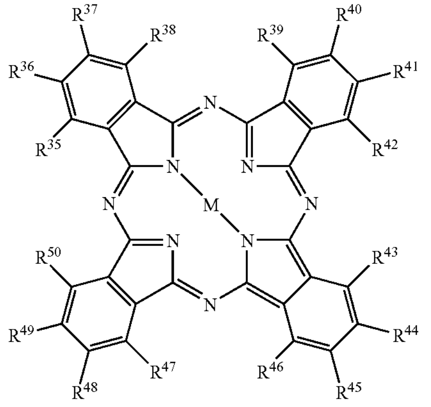

In the above formula (e), $R^{35}$ to $R^{50}$ each independently represent a hydrogen atom, a halogen atom, a cyano group, an alkyl group, an aryl group, an alkenyl group, an alkynyl group, a hydroxyl group, a carbonyl group, a thio group, a sulfonyl group, a sulfinyl group, an oxy group, an amino group or an onium salt structure, which may have a substituent. Although M represents two hydrogen atoms or metal atoms, a halometal group, or an oxymetal group, examples of the metal atom included therein involve atoms in the IA, IIA, IIIB and IVB groups of the Periodic Table, transition metals in the first, the second and the third periods, a lanthanoid element. Among them, copper, magnesium, iron, zinc, cobalt, aluminum, titanium and vanadium are preferred.

Specific examples of the dye represented by formula (e) suitably for use in the invention include those shown below.

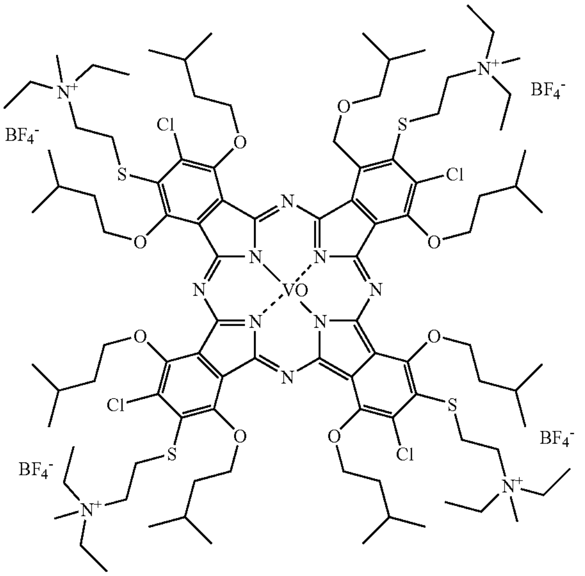

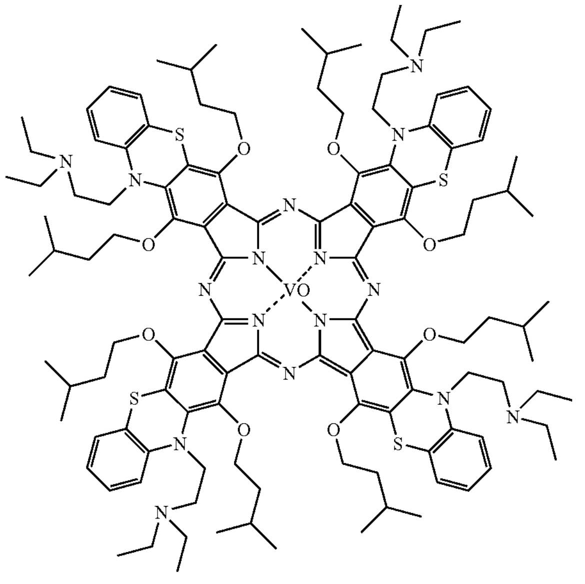

As the pigment used in the invention, commercially available pigments and the pigments described in Color Index (C.I.) Binran (Manual), "Saishin Ganryo Binran (Modern Pigment Manual)", edited by Nippon Ganryo Gijutsu Kyokai (Japan Pigment Technology Association), published in 1977, "Saishin Ganryo Oyo Gijutsu (Modern Pigment Application Technology)", by CMC Press, published in 1986, and "Insatsu Ink Gijutsu (Printing Ink Technology)" by CMC Press, published in 1984 can be utilized.

Examples of the kinds of the pigments include black pigments, yellow pigments, orange pigments, brown pigments, red pigments, purple pigments, blue pigments, green pigments, fluorescent pigments, metal powder pigments, as well as polymer bound dyes. Specific examples of the pigment include insoluble azo pigments, azo lake pigments, condensed azo pigments, chelate azo pigments, phthalocyanine based pigments, anthraquinone based pigments, perylene based and perynone based pigments, thioindigo based pigments, quinacridone based pigments, dioxazine based pigments, isoindolinone based pigments, quinophthalone based pigments, dyeing lake pigments, azine pigments, nitroso pigments, nitro pigments, natural pigments, fluorescent pigments, inorganic pigments, carbon black and the like. Among these pigments, carbon black is preferred.

These pigments may be used without being subjected to surface treatment, or alternatively, after being subjected to surface treatment. Examples of surface treatment include surface coating of a resin or a wax, a method of applying a surface active agent, a method of binding a reactive substance (e.g., a silane coupling agent, an epoxy compound, polyisocyanate) to the pigment surfaces, and the like. The above-described surface treatment methods are described in "Kinzoku Sekken no Seishitsu to Oyo (Nature and Applications of Metal Soaps)" by Sachi Press, "Insatsu Ink Gijutsu (Printing Ink Technology)" by CMC Press, published in 1984, and "Saishin Ganryo Oyo Gijutsu (Modern Pigment Application Technology)", by CMC Press, published in 1986.

The particle sizes of the pigment are preferably in a range of from 0.01 μm to 10 μm, more preferably in a range of from 0.05 μm to 1 μm, and particularly preferably in a range of from 0.1 μm to 1 μm, in light of storability of the coating liquid and uniformity of the photosensitive layer.

As a method of dispersing the pigment, conventionally known dispersion techniques used for an ink production or a toner production may be used. Examples of the dispersing machine include ultrasonic dispersing machines, sand mills, attritors, pearl mills, super mills, ball mills, impellers, dispersers, KD mills, colloid mills, dynatrons, triple roll mills, press kneaders and the like. The details thereof are described in "Saishin Ganryo Oyo Gijutsu (Modern Pigment Application Technology)", by CMC Press, published in 1986.

The infrared absorbent may be added to the identical layer in which other components are present, or alternatively, a different layer may be provided such that the infrared absorbent would be included therein. The infrared absorbent should be included such that the absorbance of the photosensitive layer at the absorption maximum in the range of the wavelength of from 760 nm to 1,200 nm falls within a range of from 0.5 to 1.2, through a reflection measurement, when producing a negative-type planographic printing plate precursor. In this instance, the preferred range of the absorbance is from 0.6 to 1.15. When the absorbance is outside this range, strength of the image areas is lowered and the number of printed sheets is reduced. Although the reasons therefor have not yet been elucidated, it is presumed that when the absorbance is less than 0.5, the photosensitive layer cannot sufficiently absorb the irradiated infrared rays, and as a result, the radical polymerization of the entire photosensitive layer does not sufficiently proceed. It is also presumed that when the absorbance is greater than 1.2, only the outermost surface of the photosensitive layer absorbs the infrared ray and the infrared ray does not reach the vicinity of the support, and as a result, the radical polymerization does not occur in the vicinity of the support, whereby the adhesiveness between the support and the photosensitive layer becomes insufficient.

The absorbance of the photosensitive layer may be controlled by the amount of the infrared absorbent added to the photosensitive layer and the thickness of the photosensitive layer. The measurement of the absorbance may be carried out by an ordinary method. Examples of the measurement method include a method in which a photosensitive layer is formed by applying a coating liquid in an amount to provide a suitable thickness in a range required for a planographic printing plate on a reflective support such as aluminum, followed by measuring the reflected density using an optical densitometer; and a method of measuring the absorbance by an optical densitometer in accordance with a reflection method using an integrating sphere.

Polymerization Initiator

As the polymerization initiator for use in the invention to initiate and proceed the curing reaction of the polymerizable compounds to be described below, the radical generating agents of thermally decomposing type are useful which are decomposed by heat to generate a radical. When such a radical generating agent is used in combination with the aforementioned infrared absorbent, the infrared absorbent generates heat upon irradiation with an infrared laser, thus leading to generation of a radical. Such a combination makes it possible to carry out recording.

Examples of the radical generating agent include onium salts, triazine compounds having a trihalomethyl group, peroxides, azo based polymerization initiators, azide compounds, quinone diazide, oxime ester compounds, triarylmonoalkyl borate compounds and the like. Onium salts or oxime ester compounds are preferred because of high sensitivity. Onium salts which may be suitably used as a polymerization initiator according to the invention are explained below. Examples of the preferred onium salt include iodonium salts, diazonium salts and sulfonium salts. According to the invention, these onium salts do not act as an acid generating agent, but functions as the radical polymerization initiator. Examples of the onium salt suitably for use in the invention include the onium salts represented by the following formulae (III) to (V).

$$Ar^{11}—I^{+}—Ar^{12} \quad (Z^{11})^{-} \qquad \text{(III)}$$

$$Ar^{21}—N^{+}\equiv N \quad (Z^{21})^{-} \qquad \text{(IV)}$$

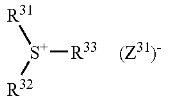

(V)

In formula (III), $Ar^{11}$ and $Ar^{12}$ each independently represent an aryl group, which may have a substituent, having 20 or less carbon atoms. Examples of the preferred substituent, when the aryl group has a substituent, include a halogen atom, a nitro group, an alkyl group having 12 or less carbon atoms, an alkoxy group having 12 or less carbon atoms, or an aryloxy group having 12 or less carbon atoms. $Z^{11-}$ represents a counter ion selected from the group consisting of a halogen ion, a perchlorate ion, a tetrafluoroborate ion, a hexafluorophosphate ion, a carboxylate ion and a sulfonate ion. Preferable examples thereof include perchlorate ion, a hexafluorophosphate ion, a carboxylate ion and an arylsulfonate ion.

In formula (IV), $Ar^{21}$ represents an aryl group, which may have a substituent, having 20 or less carbon atoms. Examples of the preferred substituent include a halogen atom, a nitro group, an alkyl group having 12 or less carbon atoms, an alkoxy group having 12 or less carbon atoms, an aryloxy group having 12 or less carbon atoms, an alkylamino group having 12 or less carbon atoms, a dialkylamino group having 12 or less carbon atoms, an arylamino group having 12 or less carbon atoms, or a diarylamino group having 12 or less carbon atoms. $Z^{21-}$ represents the same counter ion as defined for $Z^{11-}$.

In formula (V), $R^{31}$, $R^{32}$ and $R^{33}$ may be the same or different, and represent a hydrocarbon group, which may have a substituent, having 20 or less carbon atoms. Examples of the preferred substituent include a halogen atom, a nitro group, an alkyl group having 12 or less carbon atoms, an alkoxy group having 12 or less carbon atoms, an aryloxy group having 12 or less carbon atoms. $Z^{31-}$ represents the same counter ion as defined for $Z^{11-}$.

Specific examples of the onium salt suitably for use as the polymerization initiator (radical generating agent) in the invention include those described in JP-A No. 2001-133696, and the like. Specific examples of the onium salt represented by formula (III) ([OI-1] to [OI-10]), the onium salts represented by formula (IV) ([ON-1] to [ON-5]), and the onium salts represented by formula (V) ([OS-1] to [OS-7]) suitably for use in the invention are shown below, but the present invention is not limited thereto.

[OI-1]

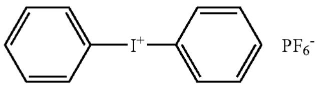

[OI-2]

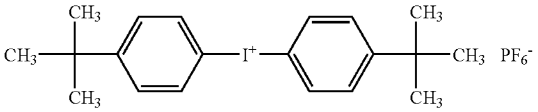

[OI-3]

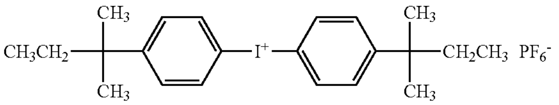

[OI-4]

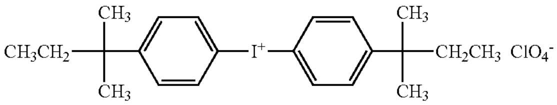

[OI-5]

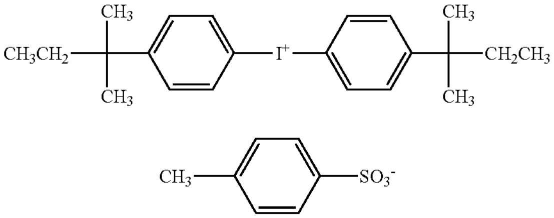

[OI-6]

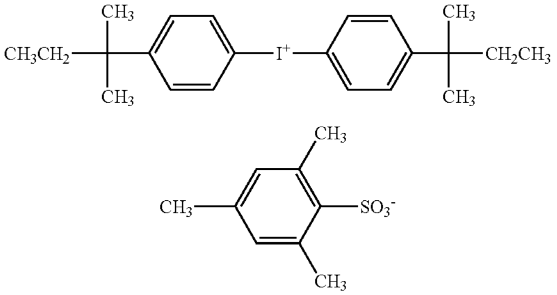

[OI-7]

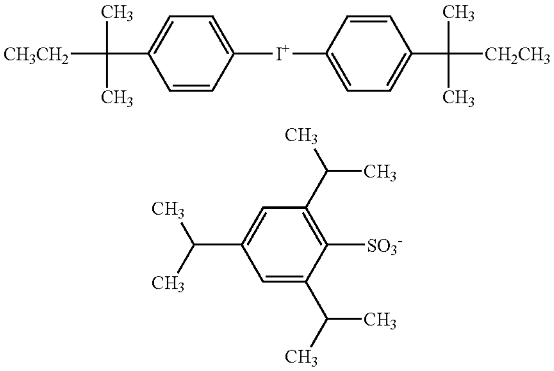

[OI-8]

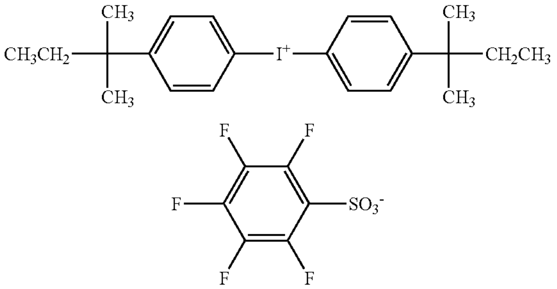

[OI-9]

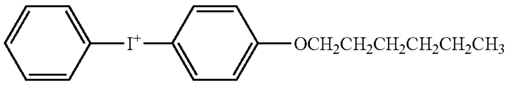

[OI-10]

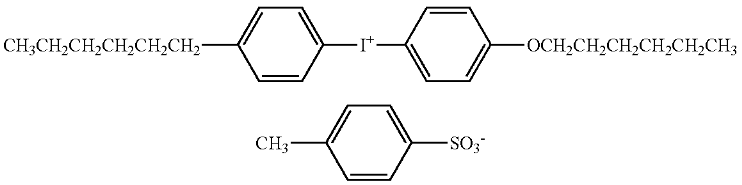

-continued
[ON-1]
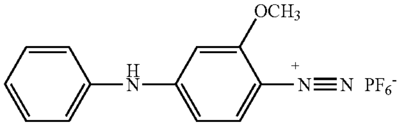
[ON-2]
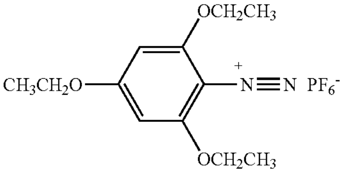
[ON-3]
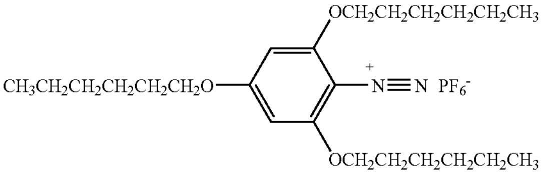
[ON-4]
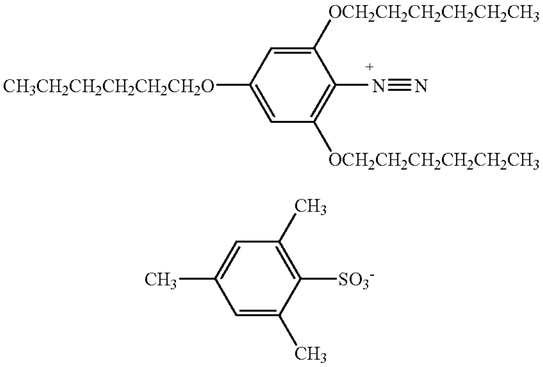
[ON-5]
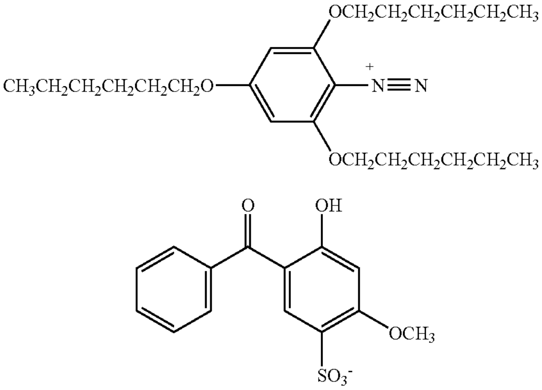
[OS-1]
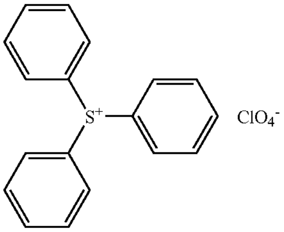
[OS-2]
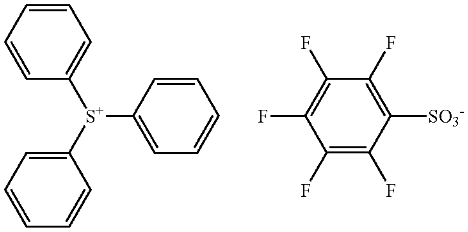
[OS-3]
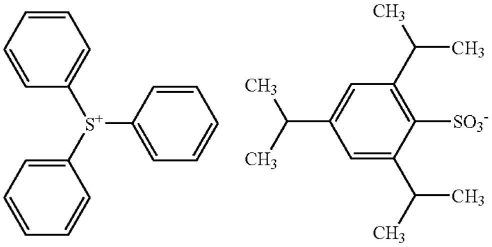
[OS-4]
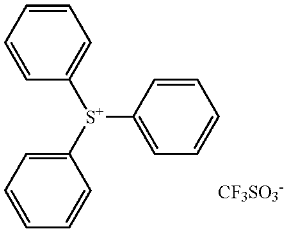
[OS-5]
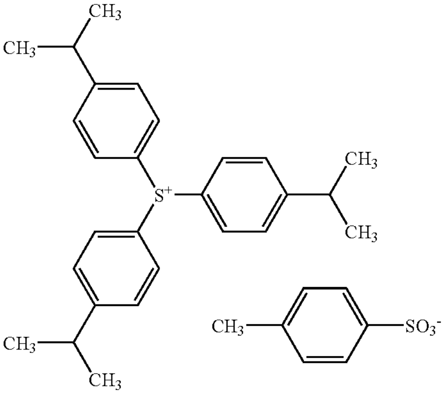

-continued

[OS-6]

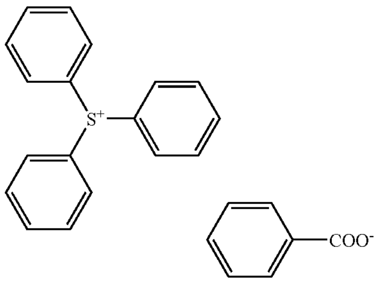

[OS-7]

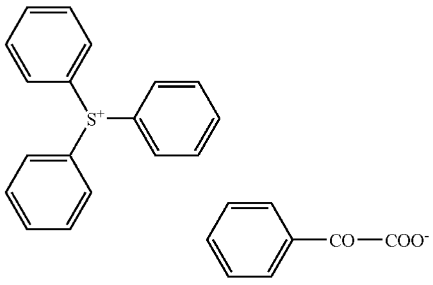

The polymerization initiator used in the invention has the absorption maximum wavelength of preferably 400 nm or less, and more preferably 360 nm or less. If the absorption wavelength is specified in the ultraviolet region, the planographic printing plate precursor can be handled under white light.

As additional preferred polymerization initiators, specific aromatic sulfonium salts described in Japanese Patent Application Nos. 2000-266797, 2001-177150, 2000-160323 and 2000-184603 are mentioned. Representative compounds thereof are shown below.

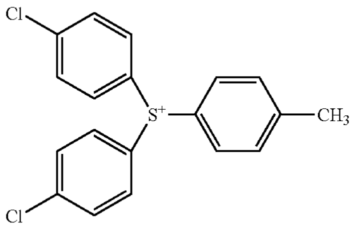

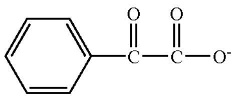

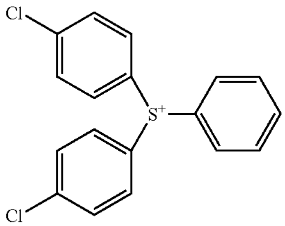

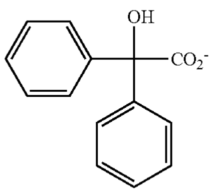

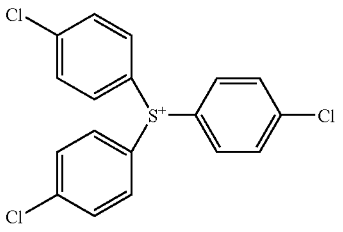

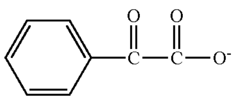

-continued

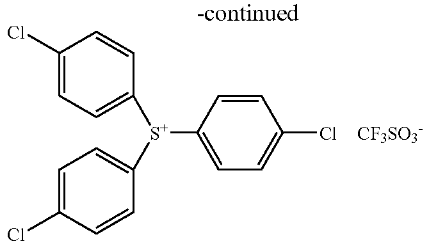

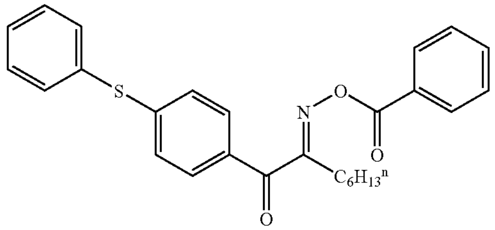

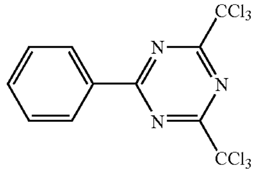

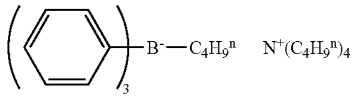

Furthermore, other examples of preferred polymerization initiators, which are applicable to the invention, are shown below.

Further, oxime ester compounds which may suitably be used as a polymerization initiator in the invention are explained below. Examples of preferred oxime ester compounds include those represented by the following formula (i).

Formula (i)

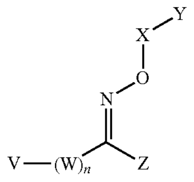

In formula (i), X represents a carbonyl group, a sulfone group or a sulfoxide group; Y represents a cyclic or chain alkyl group having 1 to 12 carbon atoms, an alkenyl group, an alkynyl group, an aryl group having 6 to 18 carbon atoms and a heterocyclic group. The aryl group is an aromatic hydrocarbon compound such as a benzene ring, a naphthalene ring, an anthracene ring, a phenanthrene group, a pyrene group or a triphenylene group. The heterocycle is an aromatic compound having at least one nitrogen atom, sulfur atom, or oxygen atom in the ring structure, and examples thereof include compounds such as a pyrrole group, a furan group, a thiophene group, a selenophene group, a pyrazole group, an imidazole group, a triazole group, a tetrazole group, an oxazole group, a thiazole group, an indole group, a benzofuran group, benzimidazole group, a benzoxazole group, a benzothiazole group, a pyridine group, a pyrimidine group, a pyrazine group, a triazine group, a quinoline group, a carbazole group, an acridine group, phenoxazine and phenothiazine. The substituent represented by Y may be substituted by a halogen atom, a hydroxyl group, a nitrile group, a nitro group, a carboxyl group, an aldehyde group, an alkyl group, a thiol group or an aryl group, or a compound including an alkenyl group, an alkynyl group, an ether group, an ester group, an urea group, an amino group, an amide group, a sulfide group, a disulfide group, a sulfoxide group, a sulfo group, a sulfone group, a hydrazine group, a carbonyl group, an imino group, a halogen atom, a hydroxyl group, a nitrile group, a nitro group, a carboxyl group, a carbonyl group, an urethane group, an alkyl group, a thiol group, an aryl group, a phosphoroso group, a phospho group or a carbonylether group.

Z in formula (i) is the same as defined for Y, or a nitrile group, a halogen atom, a hydrogen atom, or an amino group. Such a compound represented by Z may be substituted by a halogen atom, a hydroxyl group, a nitrile group, a nitro group, a carboxyl group, an aldehyde group, an alkyl group, a thiol group or an aryl group, or a compound including an alkenyl group, an alkynyl group, an ether group, an ester group, an urea group, an amino group, an amide group, a sulfide group, a disulfide group, a sulfoxide group, a sulfo group, a sulfone group, a hydrazine group, a carbonyl group, an imino group, a halogen atom, a hydroxyl group, a nitrile group, a nitro group, a carboxyl group, a carbonyl group, an urethane group, an alkyl group, a thiol group, an aryl group, a phosphoroso group, phospho group or a carbonyl ether group.

W in formula (i) represents a bivalent organic group, and may represent a methylene group, a carbonyl group, a sulfoxide group, a sulfone group or an imino group. The methylene group and imino group may be substituted by a compound including an alkyl group, an aryl group, an ester group, a nitrile group, a carbonylether group, a sulfo group, a sulfoether group or an ether group. In the above formula, n represents an integer of 0 or 1.

V in formula (i) may be a cyclic or chain alkyl, alkenyl, alkynyl group having 1 to 12 carbon atoms or, an aryl, alkoxy or aryloxy group having 6 to 18 carbon atoms. Examples of the aryl group include aromatic hydrocarbon compounds such as a benzene ring, a naphthalene ring, an anthracene ring, a phenanthrene group, a pyrene group and a triphenylene group, hetero atom-containing aromatic compounds such as a pyrrole group, a furan group, a thiophene group, a selenophene group, a pyrazole group, an imidazole group, a triazole group, a tetrazole group, an oxazole group, a thiazole group, an indole group, a benzofuran group, a benzimidazole group, a benzoxazole group, a benzothiazole group, a pyridine group, a pyrimidine group, a pyrazine group, a triazine group, a quinoline group, a carbazole group and an acridine group, phenoxazine and phenothiazine. Such a compound represented by V may be substituted by a halogen atom, a hydroxyl group, a nitrile group, a nitro group, a carboxyl group, an aldehyde group, an alkyl group, a thiol group or an aryl group, or a compound including an alkenyl group, an alkynyl group, an ether group, an ester group, an urea group, an amino group, an amide group, a sulfide group, a disulfide group, a sulfoxide group, a sulfo group, a sulfone group, a hydrazine group, a carbonyl group, an imino group, a halogen atom, a hydroxyl group, a nitrile group, a nitro group, a carboxyl group, a carbonyl group, an urethane group, an alkyl group, a thiol group, an aryl group, a phosphoroso group, a phospho group or a carbonylether group.

V and Z may bind with each other to form a ring.

In the oxime ester compound represented by the above formula (i), it is preferred that X is a carbonyl, Y is an aryl group or a benzoyl group, a Z group is an alkyl group or an aryl group, W is a carbonyl group, and V is an aryl group, in light of sensitivity. More preferably, the aryl group represented by V has a thioether substituent group.

Incidentally, the structure of the N—O bond in the above formula (i) may be either an E-form or a Z-form.

Other examples of the oxime ester compound which may be suitably used in the invention include compounds described in Progress in Organic Coatings, 13 (1985) 123-150; J.C.S Perkin II (1979) 1653-1660; *Journal of Photopolymer Science and Technology* (1995) 205-232; J.C.S Perkin II (1979) 156-162; JP-A No. 2000-66385; and JP-A No. 2000-80068.

Specific examples of the oxime ester compound which may be suitably used in the invention are shown below, but the invention is not limited thereto.

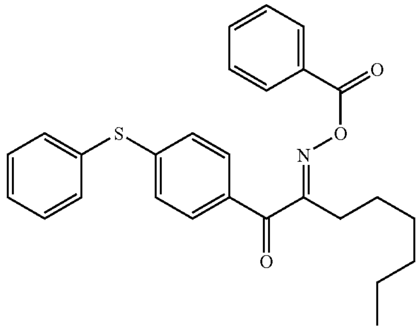

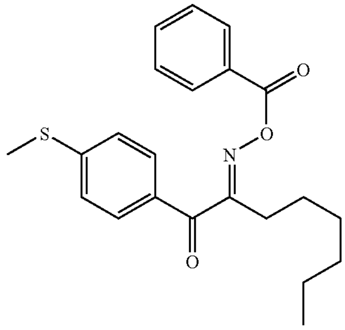

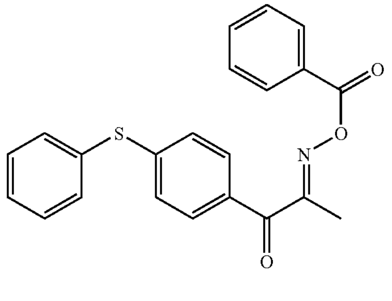

-continued
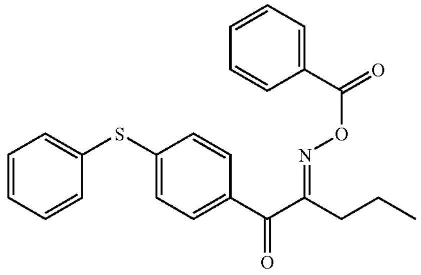
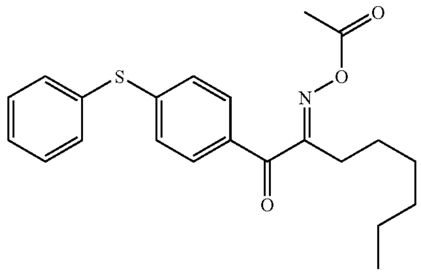
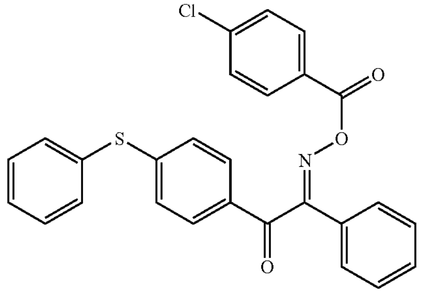
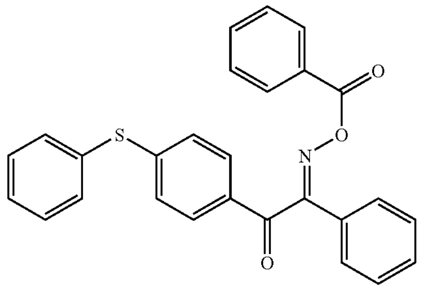
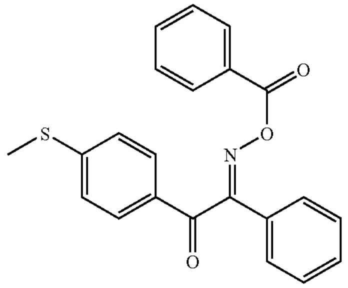
-continued
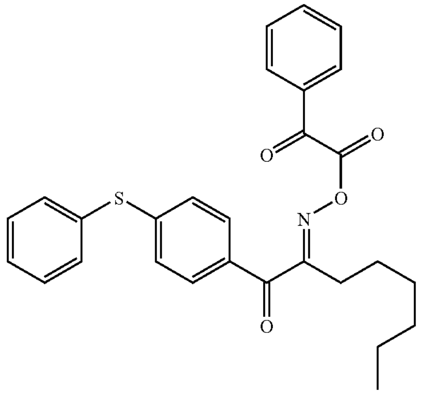
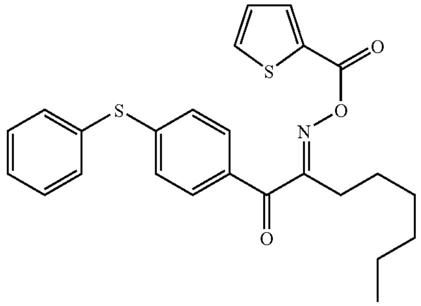
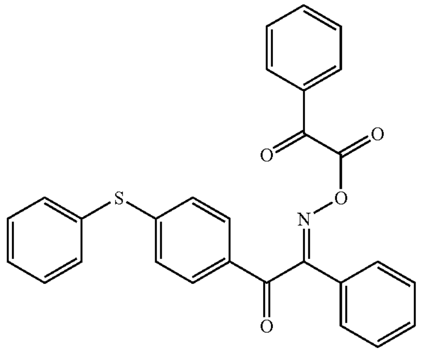
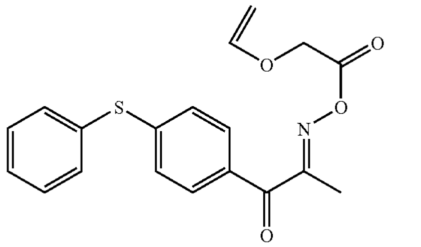
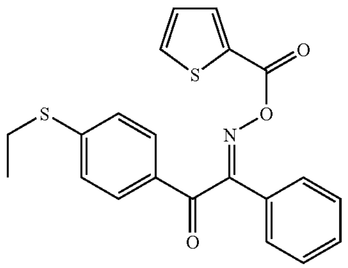

-continued
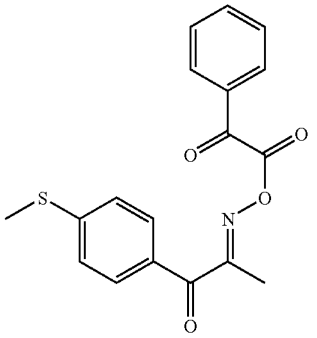
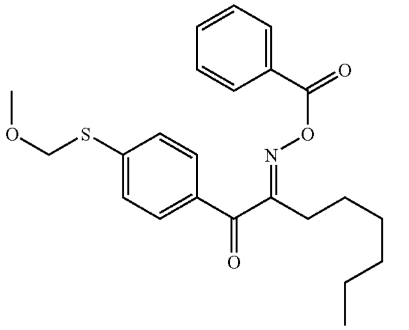
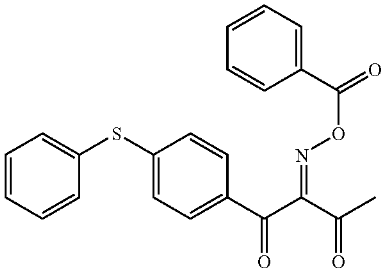
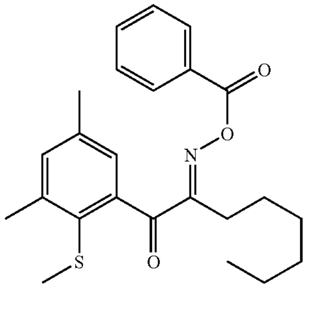
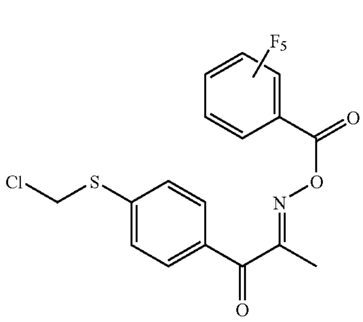
-continued
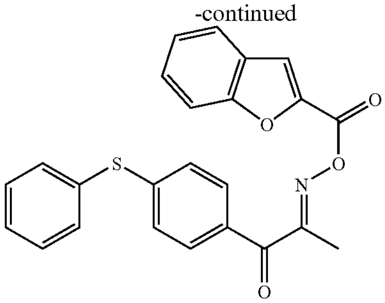
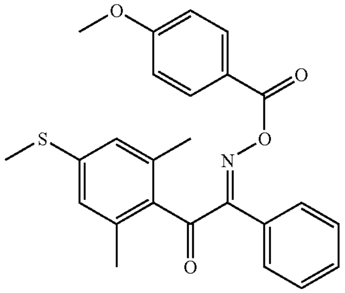
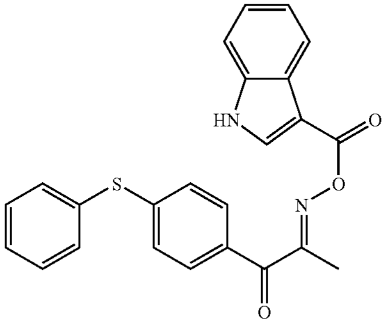
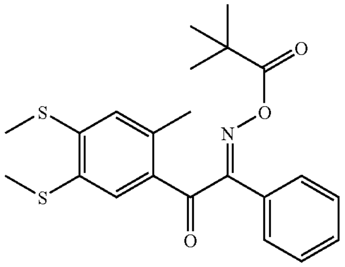
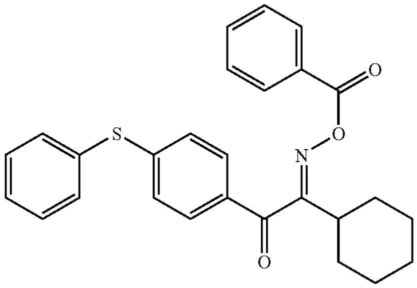
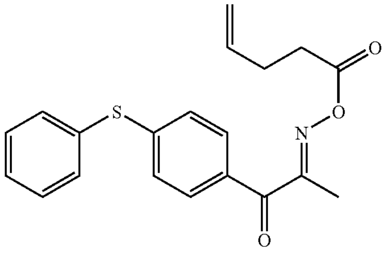

-continued
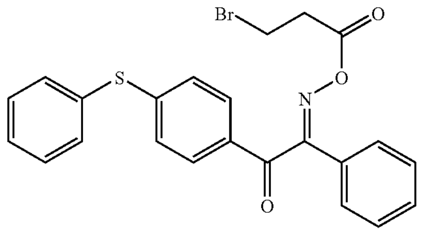
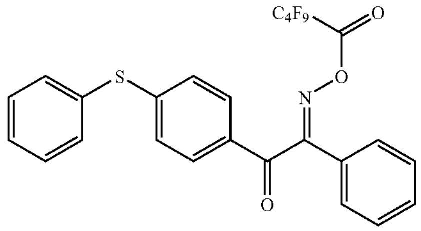
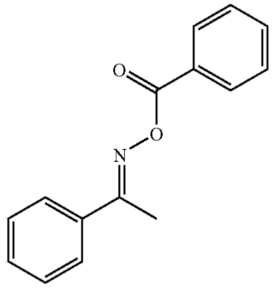
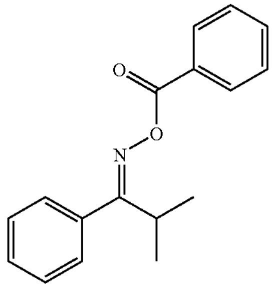
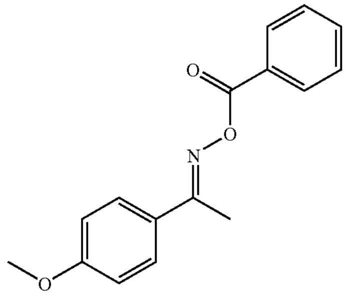
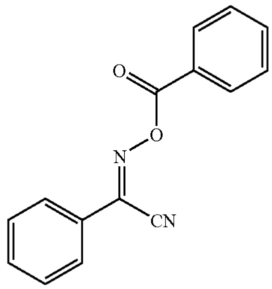
-continued
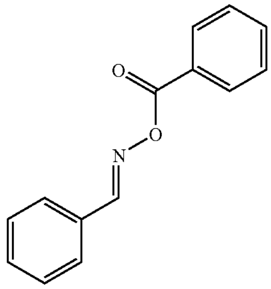
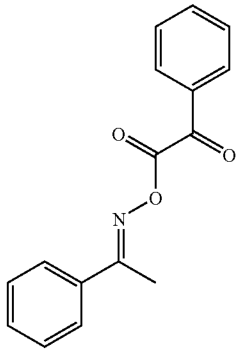
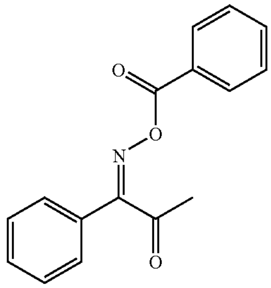
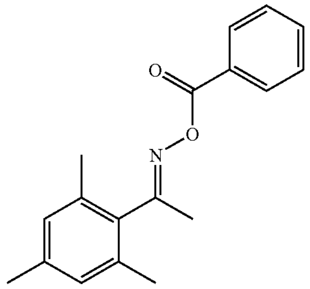
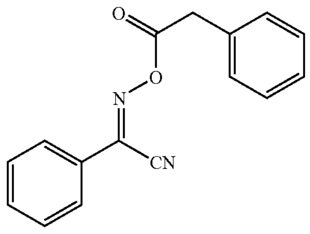
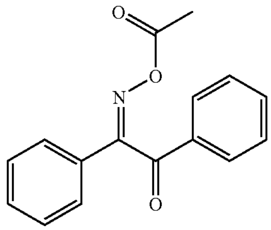

-continued
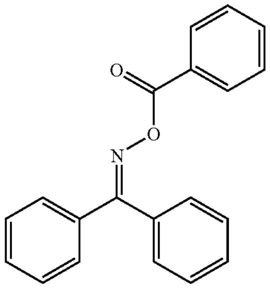
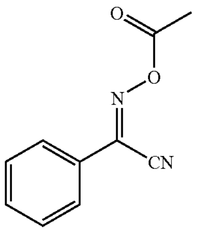
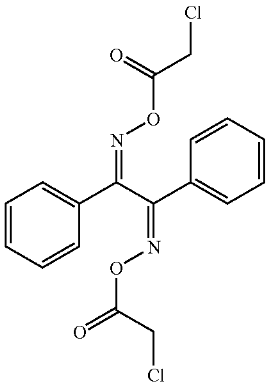
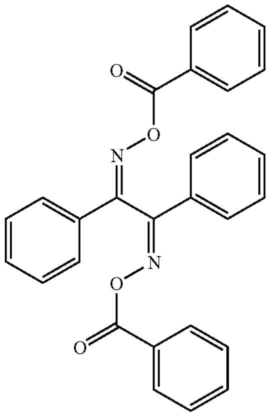
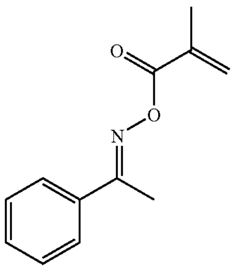
-continued
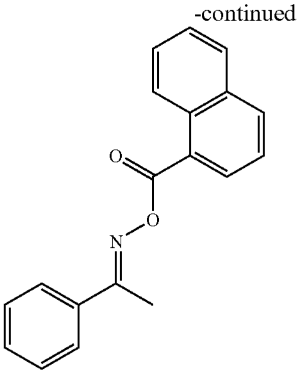
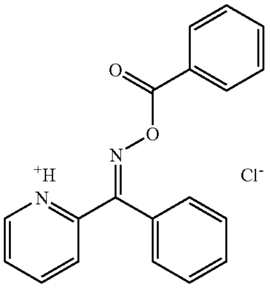
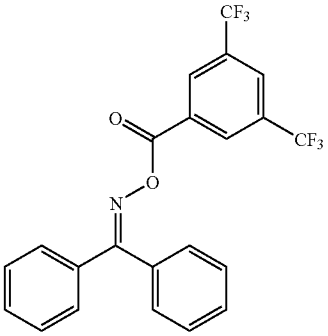
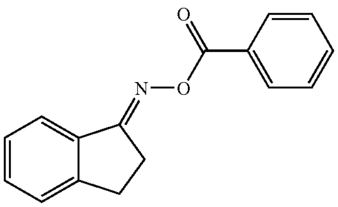
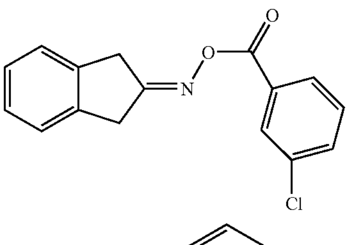
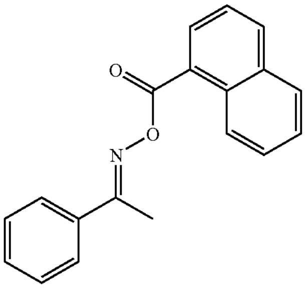

-continued
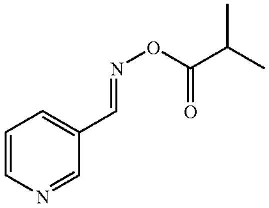
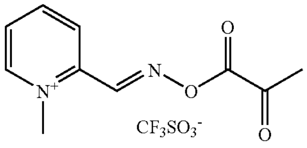
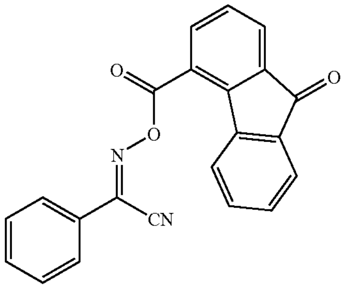
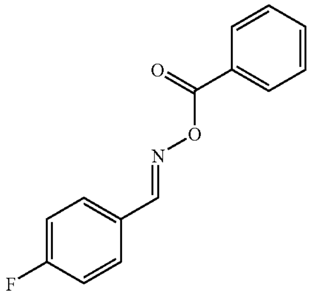
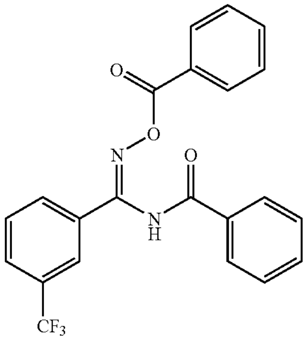
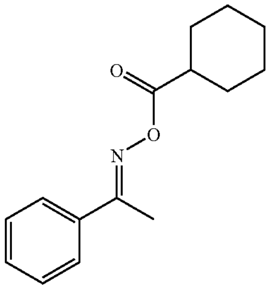
-continued
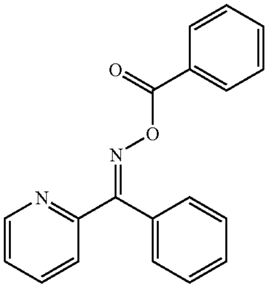
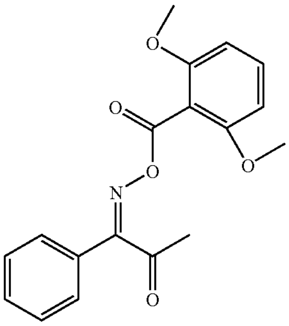
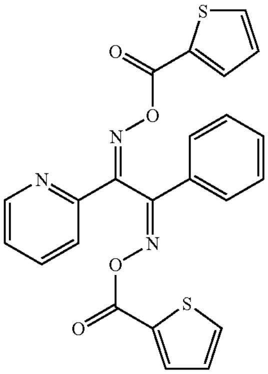
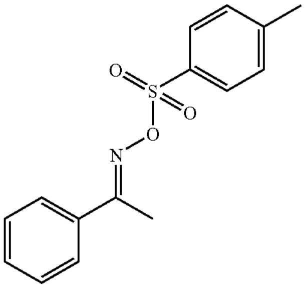
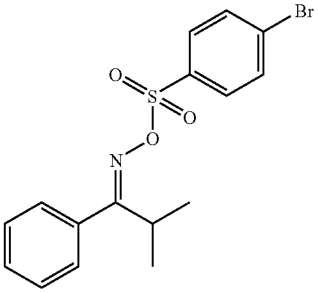

-continued
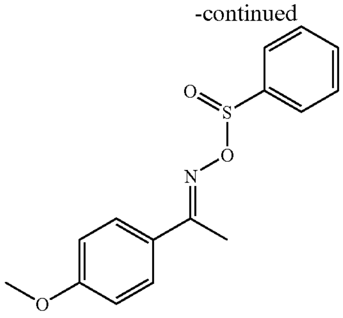
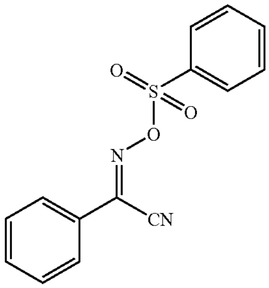
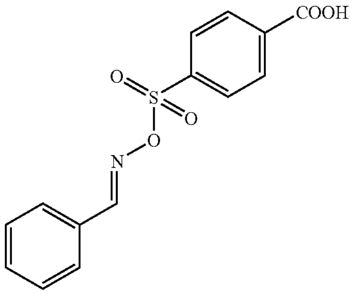
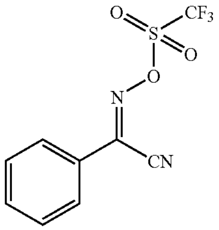
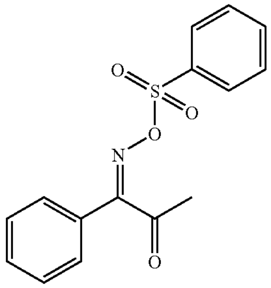
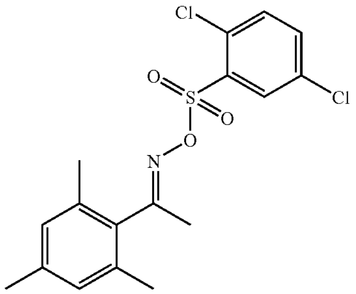
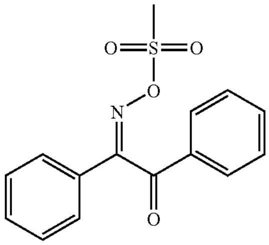
-continued
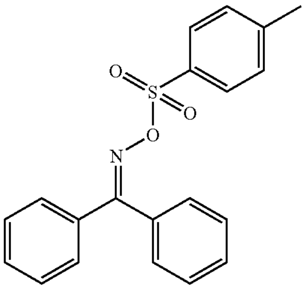
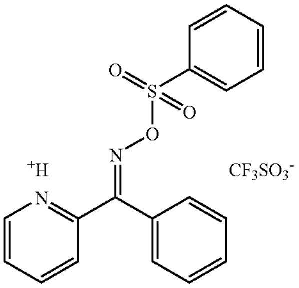
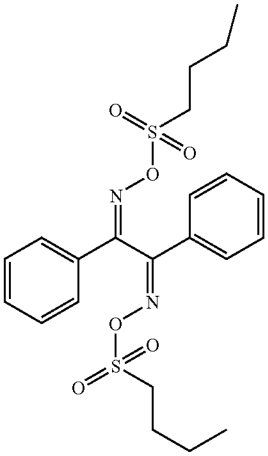
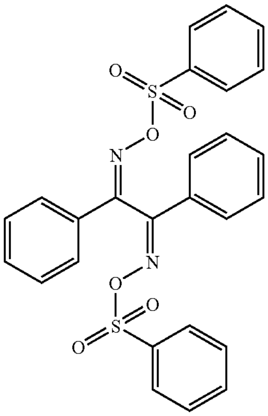

-continued
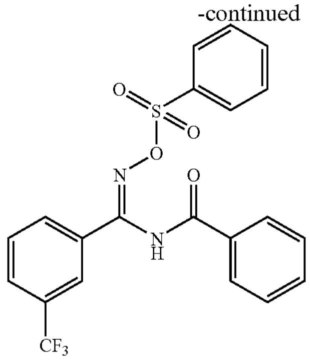
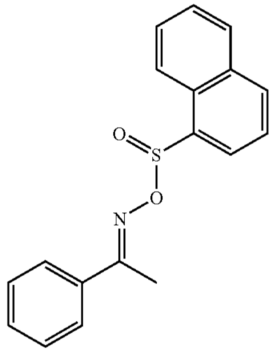
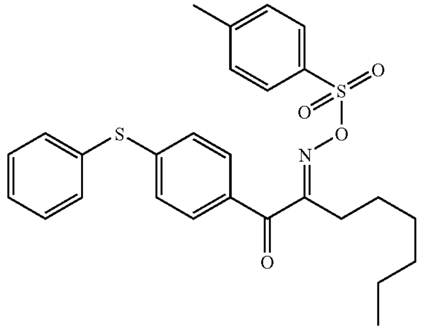
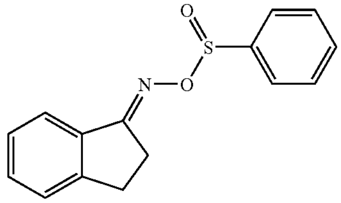
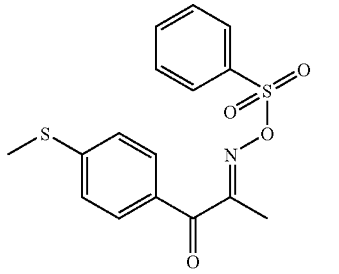
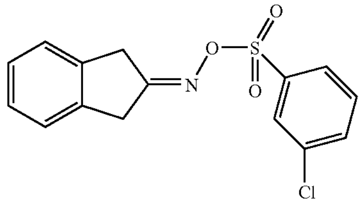
-continued
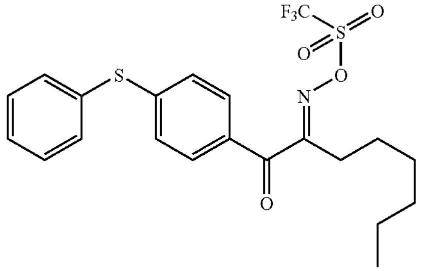
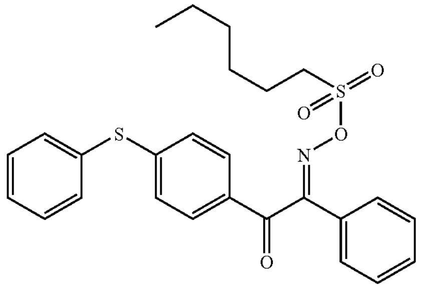
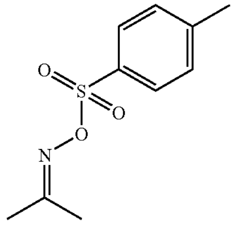
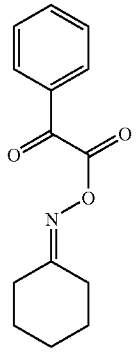
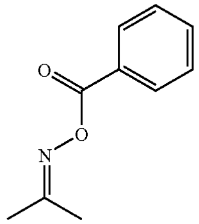
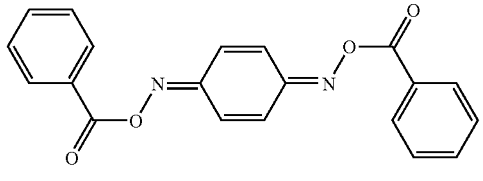
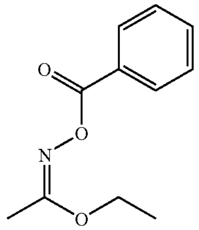

-continued

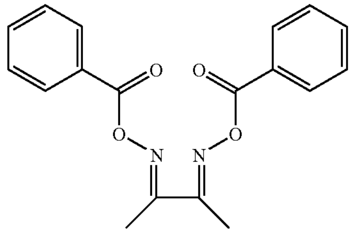

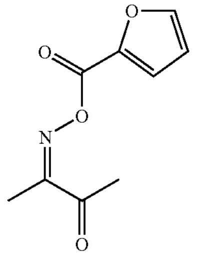

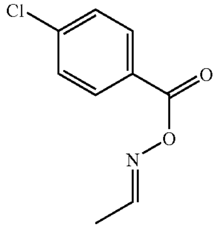

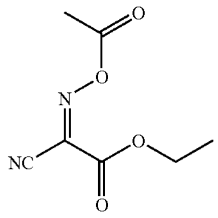

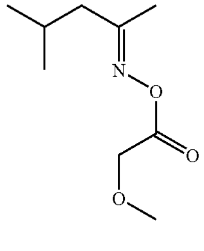

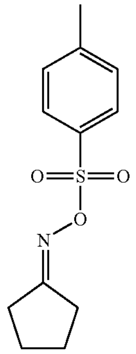

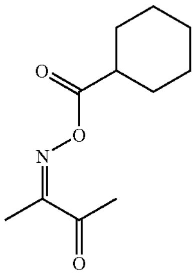

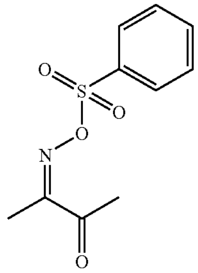

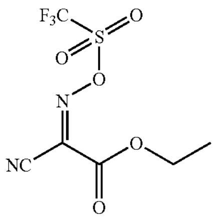

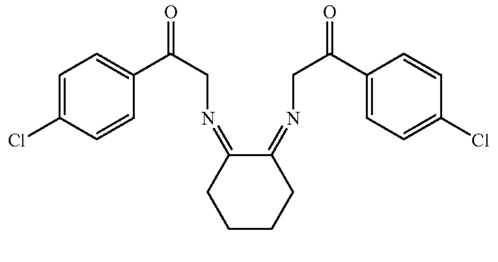

-continued

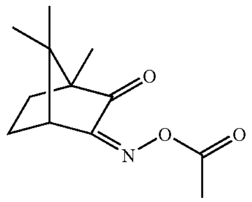

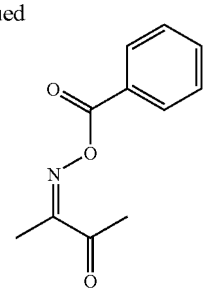

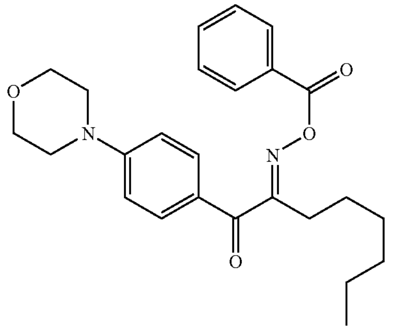

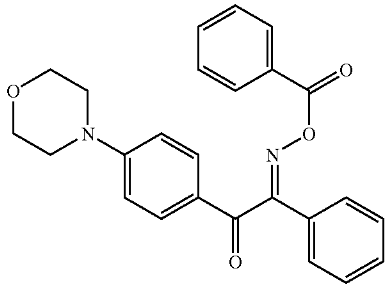

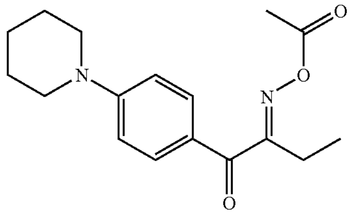

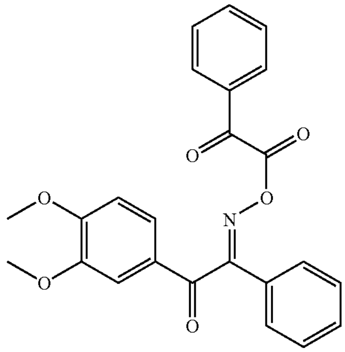

Such a polymerization initiator may be added at a proportion of 0.1 to 50% by mass, preferably 0.5 to 30% by mass, and particularly preferably 1 to 20% by mass, relative to total solids content that constitutes the photosensitive layer, in light of sensitivity and stains generated during printing at non-image areas. Such a polymerization initiator may be used alone, or may be used in combination of two or more types. Further, such a polymerization initiator may be added to the identical layer that contains other components, or a different layer may be formed for the polymerization initiator to be contained.

Polymerizable Compound

The addition polymerizable compound having at least one ethylenically unsaturated double bond which is used in the thermally polymerizable negative-type photosensitive layer in the invention is selected from compounds having at least one, and preferably 2 or more, ethylenically unsaturated double bonds. Such a group of compounds are widely known in this industrial field, and may be used in the invention without any specific limitation. These have a chemical form such as, for example, a monomer, a prepolymer, i.e., a dimer, a trimer and an oligomer, or a mixture of the same and a copolymer of the same. Examples of the monomer and the copolymer thereof include unsaturated carboxylic acids (e.g., acrylic acid, methacrylic acid, itaconic acid, crotonic acid, isocrotonic acid, maleic acid and the like), and the esters and amides thereof. Preferably, an ester of an unsaturated carboxylic acid and an aliphatic polyhydric alcohol compound, or any of amides of an unsaturated carboxylic acid and an aliphatic polyamine compound may be used. In addition, an addition reaction product of any of monofunctional or polyfunctional isocyanates or epoxys, and a dehydration condensation reaction product of a monofunctional or polyfunctional carboxylic acid, with an unsaturated carboxylate ester or an amide having a nucleophilic substituent such as a hydroxyl group, an amino group or a mercapto group may suitably be used. Furthermore, an addition reaction product of an unsaturated carboxylate ester or an amide having an electrophilic substituent such as an isocyanate group or an epoxy group with a monofunctional or polyfunctional alcohol, amine or thiol, as well as a substitution reaction product of an unsaturated carboxylate ester or an amide having a leaving substituent such as a halogen group or a tosyloxy group with a monofunctional or polyfunctional alcohol, amine or thiol are also suitable. Alternatively, as other examples, any of a group of compounds having substituted for an unsaturated phosphonic acid, styrene, vinylether or the like, instead of the aforementioned unsaturated carboxylic acid, may be also used.

Specific examples of the monomer of the ester of an aliphatic polyhydric alcohol compound and an unsaturated carboxylic acid include ethyleneglycol diacrylate, triethyleneglycol diacrylate, 1,3-butanediol diacrylate, tetramethyleneglycol diacrylate, propyleneglycol diacrylate, neopentylglycol diacrylate, trimethylolpropane triacrylate, trimethylolpropanetri(acryloyloxypropyl) ether, trimethylolethane triacrylate, hexanediol diacrylate, 1,4-cyclohexanediol diacrylate, tetraethyleneglycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri (acryloyloxyethyl)isocyanurate, polyester acrylate oligomer and the like as acrylate esters.

Examples of the methacrylic acid ester include tetramethyleneglycol dimethacrylate, triethyleneglycol dimethacrylate, neopentylglycol dimethacrylate, trimethylolpropane trimethacrylate, trimethylolethane trimethacrylate, ethyleneglycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, bis[p-(methacryloxyethoxy)phenyl]dimethylmethane and the like.

Examples of the itaconic acid ester include ethyleneglycol diitaconate, propyleneglycol diitaconate, 1,3-butanediol diitaconate, 1,4-butanediol diitaconate, tetramethylene glycol diitaconate, pentaerythritol diitaconate, sorbitol tetraitaconate and the like. Examples of the crotonate ester include ethyleneglycol dicrotonate, tetramethyleneglycol dicrotonate, pentaerythritol dicrotonate, sorbitol tetradicrotonate and the like. Examples of the isocrotonic acid ester include ethyleneglycol diisocrotonate, pentaerythritol diisocrotonate, sorbitol tetraisocrotonate and the like. Examples of the maleic acid ester include ethyleneglycol dimaleate, triethyleneglycol dimaleate, pentaerythritol dimaleate, sorbitol tetramaleate and the like.

Other examples of the ester suitably for use include aliphatic alcohol-based esters described in JP-B Nos.46-27926 and 51-47334, and JP-A No. 57-196231, those having an aromatic skeleton described in JP-A Nos. 59-5240, 59-5241 and 2-226149, those including an amino group described in JP-A No. 1-165613. Moreover, any ester monomer described above may be used as a mixture.

Specific examples of the monomer of the amide of an aliphatic polyamine compound and an unsaturated carboxylic acid include methylenebis-acrylamide, methylenebis-methacrylamide, 1,6-hexamethylenebis-acrylamide, 1,6-hexamethylenebis-methacrylamide, diethylene triaminetrisacrylamide, xylylenebis-acrylamide, xylylenebis-methacrylamide and the like. Other examples of preferred amide-based monomers include those having a cyclohexylene structure described in JP-B No. 54-21726.

An urethane-based addition polymerizable compound produced using the addition reaction of an isocyanate and a hydroxyl group may also be suitable, and specific examples thereof include vinylurethane compounds each containing two or more polymerizable vinyl groups within one molecule obtained by adding the vinyl monomer having a hydroxyl group represented by the following formula (2) to a polyisocyanate compound having two or more isocyanate groups within one molecule, as described in JP-B No. 48-41708.

$$CH_2{=}C(R^4)COOCH_2CH(R^5)OH \qquad (2)$$

wherein $R^4$ and $R^5$ represent H or $CH_3$.

Further, the urethane-based acrylates as described in JP-A No. 51-37193 and JP-B Nos. 2-32293 and 2-16765 and the urethane compounds each having an ethylene oxide-based skeleton as described in JP-B Nos. 58-49860, 56-17654, 62-39417 and 62-39418 may suitably be used. Furthermore, when any of the addition polymerizable compounds each having an amino structure or a sulfide structure within the molecule described in JP-A Nos. 63-277653, 63-260909 and 1-105238 is used, a photopolymerizable composition that is considerably excellent in sensitizing speed may be obtained.

Other examples thereof include multifunctional acrylates and methacrylates such as the polyester acrylates as described in JP-A No. 48-64183, and JP-B Nos. 49-43191 and 52-30490, the epoxy acrylates obtained by allowing reaction of an epoxy resin with (meth)acrylic acid. Furthermore, the specific unsaturated compounds described in JP-B Nos. 46-43946, 1-40337 and 1-40336, and the vinylsulfonic acid-based compounds described in JP-A No. 2-25493 and the like may also be mentioned. Moreover, in some instances, any one of the compounds having the structure containing a perfluoroalkyl group described in JP-A No. 61-22048 may appropriately be used. In addition, any one of the photo-curable monomers and oligomers described in "Nippon Setchaku Kyokai Shi (Journal of Japanese Adhesive Society)", Vol. 20, No. 7, pages 300-308 (1984) may also be used.

With respect to these addition polymerizable compounds, details of using manners such as the structure, a single use or combined use as a mixture and the addition amount thereof may optionally be selected in conformity with the performance design of the final planographic printing plate precursor. For example, they are selected in view of the following properties. That is, in light of sensitivity, the structure having a large amount of the unsaturated groups per molecule is preferred, and in many instances, at least a bifunctional one is preferred. Also, for improving strength of image areas, in other words, the cured film, at least a trifunctional one is preferred. Moreover, a method of controlling both photosensitivity and strength using a combination of the compounds each having a different functionality and different polymerizable groups (e.g., acrylate ester, methacrylate ester, a styrene based compound and a vinyl ether based compound) is also effective. Although a compound having a high molecular weight and a compound having high hydrophobicity are excellent in the sensitizing speed and the film strength, there may be a case in which such a compound is not preferred in view of developing speed and possible precipitation in a developer. Also, for compatibility with other components and the dispersing property in the photosensitive layer (e.g., a binder polymer, an initiator, and a coloring agent), selection and using manners of the addition polymerizable compound are important factors. For example, in some instances, use of a compound having low-impurity or use of two or more kinds of the compounds in combination may improve compatibility with other components. Also, for the purpose of improving adhesiveness of the support, an overcoat layer described below or the like, a specific structure may be selected. With respect to mixing ratio of the addition polymerizable compound in the photosensitive layer, use of a larger amount of the compound is advantageous in term of sensitivity. However, when the amount is too large, an undesirable phase separation may occur, and a problem in the production step associated with stickiness of the photosensitive layer (e.g., transfer of the components of the photosensitive layer and production failure due to stickiness) and a problem relating to precipitiation from a developer, etc., may occur. Thus, the addition polymerizable compound is used in the range of preferably from 5 to 80% by mass, and more preferably from 25 to 75% by mass, relative to nonvolatile components in the photosensitive layer. Further, the addition polymerizable compound may be used alone or in combination of two or more kinds thereof. Additionally, in the method using the addition polymerizable compound, from the standpoints of polymerization inhibition due to oxygen, resolution, fogging properties, a change in a refractive index, surface stickiness and the like, the appropriate structure, formulation, and addition amount may optionally be selected. Furthermore, the layer construction and a coating method including an undercoating and an overcoating may optionally be implemented.

To the photosensitive layer of the planographic printing plate precursor of the invention may be added other components, as necessary, which are suitable for the intended use, the production method and the like, in addition to the aforementioned essential components. Preferred additives will be described below.

Polymerization Inhibitor

It is desirable that a small amount of a thermal polymerization inhibitor is added to the photosensitive layer of the planographic printing plate precursor of the invention, in order to block unnecessary thermal polymerization of the compound having a polymerizable ethylenically unsaturated double bond during production or storage of the negative-type photosensitive composition. Examples of the appropriate thermal polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), a primary cerium salt of N-nitrosophenylhydroxylamine, and the like. The amount of the polymerization inhibitor to be added is preferably about 0.01% by mass to about 5% by mass, relative to nonvolatile components present in the composition. Moreover, for the purpose of preventing polymerization inhibition due to oxygen, a higher fatty acid derivative such as behenic acid and behenic acid amide is added as needed, and is uniformly distributed on the surface of the photosensitive layer in the course of drying after coating. The amount of the higher fatty acid derivative to be added is preferably from about 0.5% by mass to about 10% by mass per mass, relative to nonvolatile components present in the composition.

Coloring Agent

To the photosensitive layer of the planographic printing plate precursor of the invention may be added a dye or a pigment for the purpose of coloring thereof. A so-called printing inspection property, to examine usability as the printing plate, such as visibility after printing and adaptability for an image density measuring machine may be improved using the coloring agents. As the coloring agent, pigments are particularly preferably used because a number of dyes impair sensitivity of a photopolymerizing photosensitive layer. Specific examples thereof include pigments such as phthalocyanine-based pigments, azo-based pigments, carbon black and titanium oxide, and dyes such as ethyl violet, crystal violet, azo-based dyes, anthraquinone-based dyes and cyanine-based dyes. The amount of any of the pigments and dyes to be added is preferably about 0.5% by mass to about 5% by mass, relative to nonvolatile components present in the composition.

Other Additives

In addition to the above, an inorganic filler, as well as known additives such as a plasticizer, a desensitizing agent which can improve inking on the photosensitive layer surface, in order to improve properties of the cured film. Examples of the plasticizer include dioctyl phthalate, didodecyl phthalate, triethyleneglycol dicaprylate, dimethylglycol phthalate, tricresyl phosphate, dioctyl adipate, dibutyl sebacate, triacetylglycerin and the like. Such a plasticizer may be added generally in the range of 10% by mass or less, relative to a total mass of the binder polymer and the addition polymerizable compound. Further, a UV initiator, a thermal crosslinking agent and the like may be added for enhancing the effects of heating and exposure after the development, in an attempt to improve the film strength (printing durability) described below.

When the aforementioned photosensitive layer is provided by coating, the photopolymerizable composition including the components for the photosensitive layer is dissolved in various kinds of organic solvents, and applied over the intermediate layer. Examples of the solvent which may be used include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxy propanol, methoxymethoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethylsulfoxide, γ-butyrolactone, methyl lactate, ethyl lactate and the like. These solvents may be used alone or in admixture thereof. The solid concentration in a coating liquid is suitably 2 to 50% by mass.

The coating amount of the aforementioned photosensitive layer may influence on sensitivity of the photosensitive layer, development properties, strength and printing durability of the exposed film. Accordingly, it is desirable that the amount is optionally selected depending on the intended use. When the coating amount is too small, printing durability may be insufficient. On the contrary, a too large coating amount is not preferred because sensitivity may be lowered, leading to a prolonged time for the exposure and a prolonged time for the development processing. As a planographic printing plate precursor used for scanning exposure according to a primary object of the invention, the coating amount is suitably in the range of from about 0.1 $g/m^2$ to about 10 $g/m^2$ by mass after drying. More preferably, the coating amount after drying is 0.5 to 5 $g/m^2$.

In the planographic printing plate precursor according to the third aspect of the invention, the photosensitive layer that includes a binder polymer, an infrared absorbent, a polymerization initiator and a polymerizable compound is characterized in that a developing velocity at unexposed areas with respect to an alkaline developer having a pH of 10 to 13.5 is 80 nm/sec or greater, and a permeating velocity of the alkaline developer at exposed areas is 100 nF/sec or less. Methods of measuring "developing velocity for an alkaline developer" and "permeating velocity of an alkaline developer" employed in the invention are explained below.

Measurement of Developing Velocity for Alkaline Developer

The developing velocity with respect to an alkaline developer in the photosensitive layer as used herein refers to a value obtained by dividing the film thickness of the photosensitive layer (m) by a time period required for development (sec).

In the method of measuring the developing velocity according to the invention, an aluminum support having disposed thereon an unexposed photosensitive layer is immersed in a predetermined alkaline developer (30° C.) having a pH in the range of from 10 to 13.5, and the photosensitive layer is evaluated for dissolution behavior using a DRM interference wave measuring apparatus, as shown in FIG. 1. FIG. 1 illustrates a schematic diagram of the DRM interference wave measuring apparatus for measurement of dissolution behavior of the photosensitive layer. In the invention, a change in the layer thickness is detected by interference using a light at 640 nm. In FIG. 1, reference number 11 indicates light of 640 nm; 12: photosensitive layer; 13: photosensitive material; 14: support; and 15: developer. When development behavior is non-swelling development from the photosensitive layer surface, the layer thickness gradually becomes thinner depending on the development time to thus obtain an interference wave in compliance with the thickness. Further, when development behavior is swelling dissolution (film-removing dissolution), the layer thickness may change depending on the permeation of the developer, failing to produce a neat interference wave.

Measurement is continued under these conditions to find the developing velocity according to the following equation on the basis of a time period until the photosensitive layer is completely removed to thereby give a layer thickness of 0 (development completion time) (sec) and a thickness of the photosensitive layer (μm). A larger developing velocity means that the layer is readily removed by the developer and hence the development property is rated good.

Developing velocity (at unexposed areas)=Thickness of photosensitive layer (μm)/Recording completion time (sec)

Measurement of Permeating Velocity of Alkaline Developer

The permeating velocity of the alkaline developer refers to a value indicating a velocity change in an electrostatic capacity (F), when the aforementioned photosensitive layer is formed on a conductive support and immersed in the developer.

Figure 2:
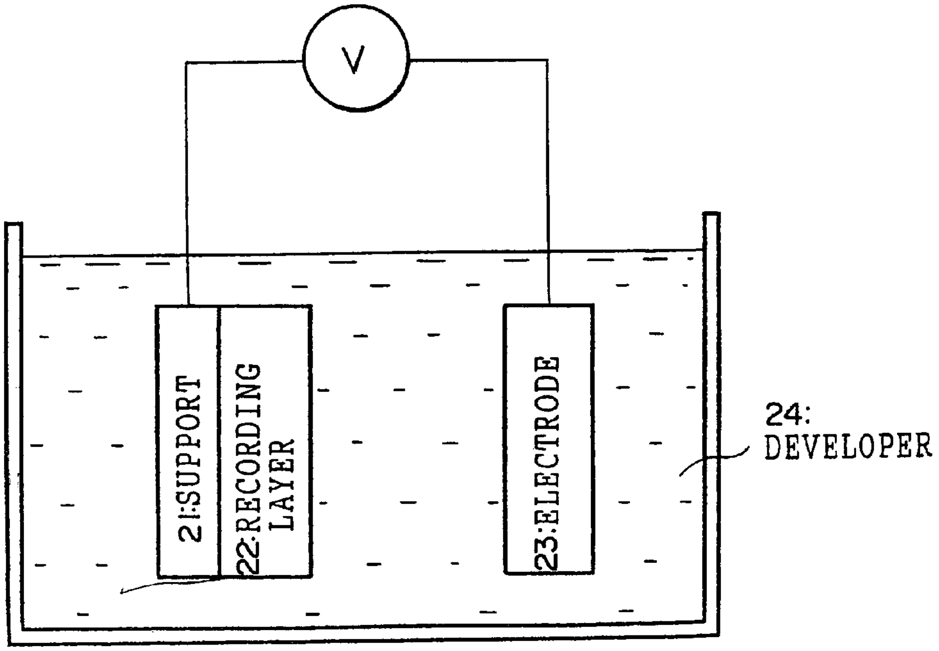
FIG. 2 is a schematic view illustrating one example of a process for measuring an electrostatic capacity to evaluate permeability of the developer into a photosensitive layer.

A measuring method of the electrostatic capacity as shown in FIG. 2, which indicates permeability of the developer according to the invention, includes a process in which exposure is conducted on an aluminum support in a certain exposure amount within a predetermined alkaline developer (28° C.) having a pH of in the range of 10 to 13.5, and thus obtained support having a cured photosensitive layer is immersed as one electrode, with a cable connected to the aluminum support, while a conventional electrode is used as a counter electrode, followed by applying an electrical voltage. In FIG. 2, reference number 21 indicates support; 22: recording layer; 23: electrode; and 24: developer. Following the application, the developer permeates into the interface between the support and photosensitive layer in accordance the permeating time, causing a change in the electrostatic capacity.

The permeating velocity can be obtained by the following equation on the basis of the time period (sec) until the electrostatic capacity is changed (s) and the thickness of the photosensitive layer (μm). A smaller permeating velocity means that permeability of the developer is low.

Permeating velocity of the developer (at exposed areas)=thickness of photosensitive layer (μm)/time period required until a change in the electrostatic capacity becomes constant (sec)

As the preferable physical properties of the photosensitive layer in the planographic printing plate precursor according to the third aspect of the invention, the developing velocity at unexposed areas for an alkaline developer having a pH of 10 to 13.5 measured as above is preferably 80 to 400 nm/sec, and the permeating velocity of the similar alkaline developer into the photosensitive layer is preferably 90 nF/sec or less. Additionally, the developing velocity at unexposed areas for an alkaline developer having a pH of 10 to 13.5 measured as above is more preferably 90 to 200 nm/sec, and the permeating velocity of the similar alkaline developer into the photosensitive layer is preferably 80 nF/sec or less. An upper limit of the developing velocity or a lower limit of the permeating velocity is not particularly limited, however, the developing velocity at unexposed areas is more preferably in the range of from 90 to 200 nm/sec, and the permeating velocity of the alkaline developer into the photosensitive layer is more preferably 80 nF/sec or less, taking into account of both velocities.

The developing velocity at unexposed areas and the permeating velocity with respect to the alkaline developer into the photosensitive layer after curing can be controlled by a conventional method. Typically, a hydrophilic compound is added to improve the developing velocity at unexposed areas, while a hydrophobic compound is added to suppress permeation of the developer at exposed areas.

If the specific binder polymer according to the invention is used, the developing velocity and the permeating velocity of the developer in the photosensitive layer may readily be adjusted to fall within the aforementioned preferable range.

Support

As the support of the planographic printing plate precursor of the invention, conventionally known hydrophilic supports for use in the planographic printing plate precursors may be used without limitation.

The support to be used is preferably a dimensionally stable plate-shaped material, and examples of the support include paper, paper laminated with a plastic (e.g., polyethylene, polypropylene, and polystyrene), metal plates (e.g., aluminum, zinc, and copper), plastic films (e.g., cellulose diacetate, cellulose triacetate, cellulose propionate, cellulose butyrate, cellulose acetate/butyrate, cellulose nitrate, polyethylene terephthalate, polyethylene, polystyrene, polypropylene, polycarbonate, and polyvinyl acetal), and paper or plastic films laminated or vapor-deposited with the metal as described above. The surface of the support may optionally be subjected to appropriate known physical or chemical treatment so as to impart hydrophilicity or improve strength.

Specific examples of the preferred support include paper, polyester films and aluminum plates. Among these, dimensionally stable and relatively inexpensive aluminum plates which can provide an excellent surface in terms of hydrophilicity and strength, through optionally conducting a surface treatment, are more preferred. In addition, composite sheets in which an aluminum sheet is adhered to a polyethylene terephthalate film as described in JP-B No. 48-18327 are also preferred.

An aluminum plate is a dimensionally stable metal plate which includes aluminum as a principal component, and is selected from pure aluminum plates as well as alloy plates including aluminum as a principal component and a trace amount of foreign elements, or plastic films or paper on which aluminum (alloy) is laminated or vapor-deposited. In the following description, the supports comprising the above-mentioned aluminum or aluminum alloy are collectively referred to as an aluminum support. Examples of the foreign elements contained in the aforementioned aluminum alloy include silicon, iron, manganese, copper, magnesium, chromium, zinc, bismuth, nickel, titanium and the like, and the content of the foreign elements in the alloy is 10% by mass or less. Although a pure aluminum plate is suitably for use in the invention, manufacture of completely pure aluminum is difficult in regard to the refining techniques, and hence, those including a minute amount of the foreign elements are preferable. Accordingly, the constitution of the aluminum plate which may be applied to the invention is not specified, and the conventionally known and used materials, for example, JIS A 1050, JIS A 1100, JIS A 3103, JIS A 3005 and the like may arbitrarily be utilized.

The thickness of the aluminum support which may be used in the invention is approximately 0.1 mm to 0.6 mm. The thickness may vary in compliance with the size of the printing machine, size of the printing plate and user's request. The aluminum support may be subjected to a surface treatment described below, if needed. However, it is to be noted that such a treatment is not always necessary.

Surface Roughening Treatment

Examples of method of surface-roughening include mechanical roughening, chemical etching, and electrolytically graining as disclosed in JP-A No. 56-28893. In addition, electrochemical methods of surface-roughening in which surface-roughening is electrochemically conducted in a hydrochloric acid or nitric acid electrolyte, and mechanical methods of surface roughening such as a wire brush graining method in which an aluminum surface is scratched with a metal wire, a pole graining method in which an aluminum surface is subjected to graining with abrasive grains and an abrasive material, and a brush graining method in which a surface is roughened with a nylon brush and an abrasive material. These methods of surface-roughening may be employed alone or in combination thereof. Among them, advantageously used methods for the surface-roughening include electrochemical methods in which surface-roughening is conducted chemically in a hydrochloric acid or nitric acid electrolyte, and a suitable electrical quantity at the anode is in the range of from 50 $C/dm^2$ to 400 $C/dm^2$. More specifically, it is preferred that alternating and/or direct current electrolysis is performed in an electrolyte including 0.1 to 50% hydrochloric acid or nitric acid under the conditions of a temperature of 20 to 80° C., a time period of 1 second to 30 minutes, and an electric current density of 100 $C/dm^2$ to 400 $C/dm^2$.

Aluminum supports having undergone the surface-roughening in such a manner may also be subjected to chemical etching using an acid or an alkali. Examples of suitably usable etching agents include caustic soda, carbonate of soda, aluminate of soda, metasilicate soda, phosphate soda, potassium hydroxide, lithium hydroxide and the like. Preferred ranges of the concentration and the temperature are 1 to 50% and 20 to 100° C., respectively. Following the etching, acid washing is carried out to remove residual stains (smuts) on the surface after the etching. Examples of the usable acid include nitric acid, sulfuric acid, phosphoric acid, chromic acid, hydrofluoric acid, fluoroboric acid and the like. Particularly preferred examples of the method of desmutting treatment following the electrochemical surface-roughening treatment include a method in which a substrate is brought into contact with 15 to 65% by mass of sulfuric acid at 50 to 90° C. as described in JP-A No. 53-12739, and an alkaline etching method as described in JP-B No. 48-28123. Methods and conditions therefor are not particularly limited insofar as a central-line average surface roughness of the treated surface (Ra) after the treatment is 0.2 to 0.5 μm.

Anodizing Treatment

It is preferred that the aluminum support which was treated as described above is subjected to an anodizing treatment.

In the anodizing treatment, an aqueous solution of sulfuric acid, phosphoric acid, oxalic acid or boric acid/sodium borate is used alone or in combination, as a principal component in the electrolytic bath. In this case, the electrolyte may contain any component that is usually included in at least Al alloys, electrodes, tap water, underground water and the like, as a matter of course. Further, the second and third components may be added thereto. The second and third components as used herein may be, for example, a cation including metal ions such as Na, K, Mg, Li, Ca, Ti, Al, V, Cr, Mn, Fe, Co, Ni, Cu and Zn, as well as ammonium ion, and an anion such nitrate ion, carbonate ion, chlorine ion, phosphate ion, fluorine ion, nitrite ion, titanate ion, silicate ion and borate ion. These components may be included at the concentration of approximately 0 to 10,000 ppm. Although the conditions for the anodizing treatment is not particularly limited, the treatment is preferably performed by direct or alternating current electrolysis with 30 to 500 g/liter, at a treating liquid temperature of 10 to 70° C., and with the electric current density in the range of 0.1 to 40 $A/m^2$. A thickness of the formed anodic oxidation film is in the range of 0.5 to 1.5 μm, and preferably in the range of 0.5 to 1.0 μm. The conditions for the treatment are preferably selected such that the support produced by the above treatment has micropores that exist on the anodic oxidation film having the pore size of 5 to 10 nm, and the pore density of $8\times10^{15}$ to $2\times10^{16}$ pores/$m^2$.

As the treatment for imparting hydrophilicity to the surface of the support, any of widely known methods may be applied. A treatment for imparting hydrophilicity using silicate or polyvinylphosphonic acid is a particularly preferable treatment. The film is formed to give 2 to 40 mg/$m^2$, and more preferably 4 to 30 mg/$m^2$ as an elemental amount of Si or P. The coated amount may be measured by a fluorescent X-ray analysis method.

The aforementioned treatment for imparting hydrophilicity is performed by immersing the aluminum support having the anodic oxidation film formed thereon, for example, at 15 to 80° C. for 0.5 to 120 sec, into a 1 to 30% by mass, and preferably 2 to 15% by mass aqueous solution of alkaline metal silicate or polyvinyl phosphonic acid having a pH of 10 to 13 at 25° C.

Examples of the alkaline metal silicate which may be used in the aforementioned treatment for imparting hydrophilicity include sodium silicate, potassium silicate, lithium silicate and the like. Examples of the hydroxide which may be used to raise the pH of the aqueous alkaline metal silicate solution include sodium hydroxide, potassium hydroxide, lithium hydroxide and the like. To the treating liquid may be added an alkaline earth metal salt or a metal salt of the group IVB. Examples of the alkaline earth metal salt include nitrates such as calcium nitrate, strontium nitrate, magnesium nitrate and barium nitrate, and water-soluble salts such as sulfate, hydrochloride, phosphate, acetate, oxalate and borate. Examples of the metal salt of the group IVB include titanium tetrachloride, titanium trichloride, potassium titanium fluoride, potassium titanium oxalate, titanium sulfate, titanium tetraiodide, oxidized zirconium chloride, zirconium dioxide, zirconium oxychloride, zirconium tetrachloride and the like.

The alkaline earth metal salt or the metal salt of the group IVB may be used alone or in combination of two or more kinds thereof. These metal salts are used preferably in the range of 0.01 to 10% by mass, and more preferably in the range of 0.05 to 5.0% by mass. Additionally, silicate electrodeposition as described in U.S. Pat. No. 3,658,662 is also effective. Surface treatment which is employed in combination with the aforementioned anodizing treatment and a treatment for imparting hydrophilicity to a support that has been subjected to electrolytically graining as disclosed in JP-B No. 46-27481, JP-A Nos. 52-58602 and 52-30503 is also useful.

Intermediate Layer

The planographic printing plate precursor of the invention may be provided with an intermediate layer (also referred to as an undercoat layer) for the purpose of improving adhesiveness between the photosensitive layer and the support and stain susceptibility. Specific examples of such an intermediate layer include those described in JP-B No. 50-7481, JP-A Nos. 54-72104, 59-101651, 60-149491, 60-232998, 3-56177, 4-282637, 5-16558, 5-246171, 7-159983, 7-314937, 8-202025, 8-320551, 9-34104, 9-236911, 9-269593, 10-69092, 10-115931, 10-161317, 10-260536, 10-282682 and 11-84674, and Japanese Patent Application Nos. 8-225335, 8-270098, 9-195863, 9-195864, 9-89646, 9-106068, 9-183834, 9-264311, 9-127232, 9-245419, 10-127602, 10-170202, 11-36377, 11-165861, 11-284091 and 2000-14697 and the like.

Protective Layer

It is preferable that the photosensitive layer of the planographic printing plate precursor having the thermally polymerizing negative-type photosensitive layer of the invention is further provided with a protective layer (also referred to as an overcoat layer), in order to conduct the exposure in an atmosphere. The protective layer makes it possible to conduct the exposure in an atmosphere by preventing contamination, into the photosensitive layer, of low molecular weight compounds such as oxygen and basic substances that are present in the atmosphere which inhibit the image forming reaction caused by the exposure in the photosensitive layer. Accordingly, it is desirable that the protective layer exhibits a low permeability of low molecular weight compounds such as oxygen. It is also desirable that light transmission used for the exposure is not substantially inhibited, that adhesiveness with the photosensitive layer is excellent, and that removal thereof in the development step after exposure is readily conducted. Such a design relating to the protective layer have been conventionally implemented, as detailed in U.S. Pat. No. 3,458, 311 and JP-B No. 55-49729.

As the material which may be used for the protective layer, a water-soluble high molecular compound that is relatively excellent in crystallinity may be used. Specifically, water-soluble polymers such as polyvinyl alcohol, polyvinyl pyrrolidone, acidic celluloses, gelatin, gum arabic and polyacrylic acid are known. Among these, use of polyvinyl alcohol as a principal component produces most favorable results in terms of basic features such as oxygen barrier properties and removing properties at development. Polyvinyl alcohol used for the protective layer may partly be substituted by an ester or ether and acetal insofar as it contains an unsubstituted vinyl alcohol unit for achieving essential oxygen barrier properties and water-solubility. In addition, a part thereof may have other copolymerizing component. Specific examples of the polyvinyl alcohol include those which are hydrolyzed at 71 to 100% and have a molecular weight in the range of from 300 to 2,400. Specific examples of polyvinyl alcohol include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, L-8 and the like (manufactured by Kuraray Co., Ltd.).

The components of the protective layer (selection of PVAs, use of additives), coating amounts and the like are selected taking into account of the oxygen barrier properties, removing properties at development as well as fogging properties, adhesiveness and scratching durability. In general, as the hydrolysis ratio of the used PVA is higher (as the content of unsubstituted vinyl alcohol in the protective layer is higher), and as the film thickness is greater, oxygen barrier properties are increased, leading to advantages with respect to sensitivity. However, excessively increased oxygen barrier properties pose problems of unnecessary polymerization reaction to occur during the process of production and storability, or undesirable fogging and thickening of drawn lines to occur during the image exposure. Moreover, adhesiveness to the image area, and scratch resistance are also significantly important when handling the plates. More specifically, when a hydrophilic layer which comprises water-soluble polymer is laminated on the lipophilic photosensitive layer, film defects are likely to take place owing to insufficient adhesiveness. Thus, the peeled part causes defects such as poor film curing through inhibition of the polymerization due to oxygen. As the countermeasure for this event, a variety of proposals have been made in order to improve adhesiveness between these two layers. For example, U.S. patent application Ser. Nos. 292,501 and 44,563 set forth that sufficient adhesiveness may be achieved by mixing an acrylic emulsion or a water-insoluble vinyl pyrrolidone-vinyl acetate copolymer in a hydrophilic polymer which contains polyvinyl alcohol in an amount of 20 to 60% by mass, followed by laminating on a photosensitive layer.

These conventionally known techniques may be applied to the protective layer according to the invention. Coating methods of such a protective layer are detailed in, for example, U.S. Pat. No. 3,458,311 and JP-B No. 55-49729.

For plate making of the planographic printing plate precursor of the invention, at least exposure and development processes are carried out.

As a light source for exposure of the negative-type planographic printing plate precursor according to the invention, any known light source may be used without limitation. The wavelength of a desirable light source is from 300 nm to 1,200 nm. Specifically, any one of various types of lasers is suitably used as a light source, among which an infrared laser emitting radiation in the wavelength of 780 nm to 1,200 nm is suitably used.

The exposing measures may be any one of an internal drum system, an external drum system, a flat bed system and the like.

Other examples of light sources for exposure on the planographic printing plate precursor of the invention include a mercury lamp with ultrahigh pressure, high pressure, middle pressure and low pressure, a chemical lamp, a carbon arc lamp, a xenon lamp, a metal halide lamp, various kinds of visible and ultraviolet laser lamps, fluorescent lamps, tungsten lamps, sunlight and the like.

The planographic printing plate precursor of the invention is subjected to a development processing after exposure. The developer used in such a development processing is preferably an aqueous alkaline solution having a pH of 14 or less, and more preferably, an aqueous alkaline solution having a pH of 8 to 12 which contains an anionic surfactant. Examples thereof include inorganic alkaline chemicals such as sodium tertiary phosphate, potassium tertiary phosphate, ammonium tertiary phosphate, sodium secondary phosphate, potassium secondary phosphate, potassium secondary phosphate, ammonium secondary phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide and lithium hydroxide. Also, an organic alkaline chemical such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine or pyridine may be used. These alkaline chemicals may be used alone or in combination of two or more kinds thereof.

Moreover, in the development processing of the planographic printing plate precursor of the invention, an anionic surfactant is added to the developer in an amount of 1 to 20% by mass, and more preferably the anionic surfactant added in an amount of 3 to 10% by mass. When the addition amount is too low, developing properties may be reduced, while a too large amount thereof leads to adverse effects e.g., deterioration of strength such as abrasion resistance of the image. Examples of the anionic surfactant include a sodium salt of lauryl alcohol sulfate, an ammonium salt of lauryl alcohol sulfate and a sodium salt of octyl alcohol sulfate, alkylaryl sulfonates such as, for example, a sodium salt of isopropylnaphthalene sulfonic acid, a sodium salt of isobutylnaphthalene sulfonic acid, a sodium salt of polyoxyethylene glycol mononaphthyl ether sulfate ester, a sodium salt of dodecylbenzene sulfonic acid and a sodium salt of methanitrobenzene sulfonic acid, higher alcohol sulfate esters having 8 to 22 carbon atoms such as secondary sodium alkyl sulfate, aliphatic alcohol phosphate ester salts such as a sodium salt of cetyl alcohol phosphate ester, sulfonate salts of alkylamide such as, for example, $C_{17}H_{33}CON(CH_3)CH_2CH_2SO_3Na$, sulfonate salts of a dibasic aliphatic ester such as, for example, sodium sulfosuccinate dioctyl ester and sodium sulfosuccinate dihexyl ester, and the like.

An organic solvent that is miscible with water, such as benzyl alcohol may optionally be added to the developer. The suitable organic solvent has solubility in water of about 10% by mass or less, and preferably is selected from those having solubility of 5% by mass or less. Examples of the organic solvent include 1-phenyl ethanol, 2-phenyl ethanol, 3-phenyl propanol, 1,4-phenyl butanol, 2,2-phenyl butanol, 1,2-phenoxy ethanol, 2-benzyloxy ethanol, o-methoxybenzyl alcohol, m-methoxybenzyl alcohol, p-methoxybenzyl alcohol, benzyl alcohol, cyclohexanol, 2-methyl cyclohexanol, 4-methylcyclohexanol, 3-methylcyclohexanol and the like. The content of the organic solvent is appropriately 1 to 5% by mass relative to a total mass of the developer in use. The amount in use has a close relationship with the amount in use of the surfactant. In proportion to an increase in the amount of the organic solvent, the amount of the anionic surfactant is preferably increased, because use of large amount of the organic solvent in the presence of a small amount of the anionic surfactant results in poor dissolution of the organic solvent, whereby favorable developing properties cannot be secured.

Further, additives such as an antifoaming agent and a water softener may optionally be included. Examples of the water softener include polyphosphate salts such as $Na_2P_2O_7$, $Na_5P_3O_3$, $Na_3P_3O_9$, $Na_2O_4P(NaO_3P)PO_3Na_2$ and calgon (sodium polymethaphosphate), aminopolycarboxylic acids (e.g., ethylene diamine tetraacetic acid, the potassium salt thereof and the sodium salt thereof; diethylene triaminepentaacetic acid, the potassium salt thereof and the sodium salt thereof; triethylenetetraminehexaacetic acid, the potassium salt thereof and the sodium salt thereof; hydroxyethyl ethylenediaminetriacetic acid, the potassium salt thereof and the sodium salt thereof; nitriloacetic acid, the potassium salt thereof and the sodium salt thereof; 1,2-diaminocyclohexanetetraacetic acid, the potassium salt thereof and the sodium salt thereof; 1,3-diamino-2-propanol tetraacetic acid, the potassium salt thereof and the sodium salt thereof, other polycarboxylic acids (e.g., 2-phosphonobutanetricarboxylic acid-1,2,4, the potassium salt thereof and the sodium salt thereof; 2-phosphonobutanonetricarboxylic acid-2,3,4, the potassium salt thereof and the sodium salt thereof, and the like), organic phosphonic acids (e.g., 1-phosphonoethanetricarboxylic acid-1,2,2, the potassium salt thereof and the sodium salt thereof; 1-hydroxyethane-1,1-diphosphonic acid, the potassium salt thereof and the sodium salt thereof; aminotri(methylenephosphonic acid), the potassium salt thereof and the sodium salt thereof, and the like. Although the optimum amount of such a water softener may vary depending on the hardness of hard water employed and the amount thereof used, it is included usually in the range of from 0.01 to 5% by mass, and more preferably 0.01 to 0.5% by mass in the developer in use.

Moreover, when the planographic printing plate precursor is developed using an automated developing machine, fatigue of the developer may occur depending on the treating amount. Therefore, a replenisher or a fresh developer may be used to recover the processing ability. In this case, such a solution is preferably supplied by a method described in U.S. Pat. No.

4,882,246. Also, any developer described in JP-A Nos. 50-26601 and 58-54341, and JP-B Nos. 56-39464, 56-42860 and 57-7427 is preferably used.

The planographic printing plate precursor having been developed in such a manner may be subjected to a post-treatment with washing water, a rinsing liquid containing a surfactant or the like, or a desensitizing liquid containing gum arabic, a starch derivative or the like, as described in JP-A Nos. 54-8002, 55-115045 and 59-58431. For the post-treatment of the planographic printing plate precursor of the invention, these treatments may be employed in a variety of combinations.

As a print-making process of the planographic printing plate precursor of the invention, the entire surface may optionally be heated before the exposure, during the exposure, and from the start of exposure through the development. If such heating is conducted, the image forming reaction in the photosensitive layer may be facilitated, providing advantages such as improvement in sensitivity and printing durability, and stable sensitivity. It is also effective to conduct post-heating of the entire surface or exposure of the entire surface of the images after development so as to improve image strength and printing durability.

In general, it is preferred that heating before the development is conducted under mild conditions at 150° C. or less. Too high temperature may raise problems such as undesirable curing reaction to occur at non-image areas, and the like. When heating is conducted after development, significantly severe conditions may be employed. Usually, heating is conducted at a temperature in the range of 200 to 500° C. If a heating temperature after development is low, a sufficient image strengthening action is not achieved. On the contrary, if a heating temperature is too high, problems may occur such as a deteriorated support and thermal decomposition at image areas.

The planographic printing plate obtained through the foregoing treatments is charged in an offset printing machine and used for printing a large number of sheets.

When printing is conducted, a conventionally known plate cleaners for PS plates may be used to remove stains on the plate. Examples of the plate cleaner for PS plates include Type CL-1, CL-2, CP, CN-4, CN, CG-1, PC-1, SR and IC (manufactured by Fuji Photo Film Co., Ltd.).

EXAMPLES

The present invention will now be further described by way of the following examples, but it is noted that the invention is not limited to these examples.

Synthesis Example 1, Binder Polymer (P-1) of Polymer Type (Ti)

A dimethylacetamide (35 g) solution containing M-1 (17.1 g) having the following structure, PC-LM (6.1 g) having the following structure, M-3 (4.0 g) having the following structure, M-4 (2.8 g) having the following structure and 2,2'-azobis(2-methyl butyronitrile) (manufactured by Wako Pure Chemicals Co., Ltd.) (0.21 g) was added dropwise into dimethylacetamide (35 g) under a nitrogen gas stream at 75° C. over 2.5 hours. After completing the dropwise addition, the mixture was further stirred at 75° C. for 2 hours. After kept for cooling, this solution was poured into water (2 L) which has been vigorously stirred, and stirred for 1 hour. Precipitated white solids were filtrated and dried to give a precursor of a binder polymer (P-1) shown in Table 1.

Subsequently, this precursor (21 g), 4-hydroxy-2,2,6,6-tetramethylpiperidine-1-oxyl (free radical) (0.2 g) and tert-butanol (10 g) were dissolved in dimethylacetamide (120 g), and the obtained solution was acidified with hydrochloric acid at 0° C., followed by stirring at 0° C. for 30 min. Then this solution was poured into water (2 L) which has been vigorously stirred, and stirred for another 1 hour. Precipitated white solids were filtrated and dried to give a binder polymer (P-1) of a polymer type (T-1). When this binder polymer (P-1) was determined by gel permeation chromatography, a weight average molecular weight was found to be 121,000 in terms of polystyrene, with the acid value being 0.81 meq/g. Further, the resultant binder polymer (P-1) was identified by NMR and IR spectra.

The structure of the polymer type (T-1) obtained by Synthesis Examples 1, and the structures of the monomer materials (PC-1M), (M–1), (M-3) and (M-4) are shown below.

(T-1)

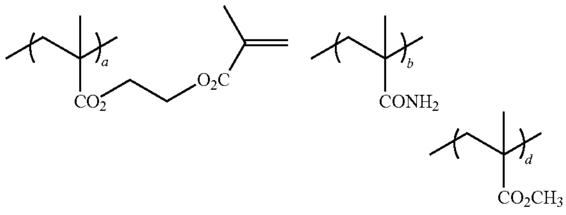

(Repeating Unit represented by Formula (I))c (PC-1M)

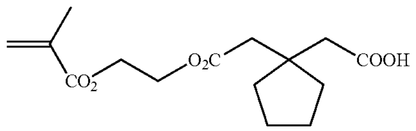

(M-1)

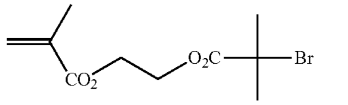

(M-3)

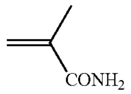

(M-4)

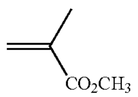

Synthesis Example 2, Binder Polymer (P-11) of Polymer Type (T2)

A dimethylacetamide (58 g) solution containing M-1 (20 g) having the following structure, M-2 (24 g) having the following structure, PC-2M (5.5 g) having the following structure and dimethyl-2,2'-azobis(2-methyl propionate) (manufactured by Wako Pure Chemicals Co., Ltd.) (0.21 g) was added dropwise into dimethylacetamide (58 g) under a nitrogen gas stream at 75° C. over 2.5 hours. After completing the dropwise addition, the mixture was further stirred at 75° C. for 2 hours. After kept standing for cooling, this solution was poured into water (3 L) which has been vigorously stirred, and stirred for 1 hour. Precipitated white solids were filtrated and dried to give a precursor of a binder polymer (P-11) shown in Table 1.

Subsequently, this precursor (48 g), 4-hydroxy-2,2,6,6-tetramethylpiperidine-1-oxyl (free radical) (0.15 g) and tert-butanol (17 g) were dissolved in dimethylacetamide (274 g), to which was added 1,8-diazabicyclo[5.4.0]-7-undeceneh (62.8 g) at 0° C. over 2 hours, followed by stirring at room temperature for 24 hours. Thereafter, the solution was acidified with hydrochloric acid at 0° C., and stirred at 0° C. for 30 min. Then, this solution was poured into water (3 L) which has been vigorously stirred, and stirred for additional 1 hour. Precipitated white solids were filtrated and dried to give a binder polymer (P-11) of a polymer type (T-2). When this binder polymer (P-11) was determined by gel permeation chromatography, a weight average molecular weight was 101,000 in terms of polystyrene, with the acid value being 0.62 meq/g. Further, the resultant binder polymer (P-11) was identified by NMR and IR spectra.

The structure of the polymer type (T-2) obtained by Synthesis Examples 1, and the structures of the monomer materials (PC-2M), (M−1) and (M−2) are shown below.

(T-2)

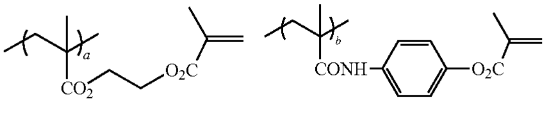

(Repeating Unit represented by Formula (I))$_c$ (PC-2M)

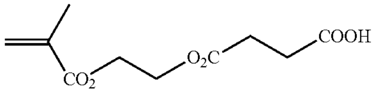

(M-1)

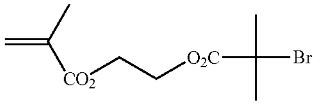

(M-2)

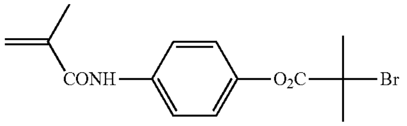

Synthesis Example 3, Binder Polymer (P-23)

To a 1,000 ml-three necked flask equipped with a condenser and a stirrer was placed 1-methoxy-2-propanol (300 ml), followed by heating to 70° C. Under a nitrogen gas stream, thereto was added dropwise a 1-methoxy-2-propanol (300 ml) solution containing CL-1 (allyl methacrylate) (115 g) having the following structure, PC-2M (30 g) having the following structure, Am-5 (N-isopropylacrylamide) (29 g) having the following structure and V-65 (manufactured by Wako Pure Chemicals Co., Ltd.) (2.3 g) over 2.5 hours.

Further, a reaction was allowed to proceed at 70° C. for 2 hours. Then, the reaction mixture was charged into water to cause deposition of a copolymer. Filtration, washing and drying thereof gave a binder polymer (P-23). As a result of determining the weight average molecular weight by gel permeation chromatography (GPC) using polystyrene as a standard substance, it was revealed to be 139,000.

The structures of the monomer materials (PC-2M), (CL-1) and (Am-5) used in Synthesis Example 3 are shown below.

(PC-2M)

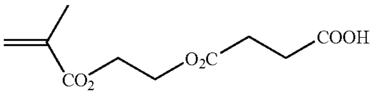

(CL-1)

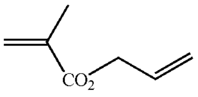

(Am-5)

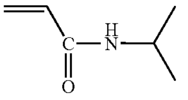

Binder polymers (P-2) to (P-6) shown in Table 1 below were obtained similarly to Synthesis Example 1 by appropriately changing the monomer materials; binder polymers (P-7) to (P-10) and (P-12) to (P-14) shown in Table 1 were obtained similarly to Synthesis Example 2 by appropriately changing the monomer materials; and binder polymers (P-20) to (P-22) and (P-24) to (P-31) shown in Table 2 below were obtained similarly to Synthesis Example 3 by appropriately changing the monomer materials.

Furthermore, binder polymers (P-15) to (P-19) shown in Table 1 were obtained similarly to Synthesis Example 2, except that the polymer type (T-2) was changed to the polymer type (T-3) or (T-4) having the following structure and that the monomer materials were appropriately altered.

Binder polymers (P-1) to (P-31) used in this Example are the specific binder polymer according to the invention.

(T-3)

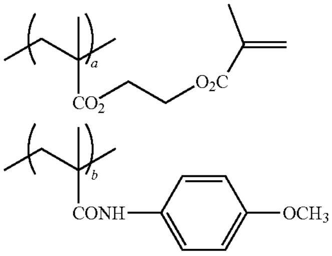

(Repeating Unit Represented by Formula (I))$_C$ (T-4)

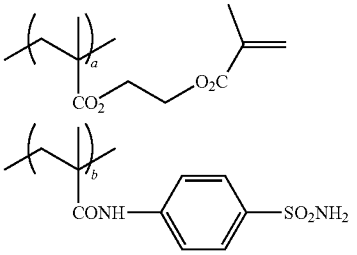

(Repeating Unit Represented by Formula (I))$_C$

TABLE 1

| Binder Polymer | Polymer type | Repeating Unit represented by Formula (I) | a | b | c | d | Molecular Weight (×10,000) |
|---|---|---|---|---|---|---|---|
| P-1 | T-1 | PC-1 | 39 | 30 | 13 | 18 | 12.1 |
| P-2 | T-1 | PC-2 | 36 | 30 | 12 | 22 | 10.3 |
| P-3 | T-1 | PC-3 | 36 | 30 | 12 | 22 | 9.5 |
| P-4 | T-1 | PC-4 | 40 | 30 | 18 | 12 | 8.6 |
| P-5 | T-1 | PC-9 | 30 | 30 | 15 | 25 | 10.0 |
| P-6 | T-1 | PC-11 | 30 | 30 | 20 | 20 | 7.9 |
| P-7 | T-2 | PC-1 | 40 | 40 | 20 | — | 15.6 |
| P-8 | T-2 | PC-5 | 40 | 35 | 25 | — | 10.0 |
| P-9 | T-2 | PC-6 | 40 | 40 | 20 | — | 18.1 |
| P-10 | T-2 | * | 48 | 40 | 12 | — | 8.5 |
| P-11 | T-2 | PC-2 | 60 | 27 | 13 | — | 10.1 |
| P-12 | T-2 | PC-3 | 40 | 42 | 18 | — | 10.6 |
| P-13 | T-2 | PC-4 | 40 | 42 | 18 | — | 10.6 |
| P-14 | T-2 | PC-8 | 48 | 40 | 12 | — | 7.5 |
| P-15 | T-3 | PC-2 | 57 | 29 | 14 | — | 12.0 |
| P-16 | T-3 | PC-8 | 60 | 20 | 20 | — | 10.0 |
| P-17 | T-4 | PC-2 | 60 | 20 | 20 | — | 11.0 |
| P-18 | T-4 | PC-8 | 55 | 20 | 25 | — | 11.0 |
| P-19 | T-3 | PC-2 | 57 | 19 | 14 | 10** | 10.0 |

* denotes one including 10 mol % of PC-7 and 2 mol % of a methacrylic acid unit

**denotes use of methyl methacrylate as the unit of d

TABLE 2

| Binder Polymer | Polymer Constitution | Molecular Weight (×10,000) |
|---|---|---|
| P-20 | PC-1/CL-1/Am-1 = 15/70/15 | 15.2 |
| P-21 | PC-2/CL-2/Am-2 = 15/75/10 | 9.6 |
| P-22 | PC-12/CL-3/Am-3 = 10/70/20 | 10.8 |
| P-23 | PC-2/CL-1/Am-5 = 10/70/20 | 13.9 |
| P-24 | PC-2/CL-2/Am-6 = 10/70/20 | 14.1 |
| P-25 | PC-9/CL-4/Am-7 = 8/82/10 | 11.1 |
| P-26 | PC-13/CL-5/Am-8 = 10/65/25 | 10.8 |
| P-27 | PC-14/CL-1/Am-12 = 8/62/30 | 12.1 |
| P-28 | PC-9/CL-5/Am-16 = 10/75/10 | 12.6 |
| P-29 | PC-10/CL-3/Am-23 = 9/71/20 | 10.1 |
| P-30 | PC-2/CL-1/Am-5 = 10/90/0 | 11.8 |
| P-31 | PC-2/CL-1/Am-1 = 10/70/20 | 12.5 |

The structure of the repeating units (PC-1) to (PC-14) represented by formula (I) shown in Table 1 and Table 2 are illustrated below. PC-1M to PC-14M are defined as monomer materials (methacryloyl forms) of PC-1 to PC-14 units.

PC-1

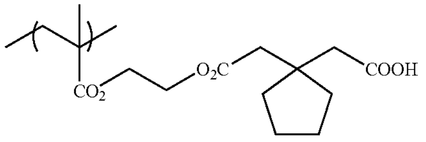

PC-2

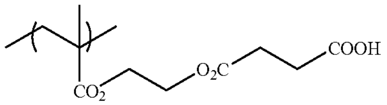

PC-3

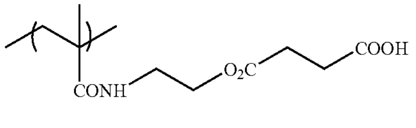

-continued

PC-4

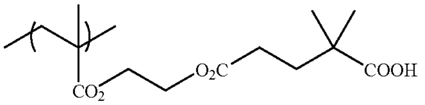

PC-5

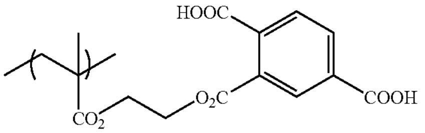

PC-6

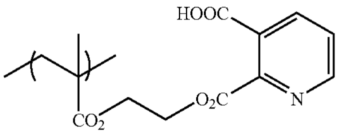

PC-7

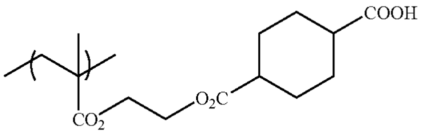

PC-8

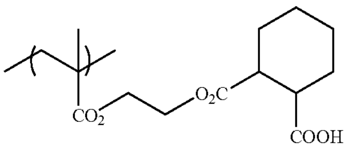

PC-9

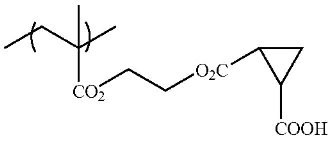

PC-10

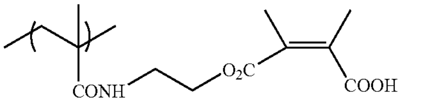

PC-11

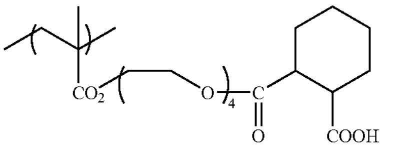

PC-12

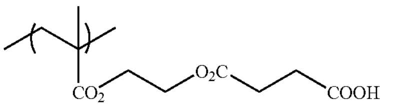

PC-13

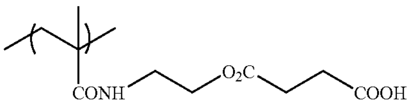

-continued

PC-14

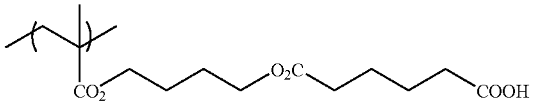

PC-1M to PC-14M are defined as monomer materials (methacryloyl forms) of PC-1 to PC-14 units. For example, PC-1M has the following structure.

PC-1M

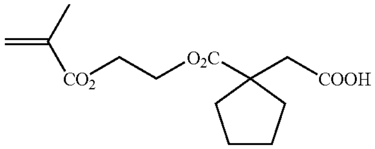

Further, the structures of the monomer materials (CL-1) to (CL-5) having a radical polymerizable group shown in Table 2 are illustrated below.

(CL-1)

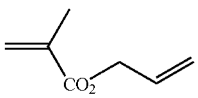

(CL-2)

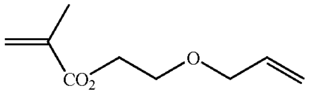

(CL-3)

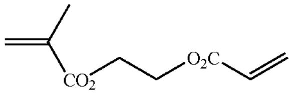

(CL-4)

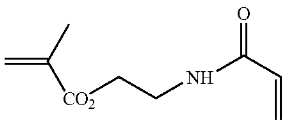

(CL-5)

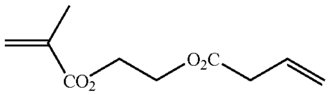

Monomer materials of (Am-1) to (Am-3), (Am-5) to (Am-8), (Am-12), (Am-16), and (Am-23) shown in Table 2 above indicate those listed as specific examples of the monomer to constitute the binder polymer having an amide group represented by the above formula (I).

Examples 1 to 19, Comparative Examples 1 to 4

Planographic printing plate precursors were produced by the following procedures, and were evaluated for the printing properties. Binder polymers, polymerization initiators and types of the infrared absorbent to constitute the photosensitive layers, and the results of evaluating printing performances are shown in Table 3 below.

Preparation of Support

A melt of the alloy of JIS A 1050 containing aluminum in an amount of 99.5% or greater, 0.30% of Fe, 0.10% of Si, 0.02% of Ti and 0.013% of Cu was subjected to a cleaning treatment, and then cast. In the cleaning treatment, the melt was subjected to a degassing treatment and to a ceramic tube filter treatment to remove unwanted gases such as hydrogen in the melt. Casting was carried out by a DC casting method. After scraping the surface of 10 mm in thickness from the solidified ingot having a thickness of 500 mm, the ingot was subjected to a homogenizing treatment at 550° C. for 10 hours so that intermetallic compounds were not coalescent.

Then, the ingot was hot rolled at 400° C. followed by intermediate annealing at 500° C. for 60 seconds in a continuous annealing furnace. Thereafter, the annealed product was cold rolled to provide an aluminum rolled plate having a thickness of 0.30 mm. By controlling the roughness of the rolling roll, the central line average surface roughness (Ra) of the plate, after the cold rolling performed, was controlled to be 0.2 μm. Then, the aluminum plate was subjected to a tension leveler in order to improve the flatness.

Next, a surface treatment was carried out for making a support for a planographic printing plate.

First, in order to eliminate rolling oil on the surface of the aluminum plate, a degreasing treatment was carried out with a 10% aqueous solution of sodium aluminate at 50° C. for 30 seconds, followed by a neutralization and desmutting treatment with a 30% aqueous solution of sulfuric acid at 50° C. for 30 seconds.

Then, roughening of the surface of the support, which was generally referred to as graining treatment was performed so as to increase adhesiveness between the support and the photosensitive layer and to impart water retention to the non-image areas. An aqueous solution containing 1% nitric acid and 0.5% aluminum nitrate was kept at 45° C., and an anodic electric quantity of 240 $C/dm^2$ of an alternating waveform at a duty ratio of 1:1 and a current density of 20 $A/dm^2$ was applied from an indirect power supplying cell, while passing the aluminum web through the aqueous solution to conduct electrolytically graining. Thereafter, an etching treatment was carried out with an aqueous solution of 10% sodium aluminate at 50° C. for 30 seconds followed by a neutralization and desmutting treatment with a 30% aqueous solution of sulfuric acid at 50° C. for 30 seconds.

Furthermore, in order to improve abrasion resistance, chemical resistance and water retention, an oxide film was formed on the support by anodization. Using an aqueous solution of 20% sulfuric acid as the electrolyte at 35° C., an anodic oxidation film of 2.5 $g/m^2$ was formed by electrolytisis by applying a direct current of 14 $A/dm^2$ using an indirect power supplying cell, while passing the aluminum web through the electrolyte.

Thereafter, in order to increase the hydrophilicity at non-image areas of the printing plate, a silicate treatment was carried out. In the treatment, the aluminum web was passed through a 1.5% aqueous solution of 3# sodium silicate, kept at 70° C., such that the contact time of the aluminum web became 15 seconds and further the web was washed with water. The deposited amount of Si was 10 $mg/m^2$.

The value of Ra (central line surface roughness) of the aluminum support produced as above was 0.25 μm.

Coating of Photosensitive Layer

On such an aluminum support was applied the following coating liquid for the photosensitive layer by a wire bar, and dried using a warm blast type drying apparatus at 125° C. for 27 seconds to thereby form a photosensitive layer. The coated amount after drying was 1.2 $g/m^2$.

| (Coating Solution for Photosensitive Layer) | |
|---|---|
| Polymerizable compound (dipentaerythritol hexaacrylate) | 2.0 g |
| Binder polymer (binder polymers (P-1) to (P-19) shown in Table 3, comparative binder polymers (P-32) to (P-35) having the following structures) | 2.0 g |
| Infrared absorbent (compound described in Table 3) | 0.08 g |
| Polymerization initiator (compound described in Table 3) | 0.3 g |
| Fluorine-based nonionic surfactant (Megafac F-176, manufactured by DAINIPPON INK & CHEMICALS, INC.) | 0.01 g |
| Naphthalene sulfonate of Victoria Pure Blue | 0.04 g |
| Methyl ethyl ketone | 9.0 g |
| Propylene glycol monomethyl ether | 8.0 g |
| Methanol | 10.0 g |

Exposure of Planographic Printing Plate Precursor

The planographic printing plate precursor obtained as described above was subjected to exposure using Trendsetter 3244 VFS (manufactured by Creo Co., Ltd.) equipped with a water-cooling type 40 W infrared semiconductor laser under the conditions of an output of 9 W, an outer face drum rotation number of 210 rpm, a plate surface energy of 100 mJ/cm$^2$, and a resolution of 2400 dpi.

Development/Plate Making

After the exposure, a developer having the following composition and a 1:1 water-dilution of a finisher FN-6 (manufactured by Fuji Photo Film Co., Ltd.) were charged, respectively, in an automatic developing machine, Stablon 900N (manufactured by Fuji Photo Film Co., Ltd.). Development/print making was carried out at 30° C. to thereby obtain a planographic printing plate.

| (Developer D-1) | |
|---|---|
| Pure water | 95 g |
| Compound having the following formula (3) | 5 g |
| KOH | 0.06 g |
| Potassium carbonate | 0.2 g |
| Compound having the following formula (4) | 0.2 g |

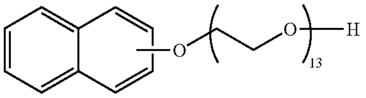
(3)

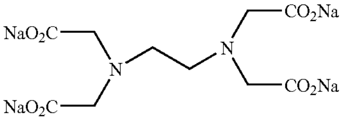
(4)

Printing Durability Test at Image Areas

A printing machine employed was Lithlon (manufactured by Komori Corporation), and used ink was Graph G(N) (manufactured by DAINIPPON INK & CHEMICALS, INC.). Printing in a solid image area was observed, and printing durability at image areas was examined by counting the number of printed sheets until thin spotting of the image appeared. As the number is greater, printing durability is rated as good. The results of evaluation are shown in Table 3 below.

Accelerated Dot Printing Durability Test

A printing machine employed was Lithlon (manufactured by Komori Corporation), and used ink was Graph G(N) (manufactured by DAINIPPON INK & CHEMICALS, INC.). After 5,000 sheets were printed since printing had been started, a printing sponge impregnated with a PS plate cleaner Type CL-2 (manufactured by Fuji Photo Film Co., Ltd.) was used to wipe dots, followed by washing ink on the plate surface. Thereafter, 10,000 sheets were printed, and the presence of plate wearing of dots was observed visually. Results of the evaluation are shown in Table 3.

TABLE 3

| | | | | Printing Durability | | Binder alone | | Photosensitive Layer | | |
|---|---|---|---|---|---|---|---|---|---|---|
| | Binder Polymer | Polymerization Initiator | Infrared Absorbent | Image Areas | Dot Areas | Developing velocity (nm/sec) | Permeating velocity (nF/sec) | Developing velocity (nm/sec) | Permeating velocity (nF/sec) | Developer |
| Example 1 | P-1 | OI-5 | IR-3 | 39 | ◎ | 20 | 50 | 120 | 100 | D-1 |
| Example 2 | P-2 | OI-7 | IR-3 | 39 | ◎ | 30 | 45 | 200 | 100 | D-1 |
| Example 3 | P-3 | OI-2 | IR-2 | 35 | ○ | 30 | 45 | 200 | 90 | D-1 |
| Example 4 | P-4 | OI-3 | IR-3 | 38 | ○ | 20 | 50 | 300 | 100 | D-1 |
| Example 5 | P-5 | OI-1 | IR-2 | 36 | ○ | 20 | 45 | 250 | 80 | D-1 |
| Example 6 | P-6 | OI-6 | IR-1 | 40 | ○ | 15 | 39 | 100 | 75 | D-1 |
| Example 7 | P-7 | OI-5 | IR-3 | 40 | ◎ | 20 | 50 | 110 | 90 | D-1 |
| Example 8 | P-8 | OI-11 | IR-3 | 39 | ○ | 10 | 50 | 150 | 85 | D-1 |
| Example 9 | P-9 | OI-4 | IR-2 | 39 | ○ | 15 | 50 | 160 | 100 | D-1 |
| Example 10 | P-10 | OI-10 | IR-1 | 38 | ○ | 10 | 50 | 160 | 100 | D-1 |
| Example 11 | P-11 | OI-5 | IR-3 | 42 | ◎ | 30 | 40 | 300 | 70 | D-1 |
| Example 12 | P-12 | OI-9 | IR-1 | 37 | ○ | 25 | 46 | 200 | 90 | D-1 |
| Example 13 | P-13 | OI-6 | IR-1 | 38 | ○ | 16 | 44 | 180 | 40 | D-1 |
| Example 14 | P-14 | OI-8 | IR-2 | 35 | ○ | 7.0 | 51 | 180 | 78 | D-1 |
| Example 15 | P-15 | OI-5 | IR-3 | 43 | ◎ | 31 | 38 | 305 | 65 | D-1 |
| Example 16 | P-16 | OI-5 | IR-3 | 40 | ◎ | 25 | 37 | 250 | 70 | D-1 |
| Example 17 | P-17 | OI-5 | IR-1 | 39 | ○ | 20 | 50 | 205 | 70 | D-1 |
| Example 18 | P-18 | OI-5 | IR-1 | 39 | ○ | 18 | 50 | 240 | 70 | D-1 |
| Example 19 | P-19 | OI-5 | IR-3 | 42 | ◎ | 31 | 38 | 305 | 65 | D-1 |

TABLE 3-continued

| | Binder Polymer | Polymerization Initiator | Infrared Absorbent | Printing Durability Image Areas | Printing Durability Dot Areas | Binder alone Developing velocity (nm/sec) | Binder alone Permeating velocity (nF/sec) | Photosensitive Layer Developing velocity (nm/sec) | Photosensitive Layer Permeating velocity (nF/sec) | Developer |
|---|---|---|---|---|---|---|---|---|---|---|
| Comparative Example 1 | P-32 | OI-5 | IR-3 | 20 | X | 0.1 | 70 | 45 | 116 | D-1 |
| Comparative Example 2 | P-33 | OI-7 | IR-3 | 25 | ○ | 0.1 | 40 | 85 | 280 | D-1 |
| Comparative Example 3 | P-34 | OI-5 | IR-3 | 20 | ○ | 0.1 | 60 | 40 | 120 | D-1 |
| Comparative Example 4 | P-35 | OI-5 | IR-1 | 15 | X | 0.1 | 50 | 80 | 240 | D-1 |

The structures of the infrared absorbents (IR-1) to (IR-3) and the structures of the polymerization initiators (OI-1) to (OI-11) shown in Table 3 are illustrated below.

(IR-1)

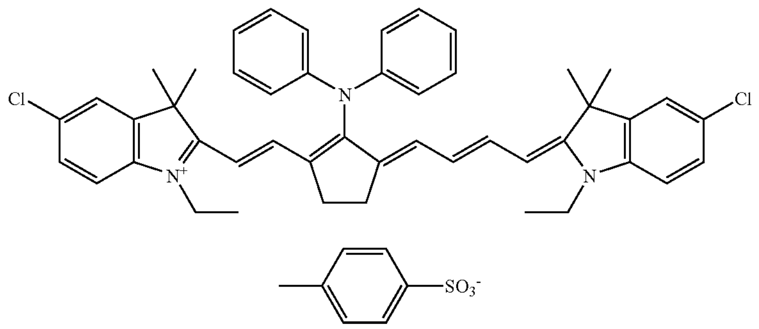

(IR-2)

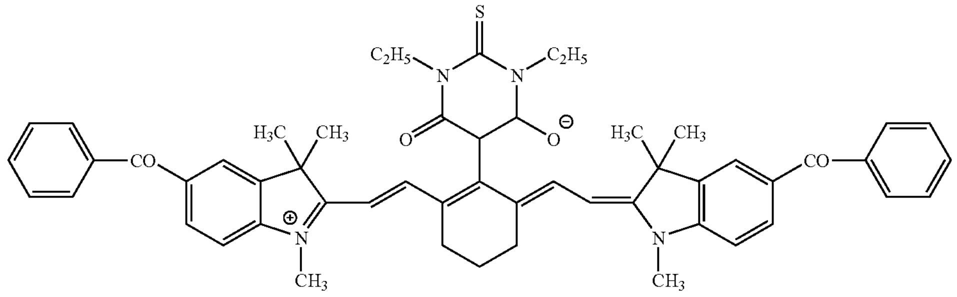

(IR-3)

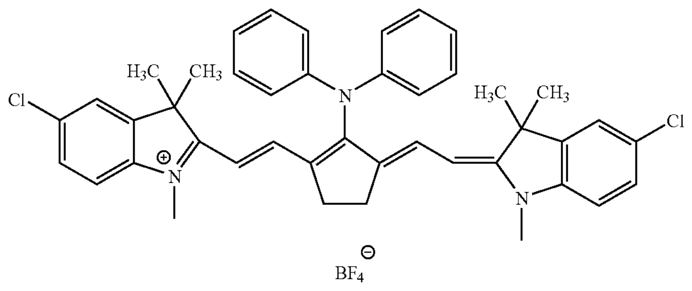

-continued
(0I-1)
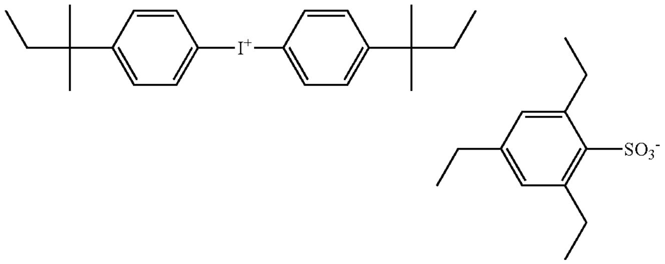
(0I-2)
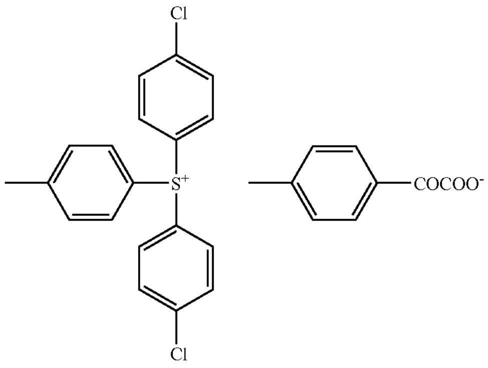
(0I-3)
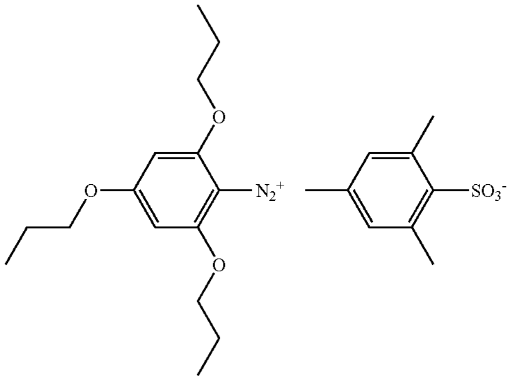
(0I-4)
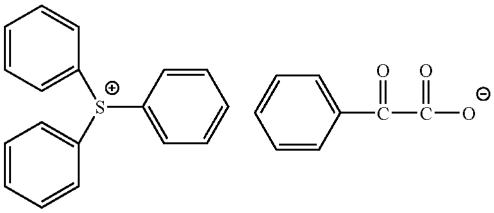
(0I-5)
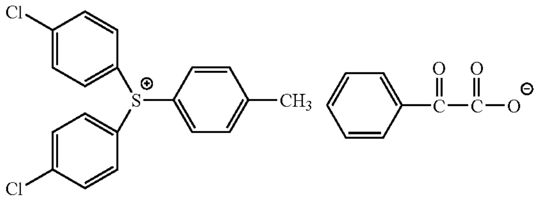
(0I-6)
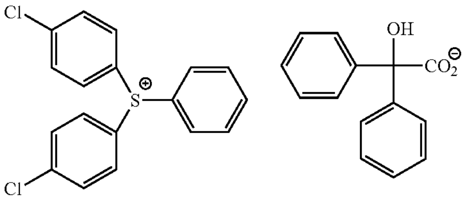
(0I-7)
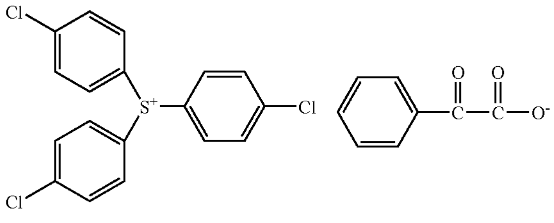
(0I-8)
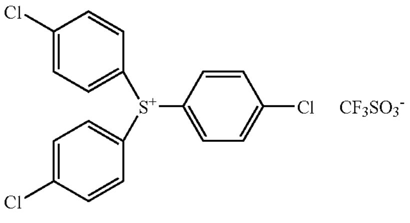

-continued (0I-9)

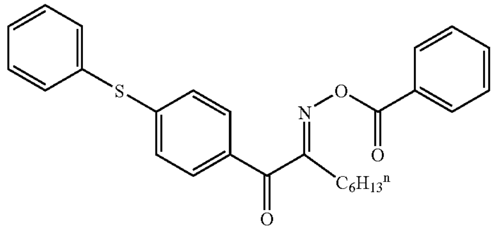

(0I-10)

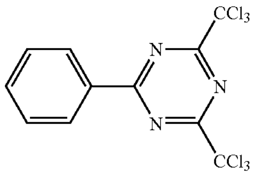

(0I-11)

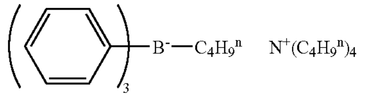

The structures of the comparative binder polymers (P-32) to (P-35) shown in Table 3 are illustrated below.

The comparative binder polymer (P-32) herein was synthesized similarly to Synthesis Example 1 and the comparative binder polymers (P-33) to (P-35) were synthesized similarly to Synthesis Example 2, by appropriately changing the monomer materials.

P-32

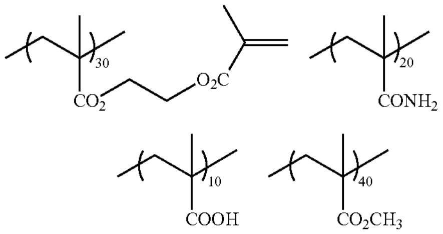

Molecular weight: 156,000

P-33

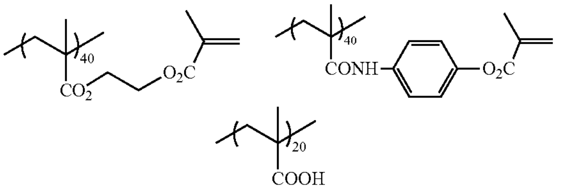

Molecular weight: 102,000

P-34

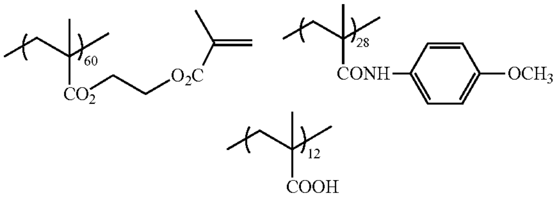

Molecular weight: 120,000

-continued

P-35

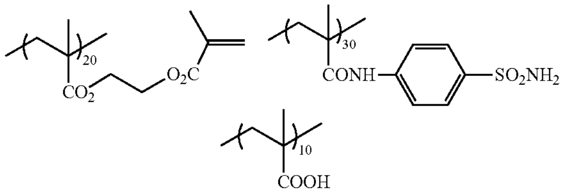

Molecular weight: 100,000

Examples 20 to 38, Comparative Examples 5 to 8

Planographic printing plate precursors were produced similarly to Examples 1 to 19 and Comparative Examples 1 to 4, except that a photosensitive layer was formed using the polymerizable compound and the binder polymer in an amount of 1.5 g to prepare the coating liquid for the photosensitive layer, and that a protective layer was provided on the photosensitive layer as described below, in Examples 1 to 19 and Comparative Examples 1 to 4. The resultant planographic printing plate precursors of Examples 20 to 38 and Comparative Examples 5 to 8 were evaluated for printing performances similarly to Examples 1 to 19 and Comparative Examples 1 to 4, except that development was carried out using a developer D-2 having the following composition.

Binder polymers, polymerization initiators and types of the infrared absorbent to constitute the photosensitive layers, and the results of evaluating printing performances are shown in Table 4 below.

Coating of Protective Layer

On the formed photosensitive layer was coated an aqueous solution of 3% by weight of polyvinyl alcohol (saponification degree: 98 mol %, polymerization degree: 550) such that the coated weight after drying became 2 $g/m^2$, followed by drying at 100° C. for 2 min.

| (Developer D-2) | |
|---|---|
| Potassium hydroxide | 6 g |
| Potassium carbonate | 2 g |
| Sodium sulfite | 1 g |
| Polyethylene glycol mononaphthel ether | 150 g |

-continued

| (Developer D-2) | |
|---|---|
| Sodium dibutylnaphthalenesulfonate | 50 g |
| Potassium hydroxyethanediphosphonate | 4 g |
| Silicon TSA-731 (manufactured by Toshiba Silicone Co., Ltd.) | 0.1 g |
| Water | 786.9 g |

Binder polymers, polymerization initiators and types of the infrared absorbent to constitute the photosensitive layers, and the results of evaluating printing performances are shown in Table 5.

Coating of Undercoat Layer

On the aluminum support used in Examples 1 to 14 and Comparative Examples 1 and 2 was coated the following

TABLE 4

| | Binder Polymer | Polymerization Initiator | Infrared Absorbent | Printing Durability: Image Areas | Printing Durability: Dot Areas | Binder alone: Developing velocity (nm/sec) | Binder alone: Permeating velocity (nF/sec) | Photosensitive Layer: Developing velocity (nm/sec) | Photosensitive Layer: Permeating velocity (nF/sec) | Developer |
|---|---|---|---|---|---|---|---|---|---|---|
| Example 20 | P-1 | OI-7 | IR-3 | 40 | ◎ | 25 | 35 | 120 | 1 | D-2 |
| Example 21 | P-2 | OI-5 | IR-3 | 45 | ◎ | 35 | 40 | 200 | 1 | D-2 |
| Example 22 | P-3 | OI-2 | IR-2 | 36 | ○ | 35 | 30 | 200 | 2 | D-2 |
| Example 23 | P-4 | OI-3 | IR-3 | 38 | ○ | 25 | 30 | 300 | 1 | D-2 |
| Example 24 | P-5 | OI-1 | IR-2 | 35 | ○ | 25 | 35 | 250 | 3 | D-2 |
| Example 25 | P-6 | OI-6 | IR-1 | 39 | ○ | 20 | 40 | 100 | 1 | D-2 |
| Example 26 | P-7 | OI-9 | IR-3 | 40 | ◎ | 25 | 35 | 110 | 1 | D-2 |
| Example 27 | P-8 | OI-3 | IR-3 | 39 | ○ | 15 | 30 | 150 | 2 | D-2 |
| Example 28 | P-9 | OI-10 | IR-2 | 40 | ○ | 20 | 30 | 160 | 2 | D-2 |
| Example 29 | P-10 | OI-4 | IR-1 | 28 | ○ | 20 | 29 | 160 | 10 | D-2 |
| Example 30 | P-11 | OI-7 | IR-3 | 47 | ◎ | 35 | 30 | 300 | 0.5 | D-2 |
| Example 31 | P-12 | OI-11 | IR-1 | 39 | ○ | 30 | 30 | 200 | 6 | D-2 |
| Example 32 | P-13 | OI-6 | IR-1 | 39 | ○ | 26 | 30 | 180 | 1 | D-2 |
| Example 33 | P-14 | OI-3 | IR-2 | 36 | ○ | 10 | 30 | 180 | 2 | D-2 |
| Example 34 | P-15 | OI-7 | IR-3 | 48 | ◎ | 37 | 30 | 305 | 0.5 | D-2 |
| Example 35 | P-16 | OI-7 | IR-3 | 47 | ◎ | 29 | 32 | 300 | 1 | D-2 |
| Example 36 | P-17 | OI-7 | IR-1 | 35 | ○ | 20 | 50 | 200 | 2 | D-2 |
| Example 37 | P-18 | OI-7 | IR-1 | 35 | ○ | 20 | 20 | 170 | 2 | D-2 |
| Example 38 | P-19 | OI-7 | IR-3 | 47 | ◎ | 37 | 30 | 305 | 0.5 | D-2 |
| Comparative Example 5 | P-32 | OI-5 | IR-3 | 21 | X | 0.1 | 70 | 40 | 100 | D-2 |
| Comparative Example 6 | P-33 | OI-6 | IR-3 | 26 | ○ | 0.1 | 50 | 90 | 150 | D-2 |
| Comparative Example 7 | P-34 | OI-7 | IR-3 | 20 | ○ | 5 | 80 | 60 | 105 | D-2 |
| Comparative Example 8 | P-35 | OI-7 | IR-1 | 19 | ○ | 7 | 80 | 65 | 110 | D-2 |

Examples 39 to 53, Comparative Examples 9 to 12

Planographic printing plate precursors were produced similarly to Examples 1 to 19 and Comparative Examples 1 to 4, except that an undercoat layer was provided on an aluminum support as described below, and that binder polymers (P-11), (P-15), (P-17), (P-20) to (P-31), comparative binder polymers (P-34) to (P-37) shown in Table 5 below were used as the binder polymer, in Examples 1 to 19 and Comparative Examples 1 to 4. Thus resulting planographic printing plate precursors of Examples 39 to 53 and Comparative Examples 9 to 12 were evaluated for printing performances similarly to Examples 1 to 19 and Comparative Examples 1 to 4, except that development was carried out using the aforementioned developer D-2.

coating liquid for the undercoat layer such that the coated weight after drying became 10 mg/$m^2$, followed by drying at 90° C. for 30 seconds.

| (Coating Liquid for Undercoat Layer) | |
|---|---|
| 2-Aminoethylsulfonic acid | 0.5 g |
| Methanol | 40 g |

TABLE 5

| | Binder Polymer | Polymerization Initiator | Infrared Absorbent | Printing Durability Image Areas | Printing Durability Dot Areas | Binder alone Developing velocity (nm/sec) | Binder alone Permeating velocity (nF/sec) | Photosensitive Layer Developing velocity (nm/sec) | Photosensitive Layer Permeating Velocity (nF/sec) | Developer |
|---|---|---|---|---|---|---|---|---|---|---|
| Example 39 | P-20 | OI-4 | IR-3 | 39 | ○ | 25 | 60 | 120 | 80 | D-2 |
| Example 40 | P-21 | OI-5 | IR-3 | 39 | ◎ | 35 | 50 | 200 | 80 | D-2 |
| Example 41 | P-22 | OI-2 | IR-2 | 35 | ○ | 35 | 55 | 200 | 100 | D-2 |
| Example 42 | P-23 | OI-3 | IR-3 | 40 | ◎ | 25 | 50 | 260 | 100 | D-2 |
| Example 43 | P-24 | OI-1 | IR-2 | 36 | ○ | 25 | 60 | 220 | 90 | D-2 |
| Example 44 | P-25 | OI-6 | IR-1 | 36 | ○ | 20 | 60 | 100 | 90 | D-2 |
| Example 45 | P-11 | OI-5 | IR-3 | 42 | ◎ | 40 | 50 | 300 | 80 | D-2 |
| Example 46 | P-26 | OI-3 | IR-3 | 39 | ○ | 15 | 60 | 150 | 85 | D-2 |
| Example 47 | P-27 | OI-11 | IR-2 | 39 | ○ | 20 | 60 | 170 | 100 | D-2 |
| Example 48 | P-28 | OI-4 | IR-1 | 38 | ○ | 20 | 60 | 200 | 100 | D-2 |
| Example 49 | P-29 | OI-7 | IR-3 | 38 | ○ | 35 | 65 | 180 | 80 | D-2 |
| Example 50 | P-30 | OI-10 | IR-1 | 38 | ○ | 30 | 60 | 210 | 90 | D-2 |
| Example 51 | P-31 | OI-3 | IR-2 | 40 | ◎ | 10 | 50 | 200 | 80 | D-2 |
| Example 52 | P-15 | OI-7 | IR-3 | 43 | ◎ | 42 | 45 | 300 | 80 | D-2 |
| Example 53 | P-17 | OI-7 | IR-1 | 40 | ◎ | 40 | 60 | 250 | 80 | D-2 |
| Comparative Example 9 | P-36 | OI-5 | IR-3 | 20 | X | 0.1 | 70 | 40 | 110 | D-2 |
| Comparative Example 10 | P-37 | OI-6 | IR-3 | 0 | X | 0.1 | 150 | 90 | 300 | D-2 |
| Comparative Example 11 | P-34 | OI-7 | IR-3 | 10 | ○ | 5 | 120 | 90 | 150 | D-2 |
| Comparative Example 12 | P-35 | OI-7 | IR-1 | 10 | ○ | 10 | 120 | 100 | 120 | D-2 |

The structures of the comparative binder polymers (P-36) and (P-37) shown in Table 5 are illustrated below.

The comparative binder polymers (P-36) and (P-37) herein were synthesized similarly to the above Synthesis Example 3 by appropriately changing the monomer materials.

P-36

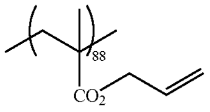

Molecular weight: 126,000

P-37

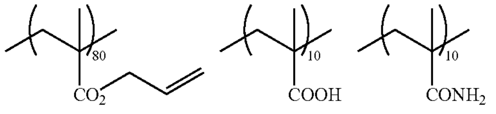

Molecular weight: 107,000

Examples 54 to 69, Comparative Examples 13 to 16

Planographic printing plate precursors were produced similarly to Examples 1 to 19 and Comparative Examples 1 to 4, except that a photosensitive layer was formed using the binder polymers (P-11), (P-15), (P-17), (P-19), (P-20) to (P-31), the comparative binder polymers (P-34) to (P-37), which are shown in Table 6 below, having the above structure in the coating liquid for the photosensitive layer, in Examples 1 to 19 and Comparative Examples 1 to 4, and that the protective layer was provided on the photosensitive layer similarly to Examples 20 to 38 and Comparative Examples 5 to 8. The resulting planographic printing plate precursors of Examples 54 to 69 and Comparative Examples 13 to 16 were evaluated for printing performances similarly to Examples 1 to 19 and Comparative Examples 1 to 4.

Binder polymers, polymerization initiators and types of the infrared absorbent to constitute the photosensitive layers, and the results of evaluating printing performances are shown in Table 6

TABLE 6

| | Binder Polymer | Polymerization Initiator | Infrared Absorbent | Printing Durability Image Areas | Printing Durability Dot Areas | Binder alone Developing velocity (nm/sec) | Binder alone Permeating velocity (nF/sec) | Photosensitive Layer Developing velocity (nm/sec) | Photosensitive Layer Permeating velocity (nF/sec) | Developer |
|---|---|---|---|---|---|---|---|---|---|---|
| Example 54 | P-20 | OI-5 | IR-2 | 39 | ○ | 21 | 50 | 120 | 6 | D-1 |
| Example 55 | P-21 | OI-7 | IR-3 | 45 | ◎ | 25 | 40 | 200 | 1 | D-1 |
| Example 56 | P-22 | OI-2 | IR-2 | 35 | ○ | 30 | 45 | 200 | 10 | D-1 |
| Example 57 | P-23 | OI-7 | IR-3 | 46 | ◎ | 21 | 45 | 250 | 1 | D-1 |
| Example 58 | P-24 | OI-3 | IR-3 | 45 | ◎ | 22 | 40 | 230 | 1 | D-1 |
| Example 59 | P-25 | OI-6 | IR-1 | 40 | ○ | 15 | 39 | 100 | 10 | D-1 |
| Example 60 | P-11 | OI-7 | IR-3 | 50 | ○ | 35 | 35 | 250 | 0.5 | D-1 |

TABLE 6-continued

| | | | | Printing Durability | | Binder alone | | Photosensitive Layer | | |
|---|---|---|---|---|---|---|---|---|---|---|
| | Binder Polymer | Polymerization Initiator | Infrared Absorbent | Image Areas | Dot Areas | Developing velocity (nm/sec) | Permeating velocity (nF/sec) | Developing velocity (nm/sec) | Permeating velocity (nF/sec) | Developer |
| Example 61 | P-26 | OI-11 | IR-3 | 39 | ○ | 10 | 50 | 150 | 10 | D-1 |
| Example 62 | P-27 | OI-4 | IR-2 | 39 | ○ | 15 | 50 | 160 | 12 | D-1 |
| Example 63 | P-28 | OI-10 | IR-1 | 38 | ○ | 10 | 50 | 160 | 15 | D-1 |
| Example 64 | P-29 | OI-5 | IR-3 | 40 | ○ | 30 | 40 | 200 | 20 | D-1 |
| Example 65 | P-30 | OI-9 | IR-1 | 43 | ◎ | 25 | 40 | 210 | 2 | D-1 |
| Example 66 | P-31 | OI-7 | IR-3 | 42 | ◎ | 20 | 40 | 200 | 2 | D-1 |
| Example 67 | P-15 | OI-7 | IR-3 | 53 | ◎ | 35 | 35 | 280 | 0.5 | D-1 |
| Example 68 | P-17 | OI-5 | IR-1 | 50 | ○ | 20 | 50 | 150 | 3 | D-1 |
| Example 69 | P-19 | OI-7 | IR-3 | 51 | ◎ | 35 | 35 | 280 | 0.5 | D-1 |
| Comparative Example 13 | P-36 | OI-8 | IR-3 | 20 | X | 0.1 | 76 | 50 | 110 | D-1 |
| Comparative Example 14 | P-37 | OI-7 | IR-3 | 0 | X | 0.1 | 150 | 80 | 200 | D-1 |
| Comparative Example 15 | P-34 | OI-7 | IR-3 | 20 | ○ | 5 | 90 | 95 | 105 | D-1 |
| Comparative Example 16 | P-35 | OI-5 | IR-1 | 25 | ○ | 5 | 110 | 95 | 105 | D-1 |

As seen from the above Tables 3 to 6, the planographic printing plate precursors of Examples 1 to 69 having the photosensitive layer which comprises the polymerizable composition containing a binder polymer having the repeating unit represented by formula (I) (the polymerizable composition according to the invention) have the developing velocity at unexposed areas of the photosensitive layer of 80 nm/sec or greater, and have the permeating velocity of an alkaline developer of 100 nF/sec or less. Thus, it is demonstrated that the planographic printing plates having considerably excellent printing durability can be obtained with or without the protective layer or the undercoat layer disposed. Furthermore, it is readily presumed that the planographic printing plate precursors of Examples 1 to 69 exhibit excellent image forming ability since these prescursors are provided with the photosensitive layer having such a specified developing velocity at unexposed areas with respect to the alkaline developer and a specified permeating velocity of the alkaline developer at exposed areas.

On the other hand, since the planographic printing plate precursors of Comparative Examples 1 to 16 are not provided with the photosensitive layer comprising a binder polymer having the repeating unit represented by formula (I), and the photosensitive layer thereof does not exhibit the developing velocity at unexposed areas with respect to the alkaline developer of 80 nm/sec or greater and the permeating velocity of an alkaline developer at exposed areas of 100 nF/sec or less, the obtained planographic printing plates of Comparative Examples have poorer printing durability than the planographic printing plates of Examples 1 to 69. In particular, the planographic printing plates of Comparative Examples 1, 4, 5, 9, 10, 13 and 14 exhibited plate wearing of dots.

As detailed above, the present invention provides a planographic printing plate precursor that exhibits considerably high printing durability by disposing a photosensitive layer which includes the polymerizable composition containing a specific binder polymer having the repeating unit represented by formula (I). The invention also provides the planographic printing plate precursor having advantages of excellent printing durability and image forming ability. The planographic printing plate precursor according to the invention is suitable for scanning exposure by a laser beam, writable at high speed, and has high productivity.

What is claimed is:

1. A planoaraphic printing plate precursor comprising a support and a photosensitive layer disposed on the support, wherein the photosensitive layer comprises a polymerizable composition comprising a binder polymer having a repeating unit represented by the following formula (I); an infrared absorbent; a polymerization initiator; and a polymerizable compound, Formula (I)

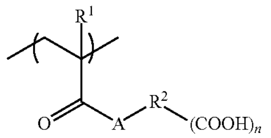

wherein $R^1$ represents a hydrogen atom or a methyl group; $R^2$ represents a chain-structure linking group which includes one or more atoms selected from the group consisting of a carbon atom, a hydrogen atom, an oxygen atom, a nitrogen atom, a sulfur atom and a halogen atom, and has a number of atoms of 2 to 30 except for substituents, wherein the chain-structure does not include a cyclic structure, and the chain-structure linking group has 3 to 30 carbon atoms and includes an amide bond or an ester bond; A represents an oxygen atom or —$NR^3$— in which $R^3$ represents a hydrogen atom or a monovalent hydrocarbon group having 1 to 10 carbon atoms; and n represents an integer of 1 to 5; and wherein the binder polymer is a copolymer comprising a unit including a radical polymerizable group or a unit including an amide group.

* * * * *